(12) United States Patent
Etou et al.

(10) Patent No.: US 11,750,951 B2
(45) Date of Patent: Sep. 5, 2023

(54) SOLID-STATE IMAGING ELEMENT, IMAGING APPARATUS, AND CONTROL METHOD OF SOLID-STATE IMAGING ELEMENT WITH IMPROVED READING SPEED OF PIXEL SIGNALS

(71) Applicant: Sony Semiconductor Solutions Corporation, Kanagawa (JP)

(72) Inventors: Shinichirou Etou, Kanagawa (JP); Yosuke Ueno, Kanagawa (JP); Yasufumi Hino, Kanagawa (JP); Kazutoshi Tomita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/735,347

(22) Filed: May 3, 2022

(65) Prior Publication Data
US 2022/0264051 A1 Aug. 18, 2022

Related U.S. Application Data

(63) Continuation of application No. 16/761,224, filed as application No. PCT/JP2018/035166 on Sep. 21, 2018, now Pat. No. 11,368,644.

(30) Foreign Application Priority Data

Nov. 10, 2017 (JP) .................................. 2017-216980
Feb. 16, 2018 (JP) .................................. 2018-025772

(51) Int. Cl.
*H04N 25/772* (2023.01)
*H01L 27/146* (2006.01)
(Continued)

(52) U.S. Cl.
CPC ..... *H04N 25/772* (2023.01); *H01L 27/14612* (2013.01); *H01L 27/14636* (2013.01); *H01L 27/14643* (2013.01); *H04N 25/745* (2023.01)

(58) Field of Classification Search
CPC ............ H04N 5/37455; H04N 5/3765; H04N 25/772; H04N 25/745; H01L 27/14612;
(Continued)

(56) References Cited

U.S. PATENT DOCUMENTS 6,788,237 B1  9/2004  Bidermann et al.
8,969,774 B2  3/2015  Johansson
(Continued)

FOREIGN PATENT DOCUMENTS

JP   2011-234243 A    11/2011
KR   20170016828 A     2/2017
(Continued)

OTHER PUBLICATIONS

International Search Report and Written Opinion dated Jan. 3, 2019 in connection with International Application No. PCT/JP2018/035166.

(Continued)

*Primary Examiner* — Albert H Cutler
(74) *Attorney, Agent, or Firm* — Wolf, Greenfield & Sacks, P.C.

(57) ABSTRACT

It is intended to improve reading speed of pixel signals in a solid-state imaging element provided with an ADC.
A plurality of pixels are arrayed in a pixel block. A drive circuit drives the pixel block to output a plurality of pixel signals at the same time. A comparator successively selects the plurality of pixel signals and compares the selected pixel signals and a predetermined reference signal. A control section generates a control signal for updating the predetermined reference signal on the basis of comparison results of
(Continued)

the comparator. A reference signal update section updates the predetermined reference signal according to the control signal.

17 Claims, 45 Drawing Sheets

(51) Int. Cl.
  *H04N 25/71* (2023.01)
  *H03M 1/46* (2006.01)
  *H03M 1/12* (2006.01)
(58) Field of Classification Search
  CPC ........ H01L 27/14636; H01L 27/14643; H03M 1/46; H03M 1/1225
  See application file for complete search history.

(56) References Cited

U.S. PATENT DOCUMENTS

| | | | |
|---|---|---|---|
| 10,992,889 | B2 | 4/2021 | Kawazu et al. |
| 11,368,644 | B2 * | 6/2022 | Etou ................. H01L 27/14643 |
| 2008/0117321 | A1 * | 5/2008 | Muramatsu ............ H04N 3/155 |
| | | | 348/E3.018 |
| 2009/0303362 | A1 * | 12/2009 | Ebihara ................. H04N 5/353 |
| | | | 348/E5.091 |
| 2013/0070135 | A1 | 3/2013 | Bahukhandi et al. |
| 2014/0246562 | A1 | 9/2014 | Van Blerkom |
| 2015/0229859 | A1 | 8/2015 | Guidash et al. |
| 2015/0303938 | A1 | 10/2015 | Kim et al. |
| 2016/0094236 | A1 | 3/2016 | Shionoiri et al. |
| 2016/0119522 | A1 * | 4/2016 | Choi .................... H04N 5/2256 |
| | | | 348/302 |
| 2016/0204789 | A1 * | 7/2016 | Vyas ..................... H03M 1/002 |
| | | | 341/161 |
| 2017/0201702 | A1 | 7/2017 | Niwa et al. |
| 2017/0214869 | A1 | 7/2017 | Ladd et al. |
| 2017/0353677 | A1 * | 12/2017 | Kim ........................ H03M 1/56 |
| 2018/0270432 | A1 | 9/2018 | Endsley et al. |
| 2019/0373190 | A1 | 12/2019 | Kawazu et al. |
| 2020/0053308 | A1 | 2/2020 | Niwa et al. |
| 2020/0366863 | A1 | 11/2020 | Etou et al. |
| 2021/0368125 | A1 | 11/2021 | Niwa et al. |

FOREIGN PATENT DOCUMENTS

| | | | |
|---|---|---|---|
| WO | WO 2013/016448 A1 | 1/2013 | |
| WO | WO-2015186302 A1 * | 12/2015 | ....... H01L 27/14612 |

OTHER PUBLICATIONS

International Preliminary Report on Patentability dated May 22, 2020 in connection with International Application No. PCT/JP2018/035166.

* cited by examiner

FIG.17 a b c a b c a b c

SOLID-STATE IMAGING ELEMENT, IMAGING APPARATUS, AND CONTROL METHOD OF SOLID-STATE IMAGING ELEMENT WITH IMPROVED READING SPEED OF PIXEL SIGNALS

CROSS-REFERENCE TO RELATED APPLICATIONS

This application is a continuation of and claims the benefit under 35 U.S.C. § 120 of U.S. patent application Ser. No. 16/761,224, titled "SOLID-STATE IMAGING ELEMENT, IMAGING APPARATUS, AND CONTROL METHOD OF SOLID-STATE IMAGING ELEMENT WITH IMPROVED READING SPEED OF PIXEL SIGNALS," filed on May 1, 2020, now U.S. Pat. No. 11,368,644, which claims the benefit under 35 U.S.C. § 371 as a U.S. National Stage Entry of International Application No. PCT/JP2018/035166, filed in the Japanese Patent Office as a Receiving Office on Sep. 21, 2018, which claims priority to Japanese Patent Application Number JP2018-025772, filed in the Japanese Patent Office on Feb. 16, 2018; and Japanese Patent Application Number JP2017-216980, filed in the Japanese Patent Office on Nov. 10, 2017, each of which is hereby incorporated by reference in its entirety.

TECHNICAL FIELD

The present technique relates to a solid-state imaging element, an imaging apparatus, and a control method of the solid-state imaging element. Particularly, the present technique relates to a solid-state imaging element, an imaging apparatus, and a control method of the solid-state imaging element in which a plurality of pixels are arrayed in a two-dimensional grid pattern.

BACKGROUND ART

Conventionally, an ADC (Analog to Digital Converter) is used to convert an analog pixel signal into a digital signal in an imaging apparatus and the like. For example, a solid-state imaging element is proposed, the solid-state imaging element including: a pixel area in which a plurality of pixels are arrayed in a two-dimensional grid pattern; and a column signal processing section including single-slope ADCs arranged in columns of the pixel area (for example, see PTL 1).

CITATION LIST

Patent Literature

[PTL 1]
Japanese Patent Laid-Open No. 2011-234243

SUMMARY

Technical Problem

In the conventional technique, AD conversion of the ADCs arranged in columns allows to read pixel signals row by row. However, it is difficult to improve the reading speed in the conventional technique. The solid-state imaging element sequentially drives the rows one by one to output the pixel signals and performs the AD conversion after settling time for settlement of the signals. Therefore, the sum of the settling time and the time required for the AD conversion is the reading time of one row. Since the settling time is constant, the quantifying bit number in the AD conversion can be reduced to shorten the reading time to increase the reading speed. However, this is not desirable because the image quality of the image data is reduced. In addition, if two ADCs are provided for each column, the ADCs can drive two rows at the same time and perform AD conversion to double the reading speed of all rows. However, this is not desirable because the number of ADCs increases. In this way, it is difficult to increase the reading speed while suppressing the reduction in the image quality of the image data and suppressing the increase in the circuit scale.

The present technique has been made in view of the circumstances, and an object of the present technique is to improve reading speed of pixel signals in a solid-state imaging element provided with an ADC.

Solution to Problem

The present technique has been made to solve the problem described above, and a first aspect of the present technique provides a solid-state imaging apparatus and a control method of the solid-state imaging apparatus, the solid-state imaging apparatus including: a pixel area comprising:
a plurality of pixels arranged in rows and columns; and a plurality of column lines, each of the plurality of column lines being coupled to a respective column of pixels of the plurality of pixels; and circuitry comprising a plurality of successive approximation analog-to-digital converters (SARADC), at least one of the plurality of SARADCs being coupled to at least two column lines of the plurality of column lines.

Furthermore, in the first aspect, each of the plurality of SARADCs may be coupled to at least two respective column lines of the plurality of column lines.

Furthermore, in the first aspect, each of the plurality of pixels may comprise at least one photodiode.

Furthermore, in the first aspect, the circuitry may be configured to drive at least two rows of pixels of the plurality of pixels simultaneously.

Furthermore, in the first aspect, the circuitry may be configured to drive all the rows of pixels of the plurality of pixels simultaneously.

Furthermore, in the first aspect, the at least one of the plurality of SARADCs may comprise a comparator configured to compare a reference signal with a pixel signal provided to the comparator through one of the at least two column lines.

Furthermore, in the first aspect, the circuitry may configured to vary the reference signal over time.

Furthermore, in the first aspect, the circuitry may be configured to vary, during a predefined time slot, the reference signal until a least significant bit (LSB) is generated based on the pixel signal.

Furthermore, in the first aspect, the comparator may comprise a selection section configured to select the pixel signal between: a first pixel signal provided to the comparator through a first column line of the at least two column lines, and a second pixel signal provided to the comparator through a second column line of the at least two column lines.

Furthermore, in the first aspect, the comparator comprises: a first transistor configured to receive a first pixel signal; a second transistor configured to receive a second pixel signal; and a third transistor configured to receive the reference signal.

Furthermore, in the first aspect, the comparator further may comprise: a first switch coupled to a source and a drain of the first transistor; and a second switch coupled to a source and a drain of the second transistor.

Furthermore, in the first aspect, the comparator further may comprise: a third switch coupled to the first switch; and a fourth switch coupled to the second switch.

Furthermore, in the first aspect, each of the plurality of pixels comprises at least one back-illuminated photodiode.

Furthermore, in the first aspect, the first switch may be configured to receive a first control signal and the third switch may be configured to receive an inversion signal of the first control signal; and the second switch may be configured to receive a second control signal and the fourth switch may be configured to receive an inversion signal of the second control signal.

Furthermore, in the first aspect, the comparator may comprise a first output signal line and a second output signal line.

Furthermore, in the first aspect, the first output signal line may be coupled to a first node between the first transistor and a power source; and the second signal line may be coupled to a second node between the third transistor and the power source.

Furthermore, in the first aspect, the first output signal line may be coupled to a first node between the first transistor and a ground; and the second signal line may be coupled to a second node between the third transistor and the ground.

Furthermore, in the first aspect, the plurality of SARADCs may comprise a first SARADC and a second SARADC, wherein the circuitry may be configured to provide a first reference signal to the first SARADC and a second reference signal to the second SARADC, the second reference signal being different from the first reference signal.

A second aspect of the present technique provides a solid-state imaging apparatus comprising a pixel area comprising a plurality of pixel lines comprising a first pixel line coupled to a first plurality of pixels and a second pixel line coupled to a second plurality of pixels. The solid-state imaging apparatus may further comprises circuitry comprising a successive approximation analog-to-digital converter (SARADC) coupled to the first pixel line and to the second pixel line.

Furthermore, in the second aspect, the first pixel line may be a first column line and the first plurality of pixels may be a first column of pixels, and the second pixel line may be a second column line and the second plurality of pixels may be a second column of pixels.

Furthermore, in the second aspect, each of the first and second plurality of pixels may comprise at least one photodiode.

Furthermore, in the second aspect, the first and second plurality of pixels may be arranged in rows of pixels, and wherein the circuitry may be configured to drive at least two of the rows of pixels simultaneously.

Furthermore, in the second aspect, the circuitry may be configured to drive all the rows of pixels simultaneously.

Furthermore, in the second aspect, the SARADC may comprise a comparator configured to compare a reference signal with a pixel signal provided to the comparator through one between the first pixel line and the second pixel line.

Furthermore, in the second aspect, the circuitry may be configured to vary the reference signal over time.

Furthermore, in the second aspect, the circuitry may be configured to vary, during a predefined time slot, the reference signal until a least significant bit (LSB) is generated based on the pixel signal.

Furthermore, in the second aspect, the comparator may comprise a selection section configured to select the pixel signal between: a first pixel signal provided to the comparator through the first pixel line, and a second pixel signal provided to the comparator through the second pixel line.

Furthermore, in the second aspect, the comparator may comprise: a first transistor configured to receive a first pixel signal; a second transistor configured to receive a second pixel signal; and a third transistor configured to receive the reference signal.

Furthermore, in the second aspect, the comparator further comprises: a first switch coupled to a source and a drain of the first transistor; and a second switch coupled to a source and a drain of the second transistor.

Furthermore, in the second aspect, the comparator may further comprise: a third switch coupled to the first switch; and a fourth switch coupled to the second switch.

Furthermore, in the second aspect, the first switch may be configured to receive a first control signal and the third switch may be configured to receive an inversion signal of the first control signal; and the second switch may be configured to receive a second control signal and the fourth switch may be configured to receive an inversion signal of the second control signal.

Furthermore, in the second aspect, the comparator may include a first output signal line and a second output signal line.

Furthermore, in the second aspect, the first output signal line may be coupled to a first node between the first transistor and a power source; and the second signal line may be coupled to a second node between the third transistor and the power source.

Furthermore, in the second aspect, the first output signal line may be coupled to a first node between the first transistor and a ground level; and the second signal line may be coupled to a second node between the third transistor and the ground level.

Furthermore, in the second aspect, the SARADC may be a first SARADC, and the plurality of pixel lines may further comprise a third pixel line coupled to a third plurality of pixels and a fourth pixel line coupled to a fourth plurality of pixels. The circuitry may further comprise a second SARADC coupled to the third pixel line and to the fourth pixel line, and the circuitry may be configured to provide a first reference signal to the first SARADC and a second reference signal to the second SARADC, the second reference signal being different from the first reference signal.

Furthermore, in the second aspect, each of the plurality of pixels comprises at least one back-illuminated photodiode.

Furthermore, in the second aspect, each of the plurality of pixels comprises at least one front-illuminated photodiode.

Furthermore, a third aspect of the present technique provides an electronic device including: a pixel block in which a plurality of pixels are arrayed; a drive circuit that drives the pixel block to output a plurality of pixel signals at the same time; a comparator that successively selects the plurality of pixel signals to compare the selected pixel signals and a predetermined reference signal; a control section that generates a control signal for updating the predetermined reference signal on the basis of comparison results of the comparator; a reference signal update section that updates the predetermined reference signal according to the control signal; and an image processing section that processes pixel data including the comparison results. This produces an effect that the plurality of pixel signals are successively selected, the AD conversion of the plurality of pixel signals is performed, and the image processing is applied to the plurality of pixel signals.

Advantageous Effect of Invention

The present technique can attain an excellent advantageous effect of improving the reading speed of pixel signals in a solid-state imaging element provided with an ADC. Note that the advantageous effect described here may not be limited, and the advantageous effect may be any of the advantageous effects described in the present disclosure.

BRIEF DESCRIPTION OF DRAWINGS

FIG. 17 is a timing chart illustrating an example of operation of the solid-state imaging element according to the third embodiment of the present technique.

FIG. 2 is a block diagram illustrating a configuration example of an indirect time of flight sensor according to the first embodiment of the present technique.

DESCRIPTION OF EMBODIMENTS

Hereinafter, modes for carrying out the present technique (hereinafter, referred to as embodiments) will be described. The embodiments will be described in the following order.
1. First Embodiment (Example in which SARADC successively selects two pixel signals)
2. Second Embodiment (Example in which SARADC successively selects pixel signals from two shared blocks)
3. Third Embodiment (Example in which SARADC provided with capacitors successively selects pixel signals)
4. Fourth Embodiment (Example in which upper and lower SARADCs successively select two pixel signals)
5. Fifth Embodiment (Example in which SARADC successively selects four pixel signals)
6. Sixth Embodiment (Example in which SARADC successively selects two pixel signals from multiplexer)
7. Seventh Embodiment (Example in which combination of capacitors is changed, and SARADC successively selects two pixel signals)
8. Eighth Embodiment (Example in which SARADC successively selects two pixel signals and supplies intermediate potential)
9. Ninth Embodiment (Example in which SARADC successively selects two pixel signals and supplies intermediate potential adjusted by variable resistor)
10. Tenth Embodiment (Example in which SARADC successively selects two pixel signals and resets source-side potential)
11. Eleventh Embodiment (Example in which SARADC successively selects two pixel signals and samples and holds intermediate potential)
12. Twelfth Embodiment (Example in which SARADC successively selects two pixel signals, and replica circuit generates drain voltage and source voltage)
13. Thirteenth Embodiment (Example in which SARADC successively selects two pixel signals and supplies intermediate potential also to reference side)
14. Application to Movable Body 1. First Embodiment

Figure 1:
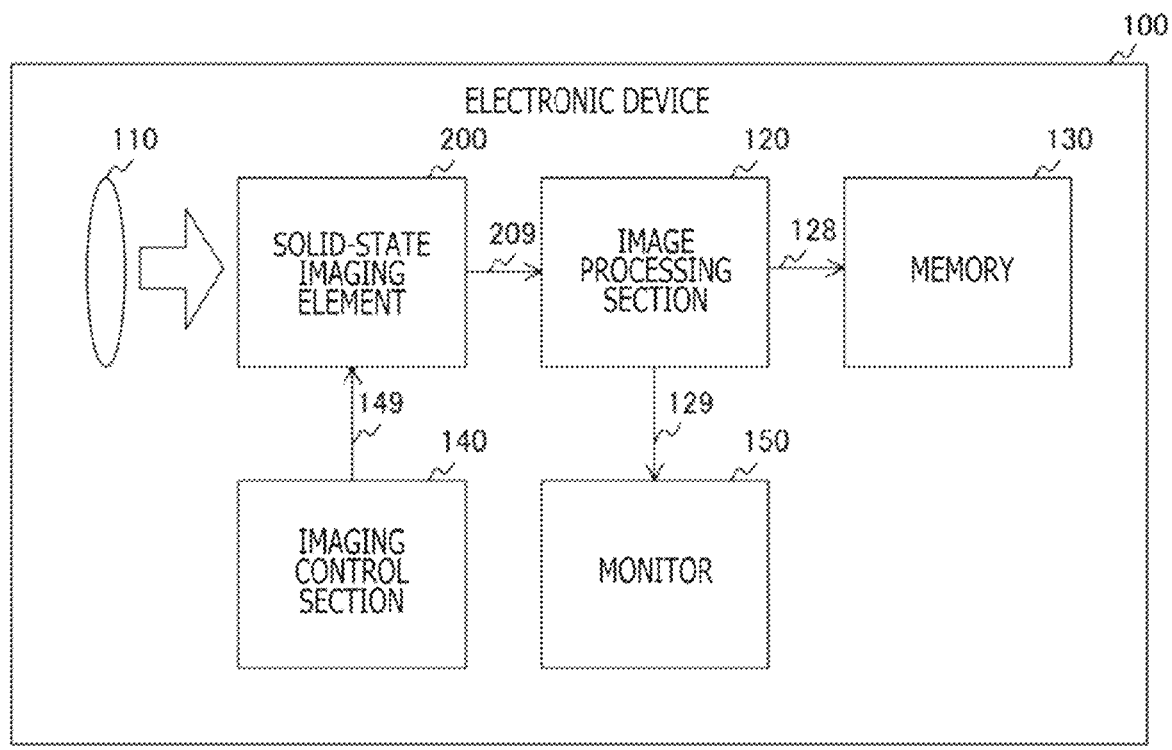
FIG. 1 is a block diagram illustrating a configuration example of an electronic device according to a first embodiment of the present technique.

[Configuration Example of Electronic Device]
FIG. 1 is a block diagram illustrating a configuration example of an electronic device 100 according to a first embodiment of the present technique. The electronic device 100 is a device that captures image data, and the electronic device 100 includes an optical system 110, a solid-state imaging element 200, an image processing section 120, a memory 130, an imaging control section 140, and a monitor 150. Examples of the electronic device 100 include a smartphone, an IoT (Internet of Things) camera, and an on-board camera.

The optical system 110 is configured to condense incident light from a subject and guide the light to the solid-state imaging element 200. The optical system 110 includes one or more optical lenses.

The solid-state imaging element 200 is configured to capture image data according to control of the imaging control section 140. The solid-state imaging element 200 supplies the captured image data to the image processing section 120 through a signal line 209.

The imaging control section 140 is configured to control the solid-state imaging element 200. The imaging control section 140 supplies a vertical synchronization signal indicating the imaging time, a signal for controlling the exposure time, and the like to the solid-state imaging element 200 through a signal line 149. In addition, the imaging control section 140 starts to supply the vertical synchronization signal when, for example, there is an operation for starting imaging (such as pressing a shutter button).

The image processing section 120 is configured to apply predetermined image processing, such as a demosaicing process and a white balance process, to the image data. The image processing section 120 supplies the processed image data to the memory 130 and the monitor 150 through signal lines 128 and 129. The memory 130 is configured to store image data. The monitor 150 is configured to display image data.

Figure 2:
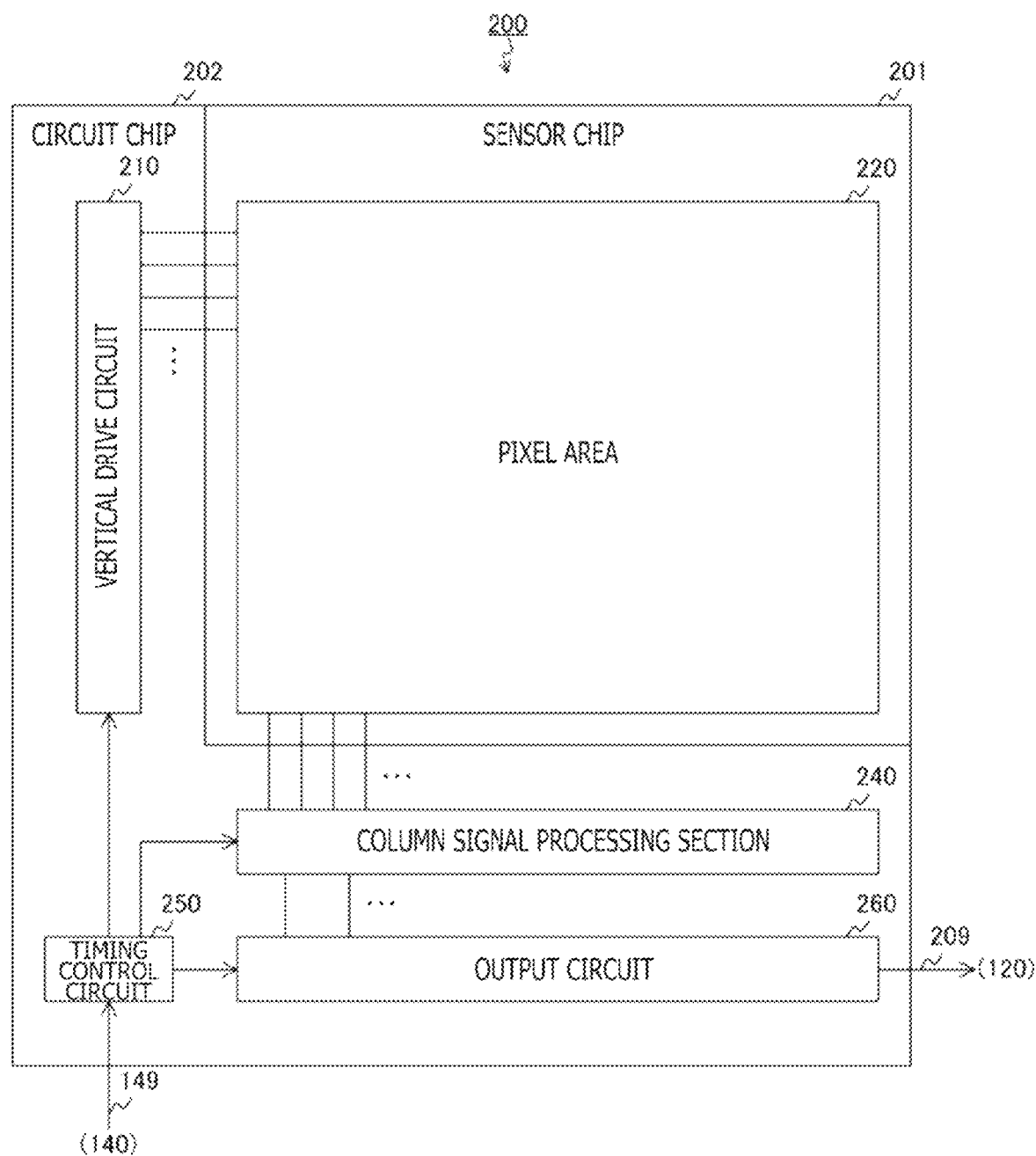
FIG. 2 is a block diagram illustrating a configuration example of a solid-state imaging element according to the first embodiment of the present technique.

[Configuration Example of Solid-State Imaging Element]
FIG. 2 is a block diagram illustrating a configuration example of the solid-state imaging element 200 according to the first embodiment of the present technique. The solid-state imaging element 200 includes a sensor chip 201 and a circuit chip 202 laminated on the sensor chip 201.

A pixel area 220 including a plurality of pixels arrayed in a two-dimensional grid pattern is arranged on the sensor chip 201. Pixel area 220 may be arranged in rows and columns, and may include a plurality of column lines. Each of the plurality of column lines may be coupled to a respective column of pixels. In addition, a vertical drive circuit 210, a column signal processing section 240, a timing control circuit 250, and an output circuit 260 are arranged on the circuit chip 202.

The vertical drive circuit 210 is configured to drive pixels and output pixel signals to the column signal processing section 240. The column signal processing section 240 is configured to apply an AD (Analog to Digital) conversion process to the pixel signals in columns and supply the pixel signals to the output circuit 260. The output circuit 260 is configured to apply a CDS (Correlated Double Sampling) process or the like to the data from the column signal processing section 240 and output the data to the image processing section 120. Other than the CDS process, the output circuit 260 also executes a contrast AF (Auto Focus) process of detecting a focal point on the basis of the contrast of the image data as necessary.

The timing control circuit 250 is configured to control the respective operation timings of the vertical drive circuit 210, the column signal processing section 240, and the output circuit 260 in synchronization with the vertical synchronization signal.

Figure 3:
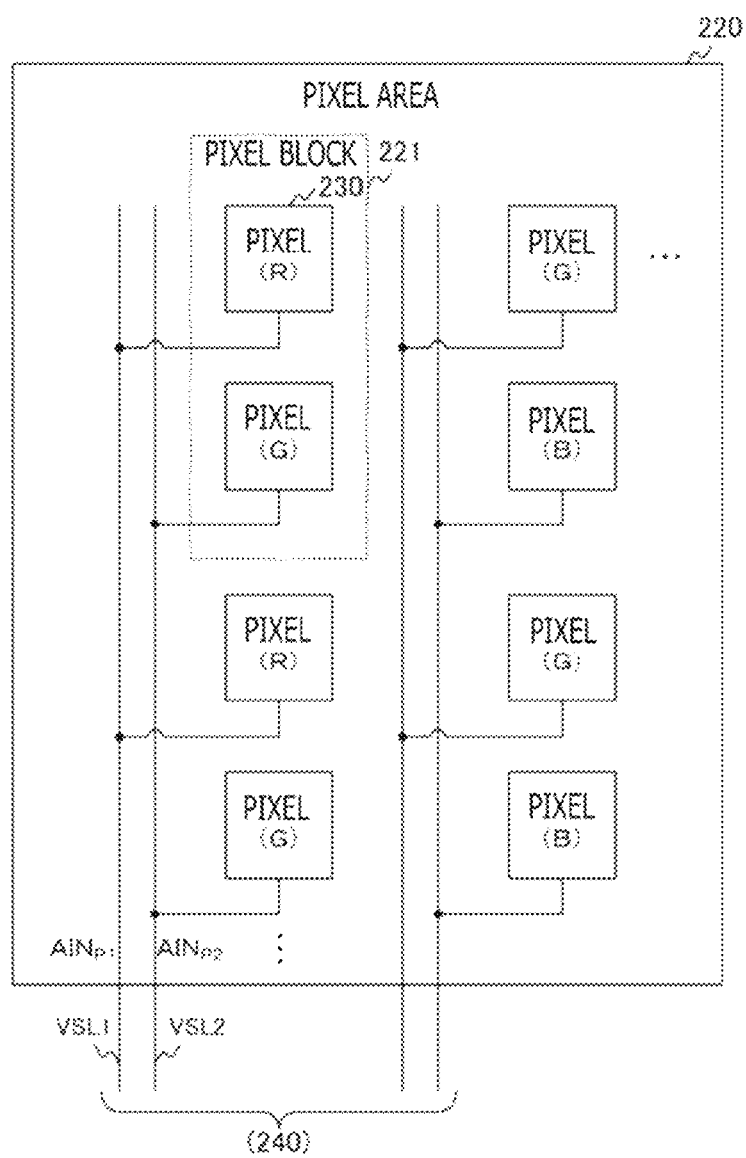
FIG. 3 is an example of a plan view of a pixel area according to the first embodiment of the present technique.

FIG. 3 is an example of a plan view of the pixel area 220 according to the first embodiment of the present technique. The pixel area 220 includes a plurality of pixels 230 arrayed in a two-dimensional grid pattern on the basis of, for example, a Bayer array. The Bayer array is provided with pixels 230 of R (Red) that generate red pixel signals, pixels 230 of G (Green) that generate green pixel signals, and pixels 230 of B (Blue) that generate blue pixel signals. Note that the pixels 230 may be arrayed on the basis of a system other than the Bayer array.

In addition, vertical signal lines VSL1 and VSL2 (also referred to as column lines) are wired in a vertical direction in each column of the pixels 230. Assuming that the total number of columns in the pixel area 220 is M (M is an integer), a total of 2×M vertical signal lines are wired. One of two pixels 230 adjacent in the vertical direction is connected to the vertical signal line VSL1, and the other is connected to the vertical signal line VSL2. For example, the pixel 230 of a (2k)th row (k is an integer) is connected to the vertical signal line VSL1, and the pixel 230 of a (2k+1)th row is connected to the vertical signal line VSL2. The set of two pixels of the (2k)th row and the (2k+1)th row will be referred to as a pixel block 221. In addition, the vertical signal line VSL1 transmits a pixel signal $AIN_{P1}$, and the vertical signal line VSL2 transmits a pixel signal $AIN_{P2}$.

The vertical drive circuit 210 sequentially selects and drives a row of the pixel blocks 221 to output the pixel signals $AIN_{P1}$ and $AIN_{P2}$ at the same time from each pixel block 221 in the row. In other words, the vertical drive circuit 210 drives the (2k)th row and the (2k+1)th row of the pixels 230 at the same time. Note that the vertical drive circuit 210 is an example of the drive circuit described in the claims.

[Configuration Example of Pixel Circuit]

Figure 4:
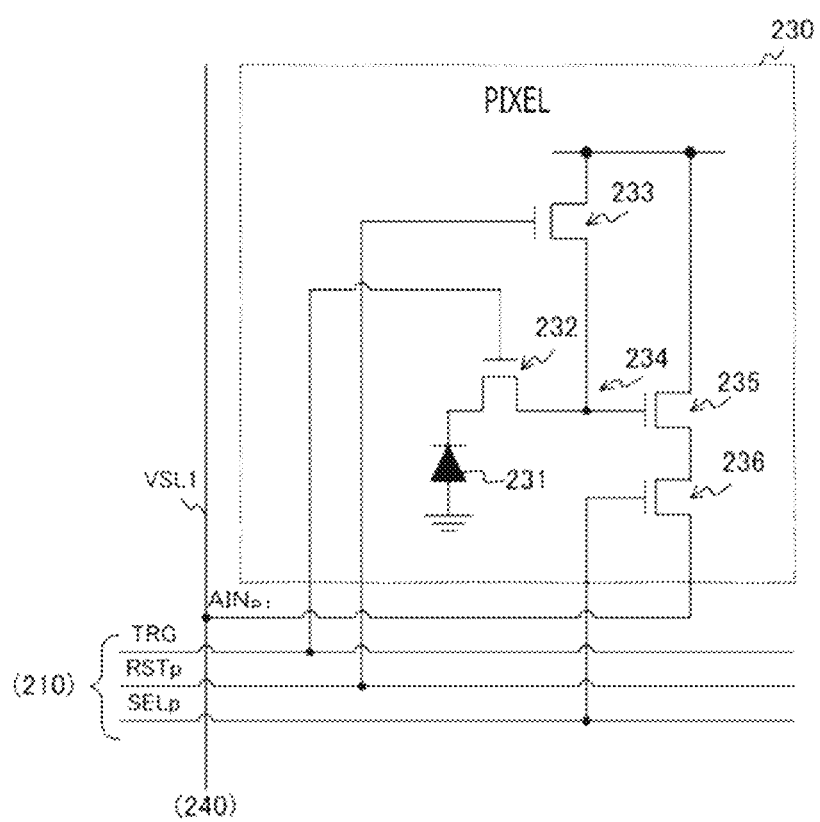
FIG. 4 is a circuit diagram illustrating a configuration example of a pixel according to the first embodiment of the present technique.

FIG. 4 is a circuit diagram illustrating a configuration example of the pixel 230 according to the first embodiment of the present technique. The pixel 230 includes a photodiode 231, a transfer transistor 232, a reset transistor 233, a floating diffusion layer 234, an amplifier transistor 235, and a selection transistor 236.

The photodiode 231 is configured to photoelectrically convert received light to generate charge. The photodiode 231 is arranged on a back side of a front side that is a surface of a semiconductor substrate provided with circuits. Such a solid-state imaging element is called a back-illuminated solid-state imaging element. Note that instead of the back-illuminated type, a front-illuminated configuration including the photodiode 231 arranged on the front side may also be used.

The transfer transistor 232 is configured to transfer charge from the photodiode 231 to the floating diffusion layer 234 according to a transfer signal TRG from the vertical drive circuit 210. The floating diffusion layer 234 accumulates the transferred charge to generate a voltage according to the amount of accumulated charge.

The reset transistor 233 is configured to pull out the charge from the floating diffusion layer 234 according to a reset signal RSTp from the vertical drive circuit 210 to initialize the amount of charge. The amplifier transistor 235 is configured to amplify the voltage of the floating diffusion layer 234. The selection transistor 236 is configured to output a pixel signal that is a signal of the amplified voltage to the column signal processing section 240 through the vertical signal line (for example, VSL1) according to a selection signal SELp from the vertical drive circuit 210.

At predetermined timing just before the end of the exposure, the vertical drive circuit 210 supplies (in other words, drives) the reset signal RSTp to the (2k)th row and the (2k+1)th row at the same time to output the pixel signals $AIN_{P1}$ and $AIN_{P2}$ at the same time. Hereinafter, the level of the pixel signals at the reset will be referred to as a "reset level." The column signal processing section 240 successively selects two reset levels in each column to apply AD conversion and outputs the signals to the output circuit 260.

In addition, at the timing of the end of the exposure, the vertical drive circuit 210 supplies (in other words, drives) the transfer signal TRG to the (2k)th row and the (2k+1)th row at the same time to output the pixel signals $AIN_{P1}$ and $AIN_{P2}$ at the same time. The level of the pixel signals at the signal transfer will be referred to as a "signal level." The column signal processing section 240 successively selects two signal levels in columns to apply AD conversion and outputs the signals to the output circuit 260.

Then, for each pixel 230, the output circuit 260 obtains a difference between the reset level and the signal level as clear pixel data in which kTC noise (reset noise) is removed. The process is called a CDS process. The CDS process allows the solid-state imaging element 200 to capture image data with a little noise.

Note that the circuit configuration of the pixel 230 is not limited to the configuration illustrated in FIG. 4 as long as the pixel signal can be generated by photoelectric conversion.

[Configuration Example of Column Signal Processing Section]

Figure 5:
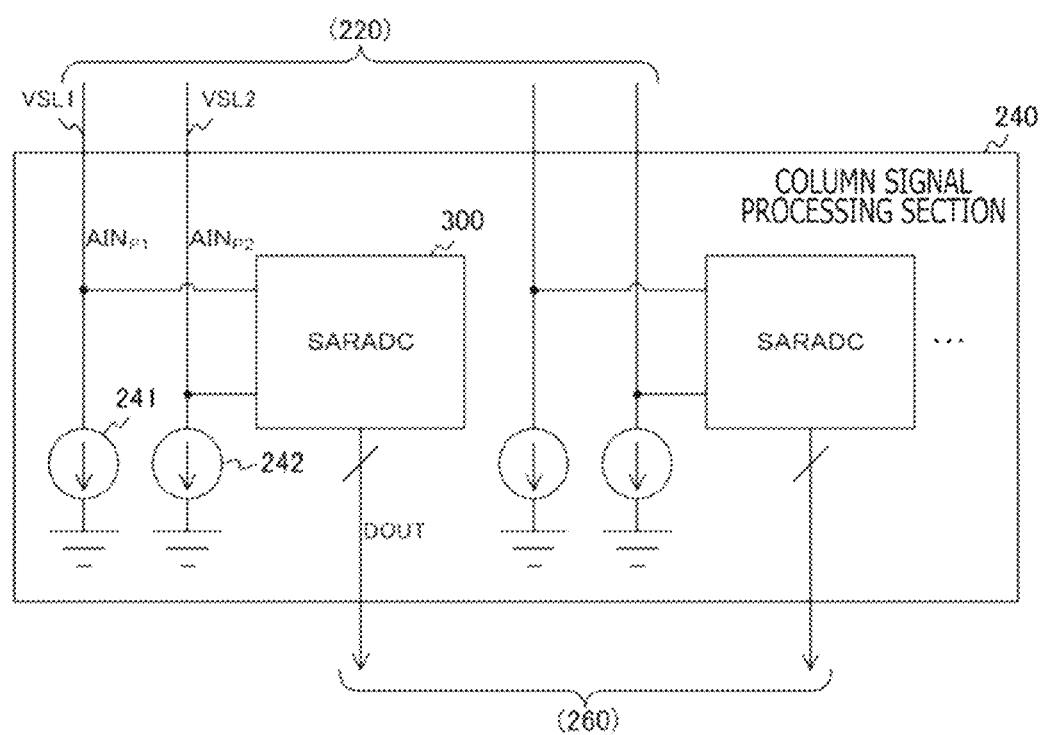
FIG. 5 is a block diagram illustrating a configuration example of a column signal processing section according to the first embodiment of the present technique.

FIG. 5 is a block diagram illustrating a configuration example of the column signal processing section 240 according to the first embodiment of the present technique. For each column, the column signal processing section 240 includes constant current sources 241 and 242 and an SARADC 300. Assuming that the total number of pixel columns in the pixel area 220 is M, a total of M SARADCs 300 are arranged.

The constant current source 241 is configured to supply a constant current to the vertical signal line VSL1. The constant current source 242 is configured to supply a constant current to the vertical signal line VSL2.

The SARADC 300 is connected to the vertical signal lines VSL1 and VSL2 of the corresponding column. As such, each SARADC 300 may be coupled to at least two vertical signals lines. The SARADC 300 is configured to successively select the pixel signals $AIN_{P1}$ and $AIN_{P2}$ from the vertical signal lines and apply AD conversion. The SARADC 300 outputs a digital signal DOUT after the AD conversion to the output circuit 260.

[Configuration Example of SARADC]

Figure 6:
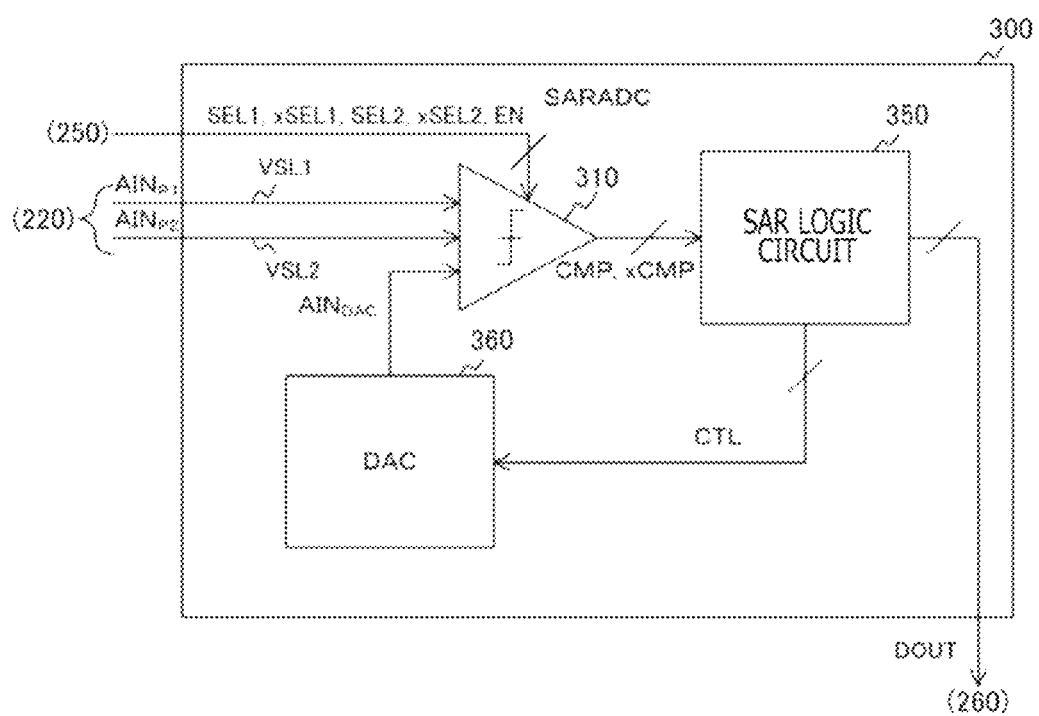
FIG. 6 is a block diagram illustrating a configuration example of an SARADC (Successive Approximation Register Analog to Digital Converter) according to the first embodiment of the present technique.

FIG. 6 is a block diagram illustrating a configuration example of the SARADC 300 according to the first embodiment of the present technique. The SARADC 300 includes a comparator 310, an SAR (Successive Approximation Register) logic circuit 350, and a DAC (Digital to Analog Converter) 360. An input terminal of the comparator 310 is directly connected to the vertical signal lines VSL1 and VSL2 without the involvement of a sample-and-hold circuit.

Here, in recent years, a solid-state imaging element used in a small terminal, such as so-called smartphone and wearable device, is very small with a pixel size of approximately one micrometer (μm), and it is difficult to provide a sample-and-hold circuit. The reason is that if a sample-and-hold circuit is provided, a capacitor in the sample-and-hold circuit needs to be enlarged to suppress noise (so-called kTC noise) generated in the circuit, and this increases the circuit area. The input capacitance of the ADC also increases. That is, the settling speed decreases with an increase in the load capacitance of the vertical signal line, and the processing speed is reduced as a whole. In addition, the capacitor of the sample-and-hold circuit needs to be recharged in a case where the vertical signal line is switched, and extra settling time is necessary to switch the vertical signal line.

On the other hand, the vertical signal line can be switched in the SARADC 300 without the sample-and-hold circuit, and the noise in the configuration of using the sample-and-hold circuit is not generated. Therefore, the degradation of the image quality can be suppressed. In addition, the installation area and the power consumption of the solid-state imaging element 200 can be reduced compared to the case of providing the sample-and-hold circuit.

The comparator 310 is configured to successively select the pixel signals $AIN_{P1}$ and $AIN_{P2}$ according to the control of the timing control circuit 250 and compare the selected signal and a predetermined reference signal $AIN_{DAC}$. The comparator 310 outputs a differential signal indicating the comparison result to the SAR logic circuit 350. The differential signal includes a positive signal CMP and a negative signal xCMP. The lines supporting signals CMP and xCMP are also referred to herein as "output signal lines"). In some embodiments, different reference signals (e.g., reference signals of different values) may be provided to the different SARADCs.

Here, the timing control circuit 250 supplies signal line selection signals and an enabling signal EN to the comparator 310 to control the operation of the comparator 310. The signal line selection signals are signals for selecting one of the vertical signal lines VSL1 and VSL2, and the signal line selection signals include selection signals SEL1, xSEL1, SEL2, and xSEL2. In the case of selecting the vertical signal line VSL1, the selection signals SEL1 and xSEL2 are set to a high level, and the rest of the signals are set to a low level, for example. On the other hand, in the case of selecting the vertical signal line VSL2, the selection signals SEL2 and xSEL1 are set to the high level, and the rest of the signals are set to the low level, for example. Signal xSEL1 is referred to herein as inversion signal of SEL1 to indicate that these signals are inverted versions of each other. Similarly, signal xSEL2 is referred to herein as inversion signal of SEL2 to indicate that these signals are inverted versions of each other.

In addition, the enabling signal EN is a signal for enabling or disabling the comparator 310. For example, in the case of enabling the comparator 310, the enabling signal EN is set to a high level. On the other hand, in the case of disabling the comparator 310, the enabling signal EN is set to a low level.

The SAR logic circuit 350 is configured to obtain a digital signal indicating the value of the reference signal $AIN_{DAC}$ approximate to the pixel signal on the basis of the comparison result of the comparator 310, hold the digital signal in a register, and generate a control signal CTL for updating the reference signal $AIN_{DAC}$ to the value. The DAC 360 is configured to apply DA (Digital to Analog) conversion to the control signal CTL to update the analog reference signal $AIN_{DAC}$. Note that the SAR logic circuit 350 is an example of the control section described in the claims. The DAC 360 is an example of the reference signal update section described in the claims.

Assuming that a predetermined reference voltage is $V_{REF}$, the level of the reference signal $AIN_{DAC}$ in the initial state is set to, for example, an initial value $V_{REF}/2$. The comparator 310 then compares the selected pixel signal and the initial value of the reference signal $AIN_{DAC}$. In a case where the pixel signal is greater than the reference signal $AIN_{DAC}$, the SAR logic circuit 350 sets the MSB (Most Significant Bit) of the digital signal DOUT to "1." The SAR logic circuit 350 then raises the reference signal $AIN_{DAC}$ by $V_{REF}/4$.

On the other hand, in a case where the pixel signal is equal to or smaller than the reference signal $AIN_{DAC}$, the SAR logic circuit 350 sets the MSB of the digital signal DOUT to "0." The SAR logic circuit 350 then lowers the reference signal $AIN_{DAC}$ by $V_{REF}/4$.

The comparator 310 then performs the next comparison, and in a case where the pixel signal is greater than the reference signal $AIN_{DAC}$, the SAR logic circuit 350 sets the next digit of the MSB to "1." The SAR logic circuit 350 then raises the reference signal $AIN_{DAC}$ by $V_{REF}/8$.

On the other hand, in a case where the pixel signal is equal to or smaller than the reference signal $AIN_{DAC}$, the SAR logic circuit 350 sets the next digit of the MSB to "0." The SAR logic circuit 350 then lowers the reference signal $AIN_{DAC}$ by $V_{REF}/8$.

Subsequently, a similar procedure continues up to the LSB (Least Significant Bit). In this way, the analog pixel signal is AD-converted into the digital signal DOUT. The SAR logic circuit 350 outputs the digital signal DOUT to the output circuit 260 at the end of the AD conversion. The digital signal DOUT indicates data (that is, pixel data) after the AD conversion of the pixel signal (reset level or signal level).

Note that the timing control circuit 250 can change the reference voltage $V_{REF}$ of the DAC 360 to control the gain of the SARADC 300. The gain is controlled in a range of, for example, "1" to "8" times.

[Configuration Example of Comparator]

Figure 7:
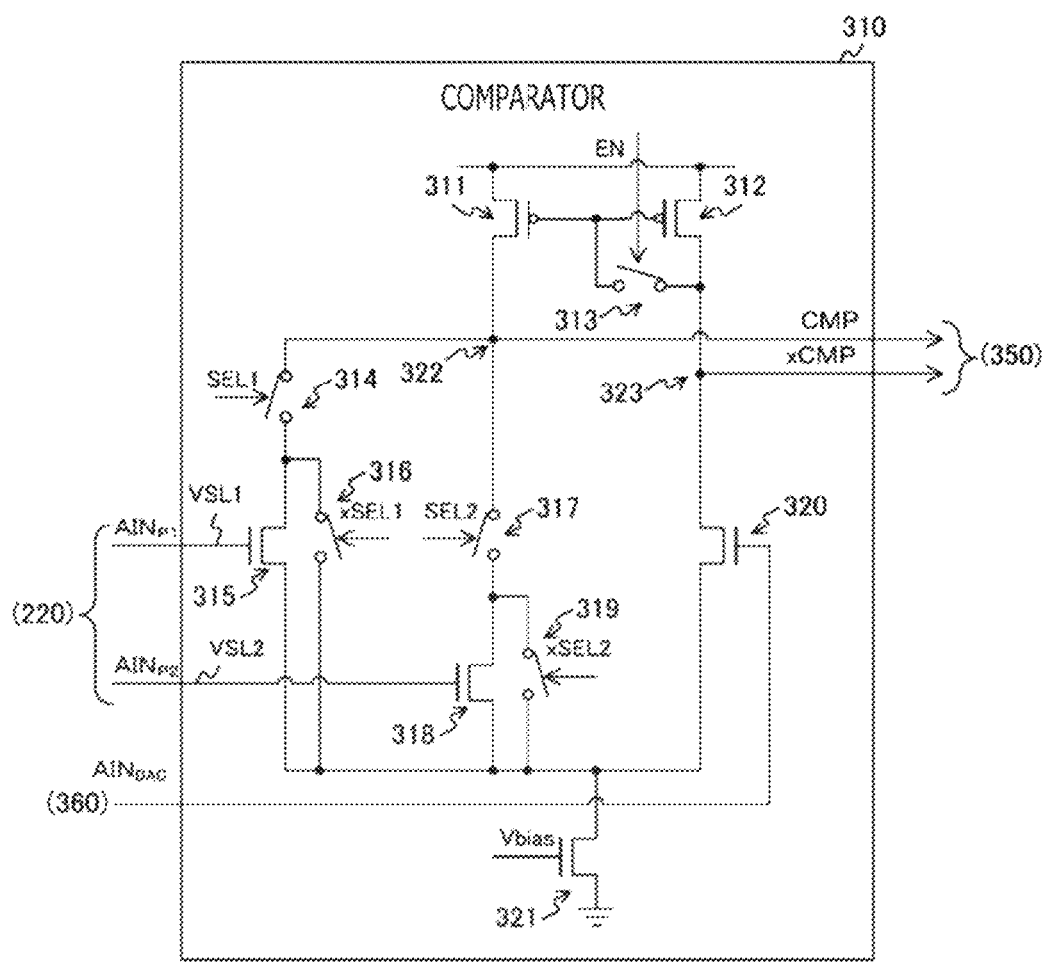
FIG. 7 is a circuit diagram illustrating a configuration example of a comparator according to the first embodiment of the present technique.

FIG. 7 is a circuit diagram illustrating a configuration example of the comparator 310 according to the first embodiment of the present technique. The comparator 310 includes current mirror transistors 311 and 312, an enabling switch 313, selection switches 314 and 317, pixel-side transistors 315 and 318, and short-circuit switches 316 and 319. The comparator 310 further includes a reference-side transistor 320 and a current source transistor 321. For example, pMOS (p-channel Metal Oxide Semiconductor) transistors are used as the current mirror transistors 311 and 312. In addition, for example, nMOS (n-channel Metal Oxide Semiconductor) transistors are used as the pixel-side transistor 315, the pixel-side transistor 318, the reference-side transistor 320, and the current source transistor 321.

The gate of the current mirror transistor 311 is connected to the gate of the current mirror transistor 312, and the source is connected to the power source. In addition, the drain of the current mirror transistor 311 is connected to a positive output node 322. The source of the current mirror transistor 312 is connected to the power source, and the drain is connected to a negative output node 323.

The enabling switch 313 is configured to open and close the route between the gate of the current mirror transistor 311 and the negative output node 323 and the route between the gate of the current mirror transistor 312 and the negative output node 323 according to the enabling signal EN from the timing control circuit 250. For example, the enabling switch 313 shifts to the closed state in the case where the enabling signal EN is in the high level (enabled), and the enabling switch 313 shifts to the open state in the case where the enabling signal EN is in the low level (disabled). A circuit including the current mirror transistors 311 and 312 and the enabling switch 313 functions as a current mirror circuit.

The selection switch 314 is configured to open and close the route between the drain of the pixel-side transistor 315 and the positive output node 322 according to the selection signal SEL1 from the timing control circuit 250. For example, the selection switch 314 shifts to the closed state in the case where the selection signal SEL1 is in the high level (that is, the vertical signal line VSL1 is selected), and the selection switch 314 shifts to the open state in the case where the selection signal SEL1 is in the low level.

The gate of the pixel-side transistor 315 is connected to the vertical signal line VSL1, and the source is connected to the drain of the current source transistor 321.

The short-circuit switch 316 is configured to short-circuit the source and the drain of the pixel-side transistor 315 according to the selection signal xSEL1. For example, the short-circuit switch 316 shifts to the closed state to short-circuit the source and the drain in the case where the selection signal xSEL1 is in the high level (that is, the vertical signal line VSL1 is not selected). On the other hand, the short-circuit switch 316 shifts to the open state in the case where the selection signal xSEL1 is in the low level.

The selection switch 317 is configured to open and close the route between the drain of the pixel-side transistor 318 and the positive output node 322 according to the selection signal SEL2 from the timing control circuit 250. For example, the selection switch 317 shifts to the closed state in the case where the selection signal SEL2 is in the high level (that is, the vertical signal line VSL2 is selected), and the selection switch 317 shifts to the open state in the case where the selection signal SEL2 is in the low level. Note that a circuit including the selection switches 314 to 317 is an example of the selection section in comparator described in the claims.

The gate of the pixel-side transistor 318 is connected to the vertical signal line VSL2, and the source is connected to the drain of the current source transistor 321.

The short-circuit switch 319 is configured to short-circuit the source and the drain of the pixel-side transistor 318 according to the selection signal xSEL2. For example, the short-circuit switch 319 shifts to the closed state to short-circuit the source and the drain in the case where the selection signal xSEL2 is in the high level (that is, the vertical signal line VSL2 is not selected). On the other hand, the short-circuit switch 319 shifts to the open state in the case where the selection signal xSEL2 is in the low level. Note that a circuit including the short-circuit switches 316 to 319 is an example of the short-circuit section described in the claims.

The reference signal $AIN_{DAC}$ from the DAC 360 is input to the gate of the reference-side transistor 320. The source is connected to the drain of the current source transistor 321, and the drain is connected to the negative output node 323.

The positive signal CMP and the negative signal xCMP are output from the positive output node 322 and the negative output node 323 to the SAR logic circuit 350. As such, a first output signal line (CMP) is connected to node 322 between the power supply and transistor 315, and a second output signal line (xCMP) is connected to node 323 between the power supply and transistor 320. The differential signal including the positive signal CMP and the negative signal xCMP indicates the comparison result of the pixel signal from the selected vertical signal line and the reference signal $AIN_{DAC}$.

A constant bias voltage Vbias is input to the gate of the current source transistor 321, and the source is connected to an earth terminal.

According to the configuration, the selection switch 314 shifts to the closed state to connect the drain of the pixel-side transistor 315 and the positive output node 322 in the case where the vertical signal line VSL1 is selected. In addition, the selection switch 317 shifts to the open state to put the drain of the pixel-side transistor 318 on the unselected side into a high-impedance state. Furthermore, the short-circuit switch 319 short-circuits the source and the drain of the pixel-side transistor 318 on the unselected side.

On the other hand, the selection switch 317 shifts to the closed state to connect the drain of the pixel-side transistor 318 and the positive output node 322 in the case where the vertical signal line VSL2 is selected. In addition, the selection switch 314 shifts to the open state to put the drain of the pixel-side transistor 315 on the unselected side into a high-impedance state. Furthermore, the short-circuit switch 316 short-circuits the source and the drain of the pixel-side transistor 315 on the unselected side.

In this way, the drain of the pixel-side transistor on the unselected side can be put into the high impedance state, and the source and the drain can be short-circuited to suppress the influence of noise from the unselected vertical signal line. That is, the noise immunity can be improved.

Figure 8:
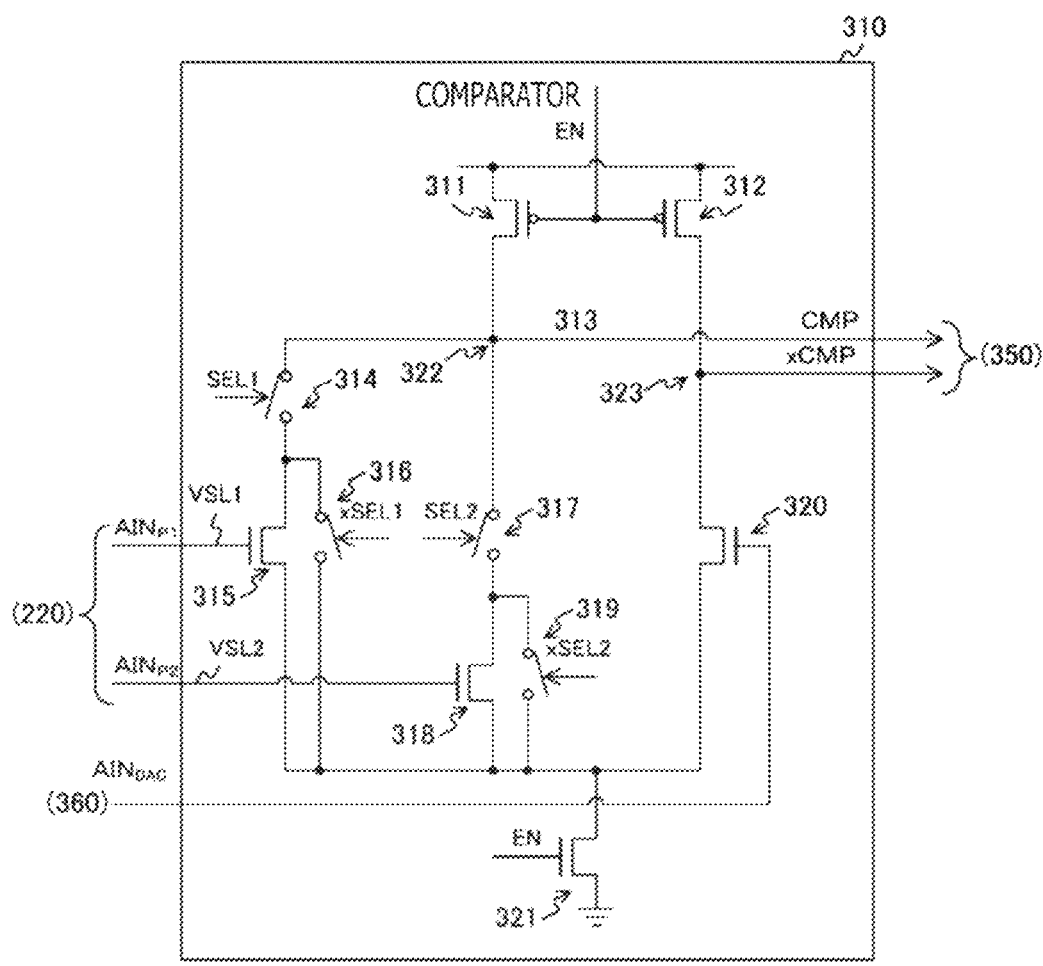
FIG. 8 is a circuit diagram illustrating another configuration example of the comparator according to the first embodiment of the present technique.

In addition, by putting the enabling signal EN into the low level, the enabling switch 313 enters the open state, and the comparison operation of the comparator 310 can be disabled. The timing control circuit 250 can reduce the power consumption by, for example, using the enabling signal EN to disable the comparator 310 in a period in which the AD conversion is not performed. Note that as illustrated in FIG. 8, the enabling switch 313 may be deleted, and the enabling signal EN may be input to the gate of each of the current mirror transistors 311 and 312 and the current source transistor 321. In this case, the timing control circuit 250 puts the enabling signal EN into the high level at the timing of, for example, the comparison by the comparator 310. In addition, the timing control circuit 250 puts the enabling signal EN into the low level in a period in which the SAR log circuit 350 is updating the register or in a period in which the SAR log circuit 350 is updating the reference signal of the DAC 36. This can further reduce the power consumption.

Figure 9:
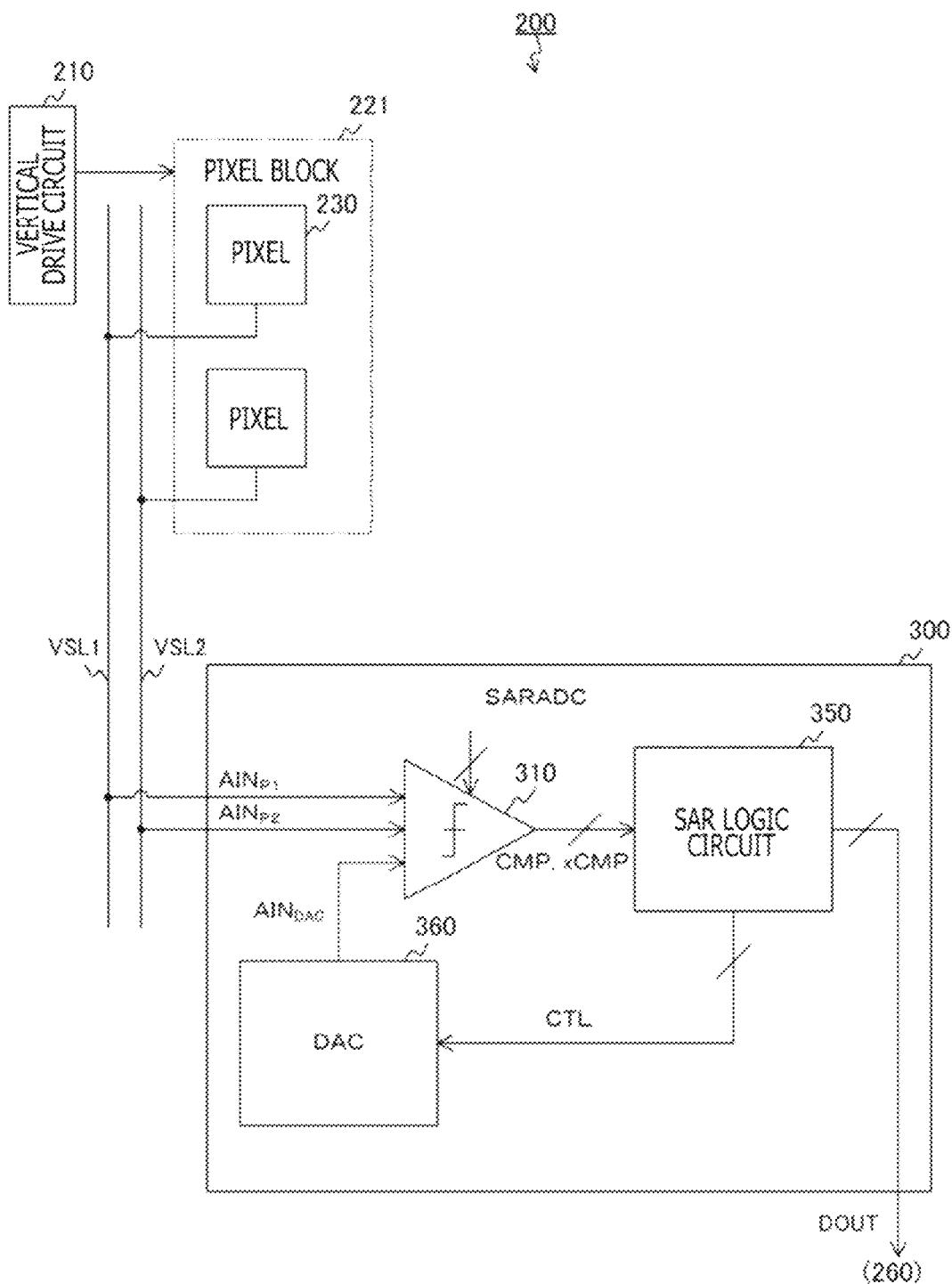
FIG. 9 is an example of an overall view of the solid-state imaging element according to the first embodiment of the present technique.

FIG. 9 is an example of an overall view of the solid-state imaging element 200 according to the first embodiment of the present technique. In the pixel block 221, two pixels 230 are arrayed in the vertical direction. The vertical drive circuit 210 drives the pixel block 221 to output two pixel signals ($AIN_{P1}$ and $AIN_{P2}$) at the same time through the vertical signal lines VSL1 and VSL2.

Then, in the SARADC 300, the comparator 310 successively selects the pixel signals $AIN_{P1}$ and $AIN_{P2}$ and compares the signals and the reference signal $AIN_{DAC}$.

The SAR logic circuit 350 generates the control signal CTL for updating the reference signal $AIN_{DAC}$ on the basis of the comparison result of the comparator 310 and supplies the control signal CTL to the DAC 360. The DAC 360 updates the reference signal $AIN_{DAC}$ according to the control signal CTL and supplies the reference signal $AIN_{DAC}$ to the comparator 310.

[Example of Operation of Solid-State Imaging Element]

Figure 10:
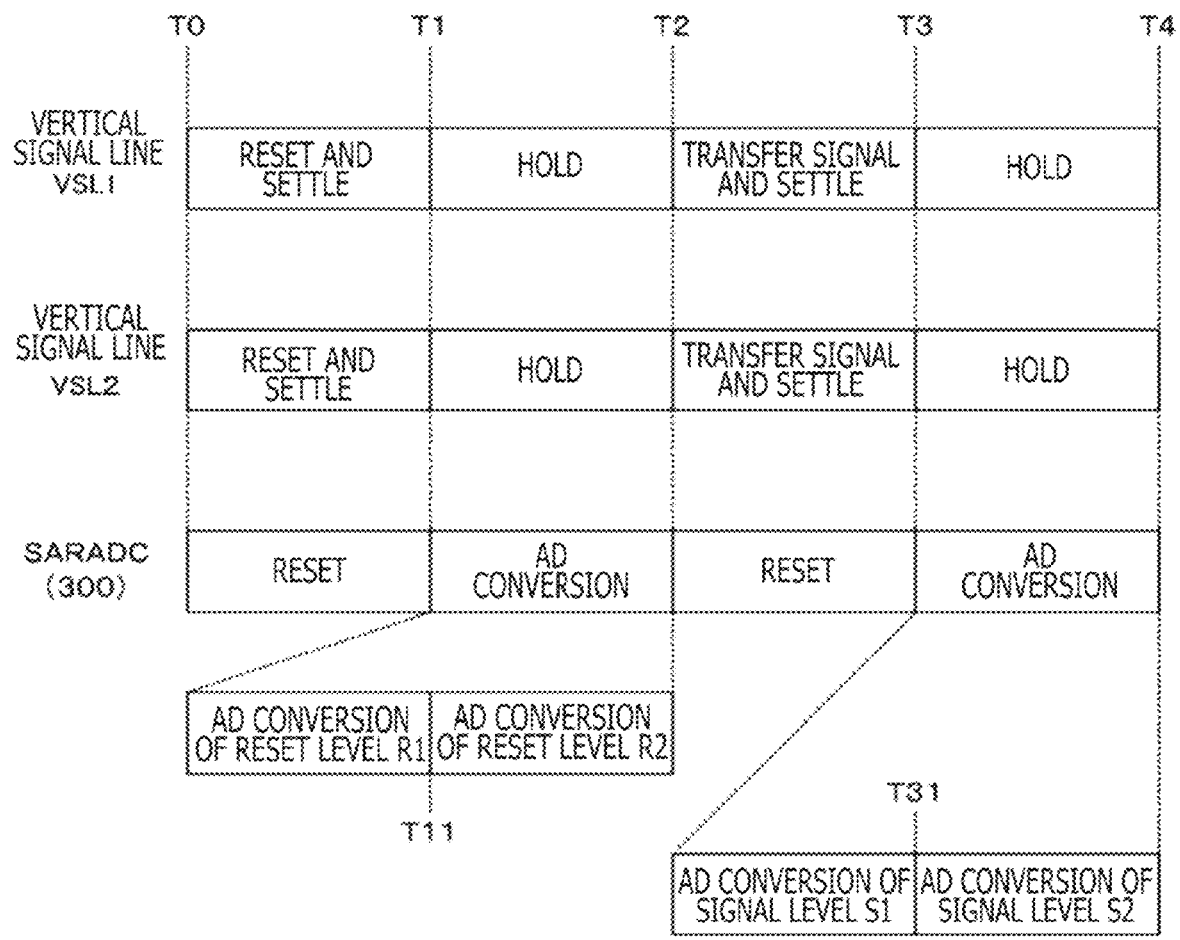
FIG. 10 is a timing chart illustrating an example of operation of the solid-state imaging element according to the first embodiment of the present technique.

FIG. 10 is a timing chart illustrating an example of operation of the solid-state imaging element 200 according to the first embodiment of the present technique. At timing T0, the vertical drive circuit 210 uses the reset signal RSTp to drive the pixel block 221 to output reset levels R1 and R2 at the same time. The timing control circuit 250 also initializes the SARADC 300. Here, the initialization of the SARADC 300 denotes that the reference signal $AIN_{DAC}$ and the digital signal DOUT in the SARADC 300 are set to initial values.

At timing T1 after settling time for settlement of the reset levels R1 and R2, the timing control circuit 250 uses a selection signal to control the SARADC 300 to start AD conversion of the reset level R1. At timing T11 of the completion of the AD conversion of the reset level R1, the timing control circuit 250 uses a selection signal to control the SARADC 300 to start AD conversion of the reset level R2. The analog reset levels R1 and R2 are held until timing T2 of the completion of the AD conversion. In addition, the reset levels after the AD conversion are held in the output circuit 260. Reference signal $AIN_{DAC}$ may be varied over time. For example, reference signal $AIN_{DAC}$ may be varied during a predefined time slot (e.g., between T1 and T2) until a least significant bit is generated.

At the timing T2 of the completion of the AD conversion, the vertical drive circuit 210 uses the transfer signal TRG to drive the pixel block 221 to output signal levels S1 and S2 at the same time. In addition, the timing control circuit 250 initializes the SARADC 300.

At timing T3 after settling time for settlement of the signal levels S1 and S2, the timing control circuit 250 uses a selection signal to control the SARADC 300 to start the AD conversion of the signal level S1. At timing T31 of the completion of the AD conversion of the signal level S1, the timing control circuit 250 uses a selection signal to control the SARADC 300 to start the AD conversion of the signal level S2. The analog signal levels S1 and S2 are held until timing T4 of the completion of the AD conversion. The output circuit 260 then acquires the signal levels after the AD conversion and obtains differences between the signal levels and the held reset levels.

The drive and the AD conversion of the pixel block 221 are executed for each row of the pixel block 221. One row of pixel block 221 is equivalent to two rows of pixels 230. Therefore, two rows (or, in embodiments, all the rows) can be driven at the same time (e.g., simultaneously) at the timing T0 and T2 to improve the reading speed of the image data compared to the case in which the two rows are sequentially driven. Here, the reading speed denotes a value obtained by dividing a constant value (for example, data size of pixel data) by the time from the drive of the pixel 230 to the completion of the AD conversion.

In addition, the AD conversion is executed by the SARADC 300. Therefore, the speed of the AD conversion can be faster than in the case where the AD conversion is executed by a single-slope ADC.

Figure 11:
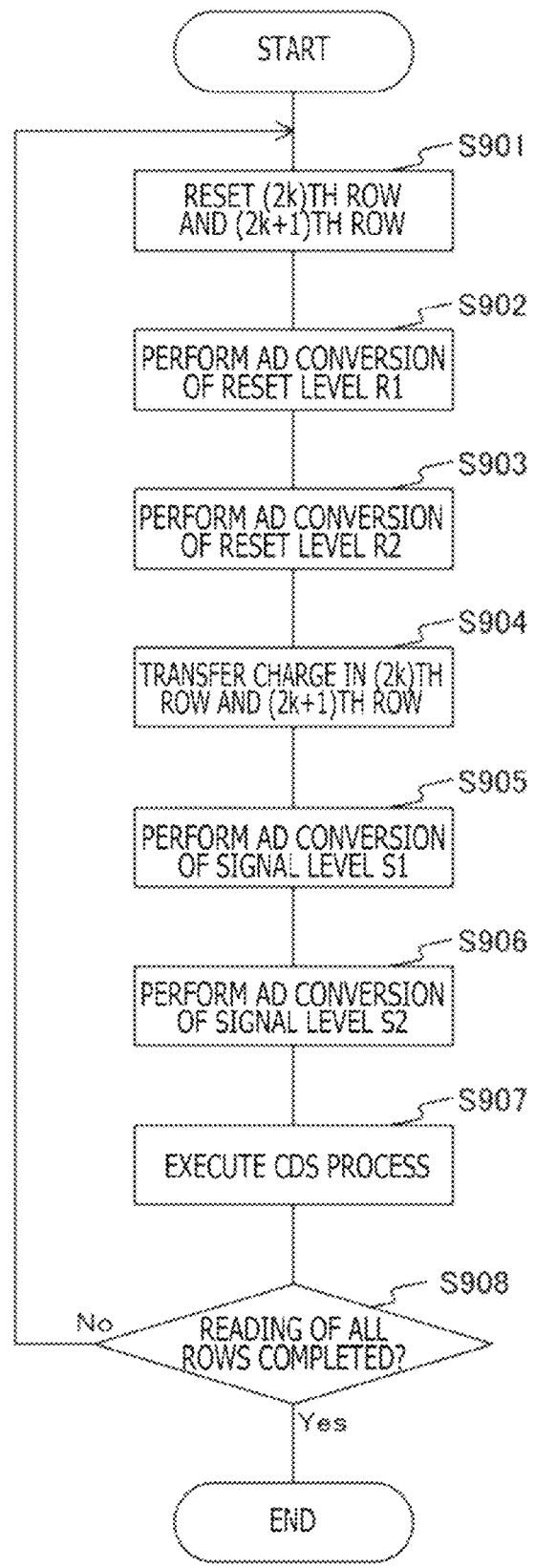
FIG. 11 is a flow chart illustrating an example of operation of the solid-state imaging element according to the first embodiment of the present technique.

FIG. 11 is a flow chart illustrating an example of operation of the solid-state imaging element 200 according to the first embodiment of the present technique. The operation is started when, for example, a predetermined application for capturing image data is executed.

The vertical drive circuit 210 in the solid-state imaging element 200 first uses the reset signal RSTp to initialize the (2k)th row and the (2k+1)th row at the same time (step S901). After the reset levels R1 and R2 are settled, the SARADC 300 performs AD conversion of the reset level R1 (step S902) and then performs AD conversion of the reset level R2 (step S903).

The vertical drive circuit 210 then uses the transfer signal TRG to transfer the charge in the (2k)th row and the charge in the (2k+1)th row at the same time (step S904). After the signal levels S1 and S2 are settled, the SARADC 300 performs AD conversion of the signal level S1 (step S905) and then performs AD conversion of the signal level S2 (step S906).

The output circuit 260 then executes a CDS process (step S907). The solid-state imaging element 200 determines whether the reading of all rows is completed (step S908). If reading of all rows is not completed (step S908: No), the solid-state imaging element 200 repeatedly executes step S901 and subsequent steps. On the other hand, if reading of all rows is completed (step S908: Yes), the solid-state imaging element 200 ends the operation of capturing the image data. In a case of capturing a plurality of pieces of image data, steps S901 to S908 are repeatedly executed in synchronization with, for example, the vertical synchronization signal.

In this way, according to the first embodiment of the present technique, the vertical drive circuit 210 outputs two pixel signals at the same time, and the comparator 310 successively selects and compares the pixel signals. As a result, the reading speed can be improved compared to the case in which the pixel signals are output and compared one by one.

First Modification

Although the solid-state imaging element 200 uses the contrast AF system to detect the focal point in the first embodiment, the AF speed of the contrast AF is slower than in a phase difference AF system. The solid-state imaging element 200 according to a modification of the first embodiment is different from the first embodiment in that the solid-state imaging element 200 uses the phase difference AF system to detect the focal point.

Figure 12:
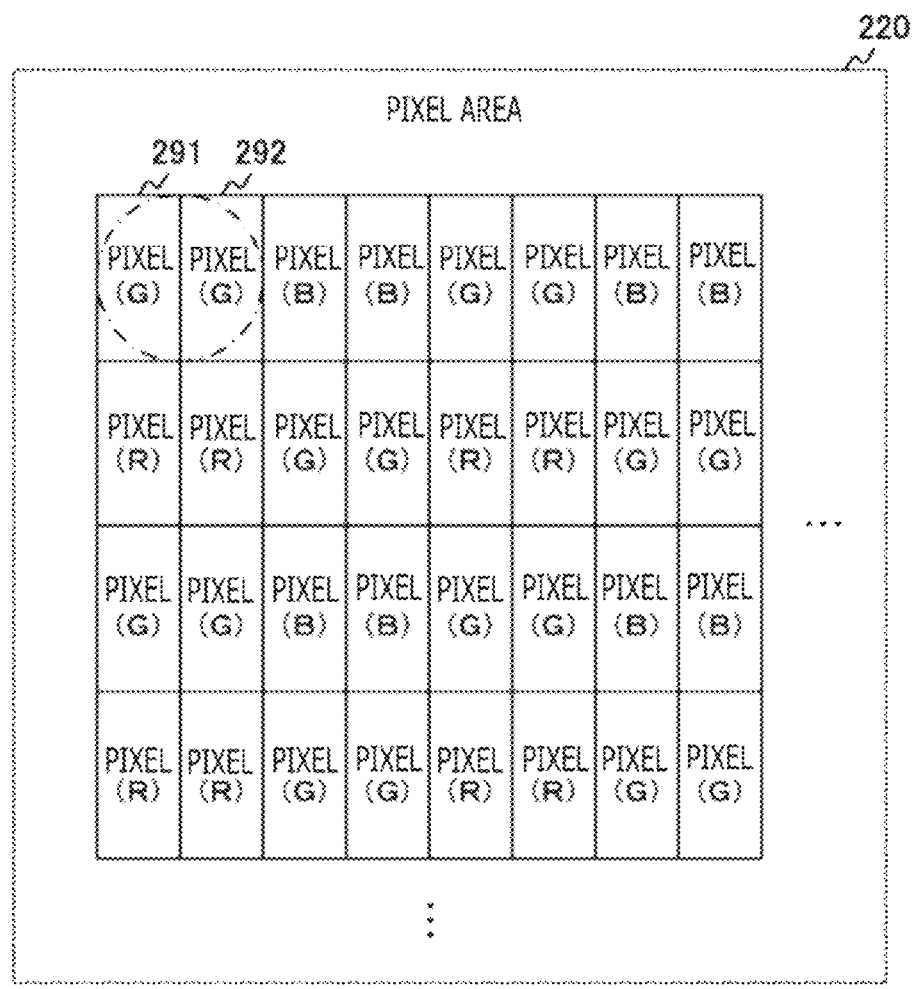
FIG. 12 is an example of a plan view of the pixel area according to a modification of the first embodiment of the present technique.

FIG. 12 is an example of a plan view of the pixel area 220 according to the modification of the first embodiment of the present technique. Rectangular pixels are arrayed in the pixel area 220 in the modification of the first embodiment.

In addition, in the pixel area 220, a pair of pixels of the same color are arrayed adjacent to each other in the horizontal direction. For example, a pixel 292 of G is arranged on the right of a pixel 291 of G. A pair of B pixels are arrayed on the right of the pixel 292. A pair of R pixels are arranged below the pixels 291 and 292, and two G pixels are arranged on the right of the R pixels.

Additionally, the same microlenses are provided on the pair of adjacent pixels of the same color. A one-dot-chain in FIG. 11 indicates the position of the microlenses. Incident light of one of two pupil-divided images is input to one of the pair of pixels, and incident light of the other of the two pupil-divided images is input to the other of the pair of pixels. The output circuit 260 executes a phase difference AF process of obtaining a phase difference between the two images from the pixel data to detect the focal point from the phase difference.

In this way, according to the modification of the first embodiment of the present technique, the phase difference AF system can be used to detect the focal point faster than in the case where the contrast AF system is used.

2. Second Embodiment

Although the floating diffusion layer 234 and the selection transistor 236 are arranged for each pixel 230 in the first embodiment, the circuit scale may increase with an increase in the number of pixels. The solid-state imaging element 200 of a second embodiment is different from the first embodiment in that a plurality of pixels share a floating diffusion layer and the like.

Figure 13:
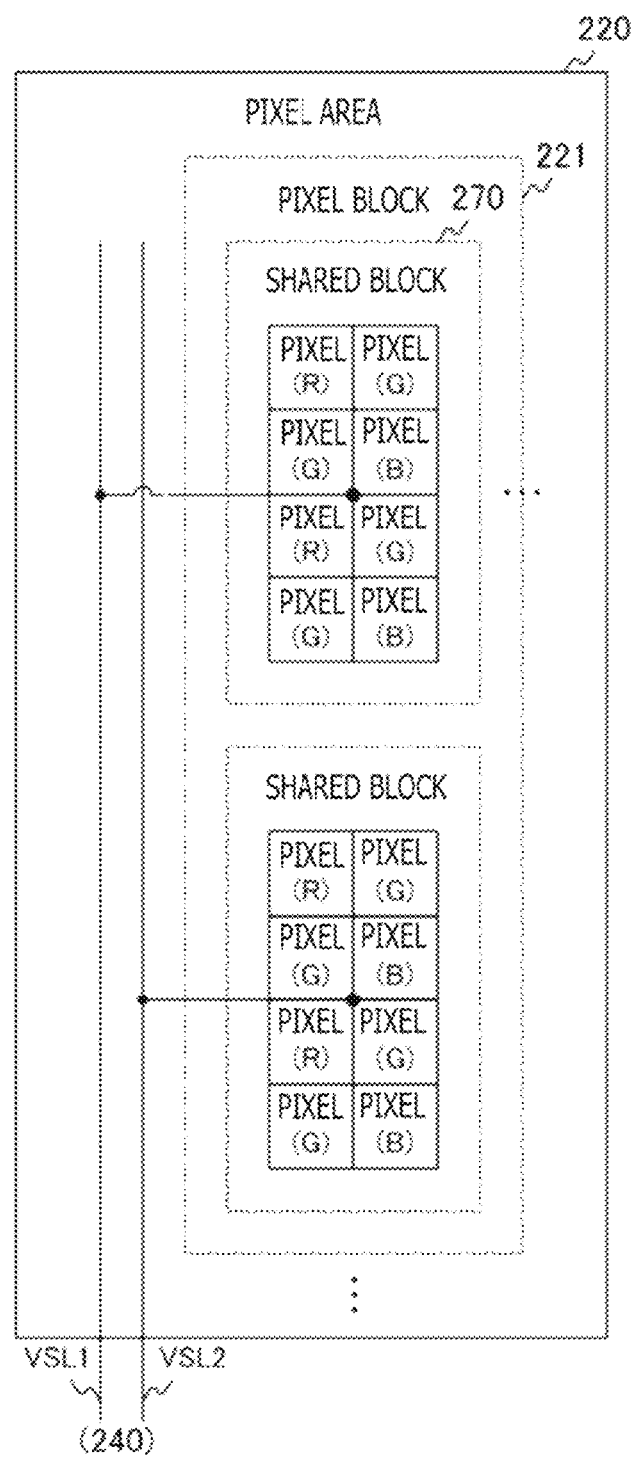
FIG. 13 is an example of a plan view of the pixel area according to a second embodiment of the present technique.

FIG. 13 is an example of a plan view of the pixel area 220 according to the second embodiment of the present technique. In the pixel area 220 of the second embodiment, two shared blocks 270 are arrayed in the vertical direction in the pixel block 221. A plurality of pixels sharing a floating diffusion layer are arrayed in each shared block 270. For example, eight pixels of four rows×two columns are arrayed in the shared block 270. The pixels are arrayed in a Bayer array as in the first embodiment. Note that the number of pixels in the shared block 270 is not limited to eight.

In addition, the SARADC 300 is arrayed in each column of the pixel block 221. In other words, the SARADC 300 is arrayed for every two columns of the pixels. In addition, two vertical signal lines are wired in each column of the pixel block 221. For example, assuming that the total number of pixel columns in the pixel area 220 is M, a total of M/2 SARADCs 300 are arrayed, and a total of M vertical signal lines are wired. In addition, the two shared blocks 270 in the pixel block 221 are connected to different vertical signal lines.

Figure 14:
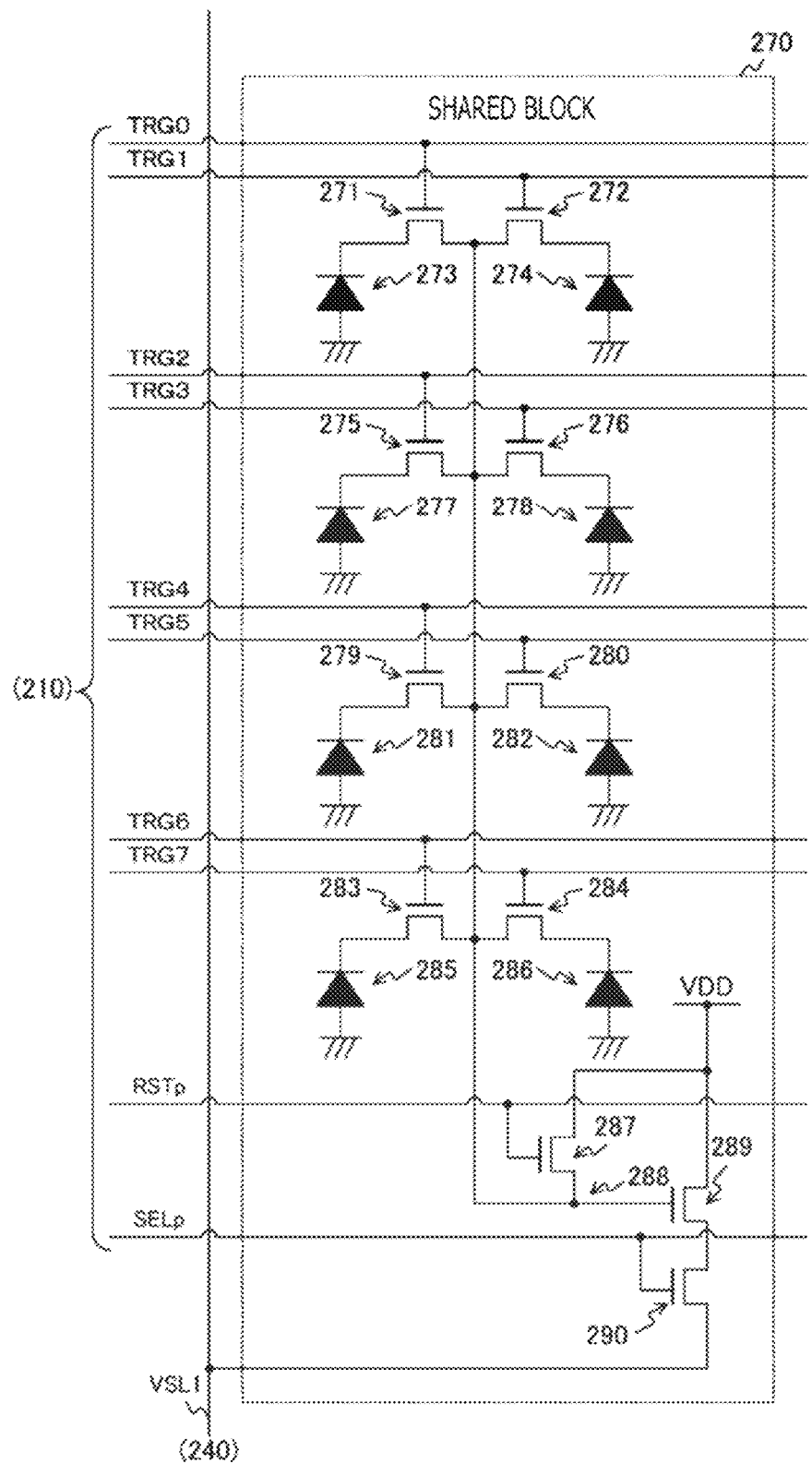
FIG. 14 is a circuit diagram illustrating a configuration example of a shared block according to the second embodiment of the present technique.

FIG. 14 is a circuit diagram illustrating a configuration example of the shared block 270 according to the first embodiment of the present technique. The shared block 270 includes transfer transistors 271, 272, 275, 276, 279, 280, 283, and 284 and photodiodes 273, 274, 277, 278, 281, 282, 285, and 286. The shared block 270 also includes a reset transistor 287, a floating diffusion layer 288, an amplifier transistor 289, and a selection transistor 290. For example, nMOS transistors are used as the transfer transistor 271 and other transistors.

Each of the photodiodes 273, 274, 277, 278, 281, 282, 285, and 286 is configured to photoelectrically convert the received light to generate charge.

The transfer transistor 271 is configured to transfer the charge from the photodiode 273 to the floating diffusion layer 288 according to a transfer signal TRG0 from the vertical drive circuit 210. The transfer transistor 272 is configured to transfer the charge from the photodiode 274 to the floating diffusion layer 288 according to a transfer signal TRG1 from the vertical drive circuit 210.

The transfer transistor 275 is configured to transfer the charge from the photodiode 277 to the floating diffusion layer 288 according to a transfer signal TRG2 from the vertical drive circuit 210. The transfer transistor 276 is configured to transfer the charge from the photodiode 278 to the floating diffusion layer 288 according to a transfer signal TRG3 from the vertical drive circuit 210.

In addition, the transfer transistor 279 is configured to transfer the charge from the photodiode 281 to the floating diffusion layer 288 according to a transfer signal TRG4 from the vertical drive circuit 210. The transfer transistor 280 is configured to transfer the charge from the photodiode 282 to the floating diffusion layer 288 according to a transfer signal TRG5 from the vertical drive circuit 210.

The transfer transistor 283 is configured to transfer the charge from the photodiode 285 to the floating diffusion layer 288 according to a transfer signal TRG6 from the vertical drive circuit 210. The transfer transistor 284 is configured to transfer the charge from the photodiode 286 to the floating diffusion layer 288 according to a transfer signal TRG7 from the vertical drive circuit 210.

The floating diffusion layer 288 is configured to accumulate the transferred charge and generate a voltage according to the amount of accumulated charge. The reset transistor 287 is configured to pull out the charge from the floating diffusion layer 288 according to the reset signal RSTp from the vertical drive circuit 210 to initialize the amount of charge. The amplifier transistor 289 is configured to amplify the voltage of the floating diffusion layer 288. The selection transistor 290 is configured to output a pixel signal that is a signal of the amplified voltage to the column signal processing section 240 through the vertical signal line VSL1 or the like according to the selection signal SELp from the vertical drive circuit 210.

The vertical drive circuit 210 drives the pixel block 221 to output the pixel signal of one of the pixels in the upper shared block 270 and the pixel signal of one of the pixels in the lower shared block 270 at the same time.

In this way, according to the second embodiment of the present technique, a plurality of pixels share the floating diffusion layer 288 and the selection transistor 290, and the circuit scale per pixel can be reduced compared to the case in which the floating diffusion layer 288 and the like are not shared.

Modification

Although the pixels are arrayed in the pixel area 220 on the basis of the Bayer array in the second embodiment, pixels of the same color are not adjacent to each other in the Bayer array, and the image quality may be reduced in the pixel addition of a plurality of pieces of pixel data in the same color. The solid-state imaging element 200 according to a modification of the second embodiment is different from the second embodiment in that a plurality of pixels of the same color are arranged adjacent to each other.

Figure 15:
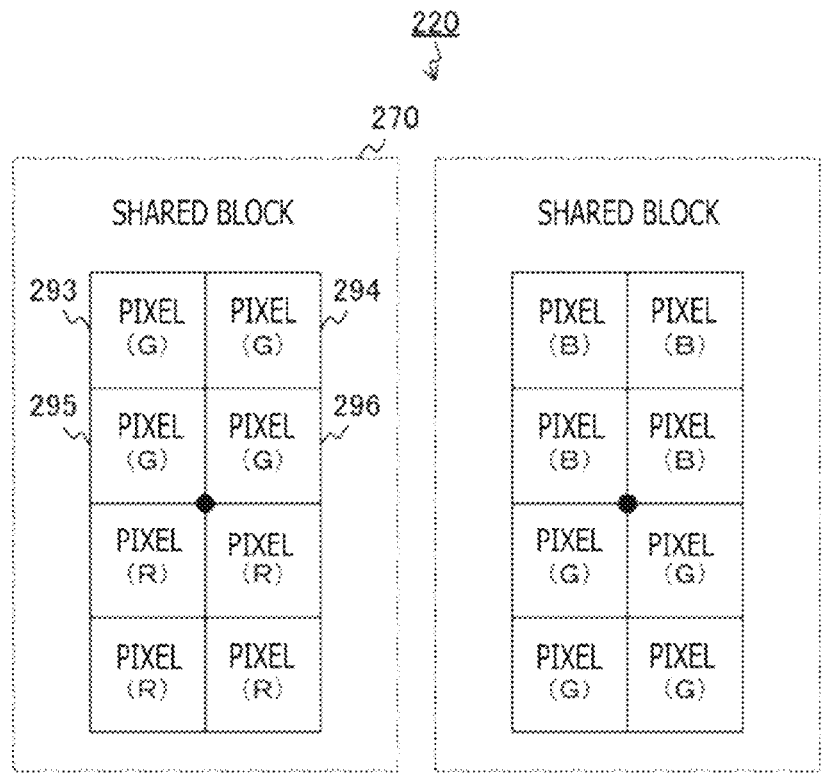
FIG. 15 is an example of a plan view of the pixel area according to a modification of the second embodiment of the present technique.
Figure 15:
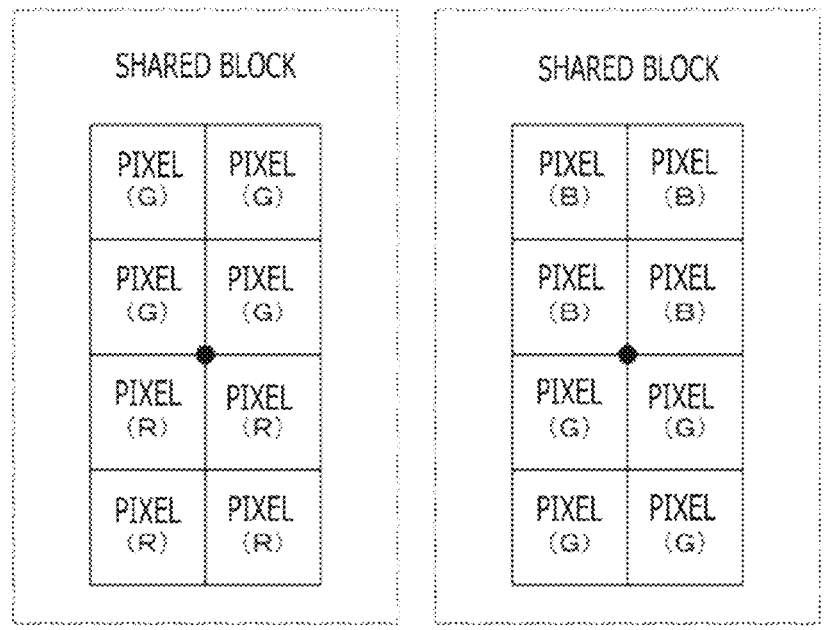

FIG. 15 is an example of a plan view of the pixel area 220 according to the modification of the second embodiment of the present technique. As illustrated in the figure, four pixels of the same color are arranged adjacent to each other in the modification of the second embodiment. For example, a pixel 293 of G is arranged on the upper left of the shared block 270, and a pixel 294 of G is arranged on the right of the pixel 293. In addition, a pixel 295 of G is arranged below the pixel 293, and a pixel 296 of G is arranged on the right of the pixel 295. Four R pixels are arranged on the rest of the shared block 270. Four B pixels and four G pixels are arranged in the shared block 270 on the right side.

In a pixel addition mode or the like, the output circuit 260 performs pixel addition of four pieces of pixel data of the same color adjacent to each other.

In addition, in a mode of expanding the dynamic range, the vertical drive circuit 210 sets the exposure time of a half of four adjacent pixels of the same color to a value different from the exposure time of the rest of the pixels. For example, the vertical drive circuit 210 exposes the pixel 293 and the pixel 296 on the lower right of the pixel 293 for exposure time TS. Next, the vertical drive circuit 210 exposes the pixel 294 and the pixel 295 on the lower left of the pixel 294 for exposure time TL longer than the exposure time TS. The output circuit 260 then uses alpha blending or the like to combine the pixel data exposed for the exposure time TS and the image data exposed for the exposure time TL. This can expand the dynamic range.

In this way, according to the modification of the second embodiment of the present technique, a plurality of pixels of the same color are arranged adjacent to each other. Therefore, the image quality of the image data after the pixel addition can be improved compared to the case of the Bayer array in which the colors of adjacent pixels are different.

3. Third Embodiment

Capacitors for sampling and holding are not arranged in the SARADC 300 in the first embodiment. However, when the time required for the AD conversion becomes long in the configuration, the level of the pixel signal held by the pixel 230 may fluctuate, and an error of the AD conversion may become large. The SARADC 300 of a third embodiment is different from the first embodiment in that the SARADC 300 includes capacitors.

Figure 16:
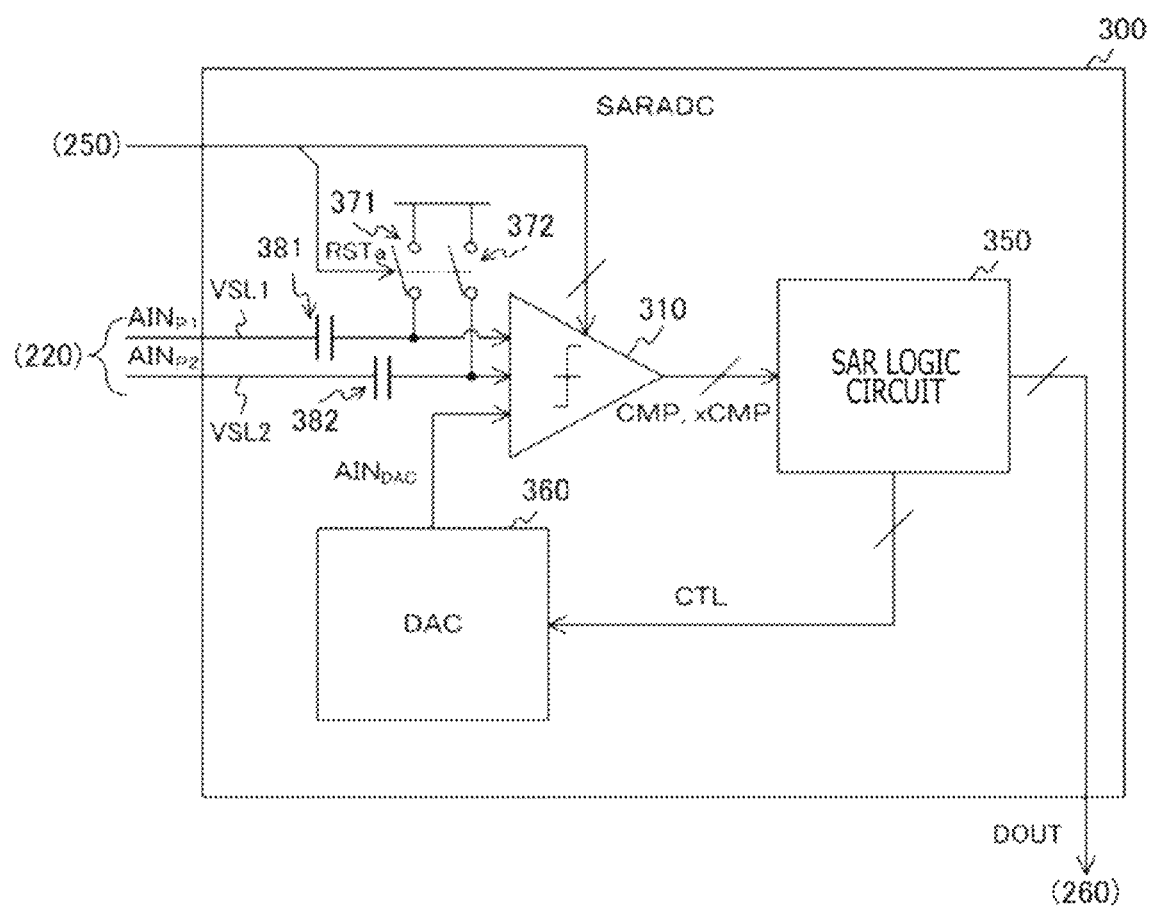
FIG. 16 is a block diagram illustrating a configuration example of the SARADC according to a third embodiment of the present technique.

FIG. 16 is a block diagram illustrating a configuration example of the SARADC 300 according to the third embodiment of the present technique. The SARADC 300 of the third embodiment is different from the first embodiment in that the SARADC 300 further includes capacitors 381 and 382 and reset switches 371 and 372.

One end of the capacitor 381 is connected to the vertical signal line VSL1, and the other end is connected to the input terminal of the comparator 310. One end of the capacitor 382 is connected to the vertical signal line VSL2, and the other end is connected to the input terminal of the comparator 310.

The reset switch 371 is configured to open and close the route between the terminal on the comparator 310 side of the capacitor 381 and the low-impedance fixed potential according to a reset signal RSTa from the timing control circuit 250. The reset switch 372 is configured to open and close the route between the terminal on the comparator 310 side of the capacitor 382 and the fixed potential according to the reset signal RSTa. For example, the resent switches 371 and 372 shift to the closed state in the case where the reset signal RSTa is in the high level. As a result, the amount of charge of each of the capacitors 381 and 382 is initialized. On the other hand, in the case where the reset signal RSTa is in the low level, the reset switches 371 and 372 shift to the open state, and the impedance becomes high. Note that a circuit including the reset switches 371 and 372 is an example of the reset section described in the claims.

Figure 17:
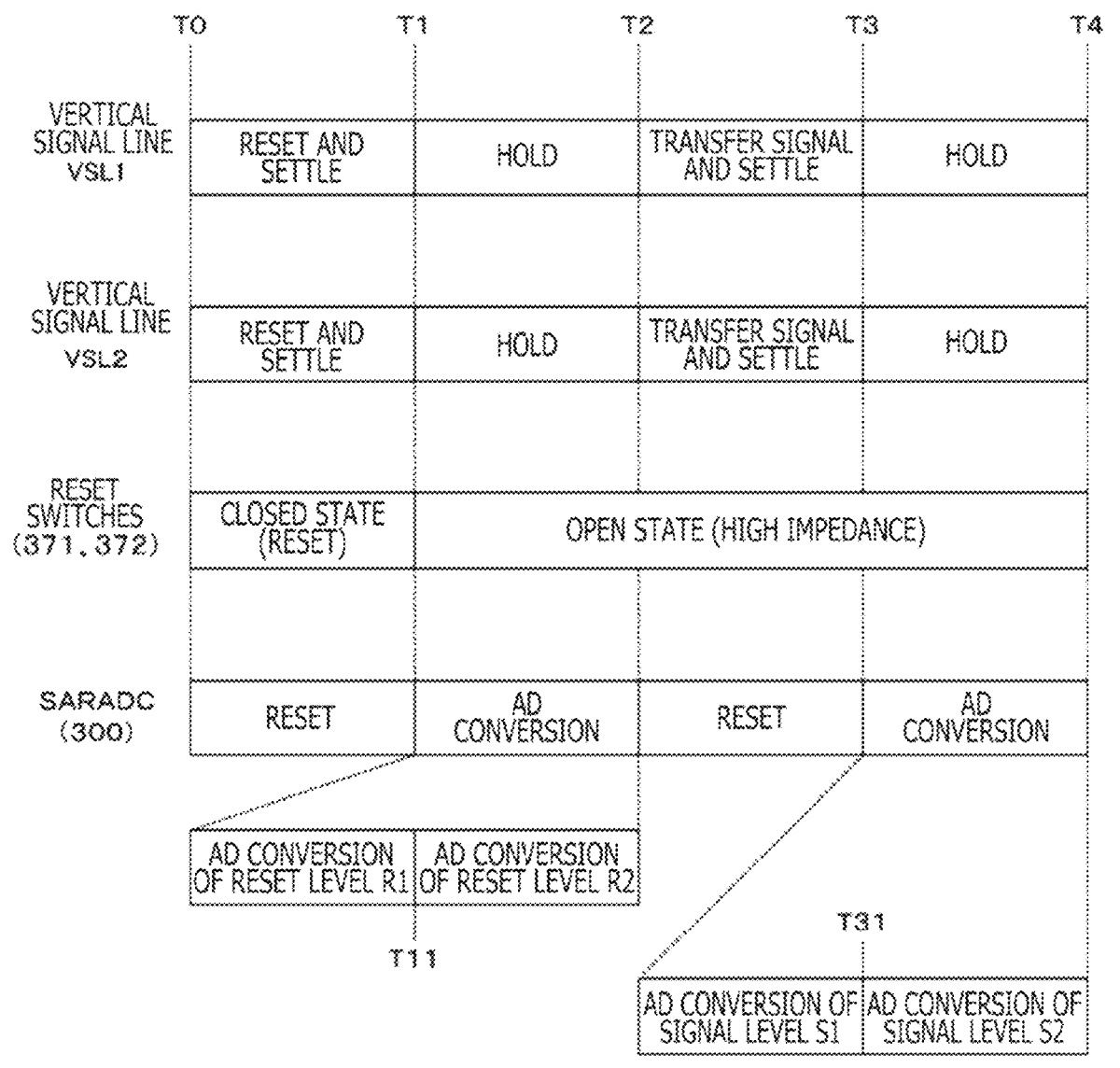

FIG. 17 is a timing chart illustrating an example of operation of the solid-state imaging element 200 according to the third embodiment of the present technique. The timing control circuit 250 uses the reset signal RSTa to put the reset switches 371 and 372 into the closed state between timing T0 of the initialization of the pixel block 221 and timing T1 after the settling time. As a result, the amounts of charge of the capacitors 381 and 382 are initialized.

The timing control circuit 250 then uses the reset signal RSTa to put the reset switches 371 and 372 into the open state at the timing T1. As a result, the reset switches 371 and 372 enter the high-impedance state. In this case, the reset noise is held in the capacitors 381 and 382. Meanwhile, the pixel 230 also continues to hold the reset level. Additionally, the timing control circuit 250 maintains the reset switches 371 and 372 in the open state until timing T3 of the completion of the AD conversion of the reset level.

The timing control circuit 250 also maintains the reset switches 371 and 372 in the open state between timing T2 and the timing T3 of the settlement of the signal level. As a result, one side of each of the capacitors 381 and 382 remains to be an open end. Therefore, the capacitor charge does not move, and this can prevent application of additional kTC noise. The timing control circuit 250 maintains the reset switches 371 and 372 in the open state from the timing T3 to timing of the next reset of the pixel 230.

Note that although the floating diffusion layer 234 and the like are arranged for each pixel 230 in the third embodiment, a plurality of pixels may share the floating diffusion layer and the like as in the second embodiment.

In this way, according to the third embodiment of the present technique, the capacitors 381 and 382 that hold the pixel signals are provided in the SARADC 300, and the fluctuation of the pixel signals during the AD conversion can be suppressed.

4. Fourth Embodiment

In the first embodiment, one column signal processing section 240 successively selects the pixel signals of the (2k)th row and the (2k+1)th row and performs the AD conversion. However, with an increase in the number of rows, the number of times of AD conversion increases, and the reading speed decreases. The solid-state imaging element 200 of a fourth embodiment is different from the first embodiment in that two column signal processing sections are arranged.

Figure 18:
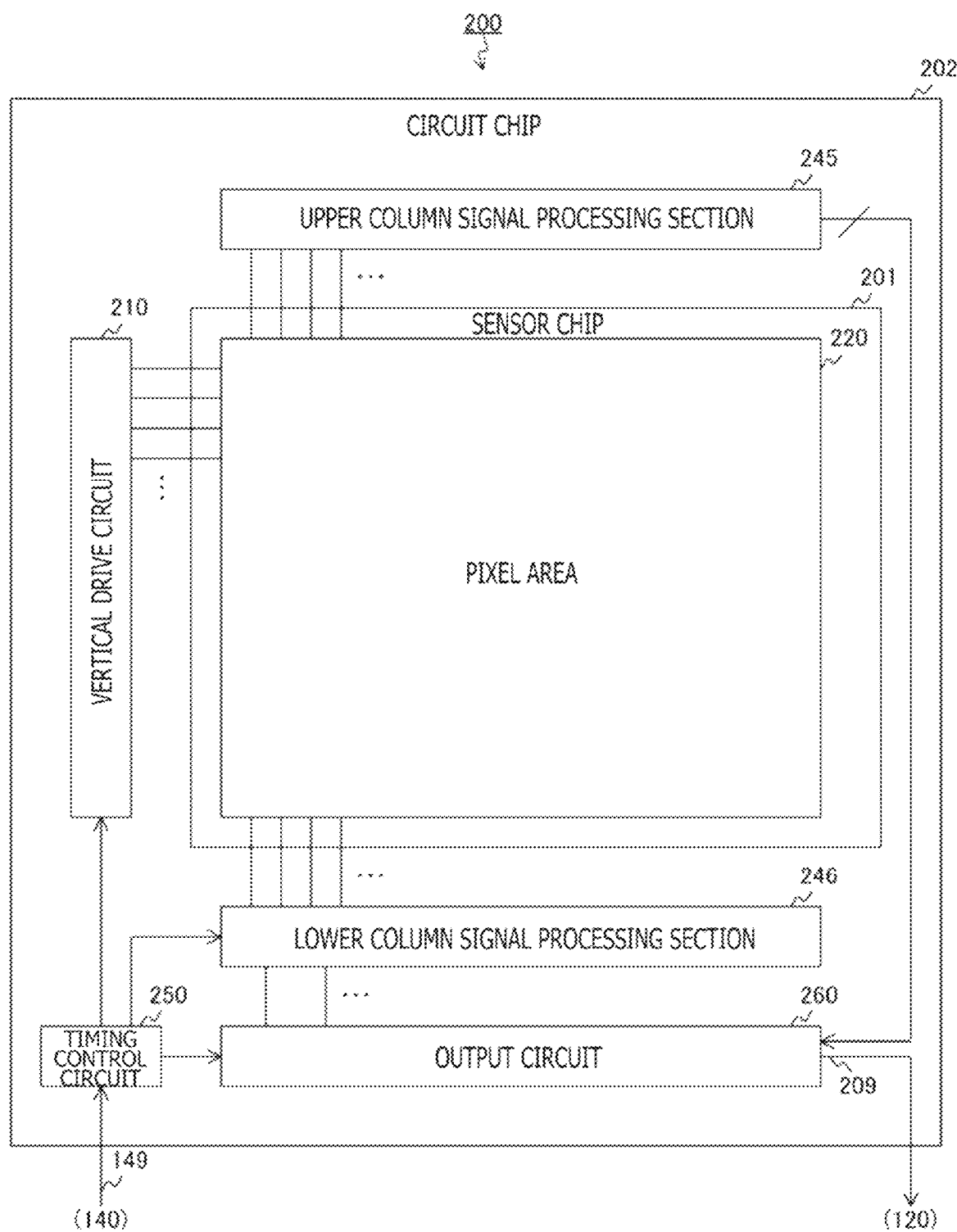
FIG. 18 is a block diagram illustrating a configuration example of the solid-state imaging element according to a fourth embodiment of the present technique.

FIG. 18 is a block diagram illustrating a configuration example of the solid-state imaging element 200 according to a fourth embodiment of the present technique. The solid-state imaging element 200 is different from the first embodiment in that the solid-state imaging element 200 includes an upper column signal processing section 245 and a lower column signal processing section 246 in place of the column signal processing section 240.

Four pixels 230 are arrayed in the vertical direction in the pixel block 221. In addition, the vertical drive circuit 210 drives the pixels 230 to output pixel signals of a (4k)th row and a (4k+1)th row to the upper column signal processing section 245 and output pixel signals of a (4k+2)th row and a (4k+3)th row to the lower column signal processing section 246.

The upper column signal processing section 245 performs AD conversion of the pixel signals of the (4k)th row and the (4k+1)th row, and the lower column signal processing section 246 performs AD conversion of the pixel signals of the (4k+2)th row and the (4k+3)th row.

Note that although the floating diffusion layer 234 and the like are arranged for each pixel 230 in the fourth embodiment, a plurality of pixels may share the floating diffusion layer and the like as in the second embodiment.

In this way, according to the fourth embodiment of the present technique, the upper column signal processing section 245 and the lower column signal processing section 246 perform the AD conversion in parallel, and the reading speed can be doubled compared to the case in which only one of them is provided.

5. Fifth Embodiment

Although the SARADC 300 is arranged for each column in the first embodiment, the number of SARADCs 300 increases with an increase in the number of columns, and the circuit scale of the column signal processing sections 240 may increase. The solid-state imaging element 200 of a fifth embodiment is different from the first embodiment in that the SARADC 300 is arranged for every two columns.

Figure 19:
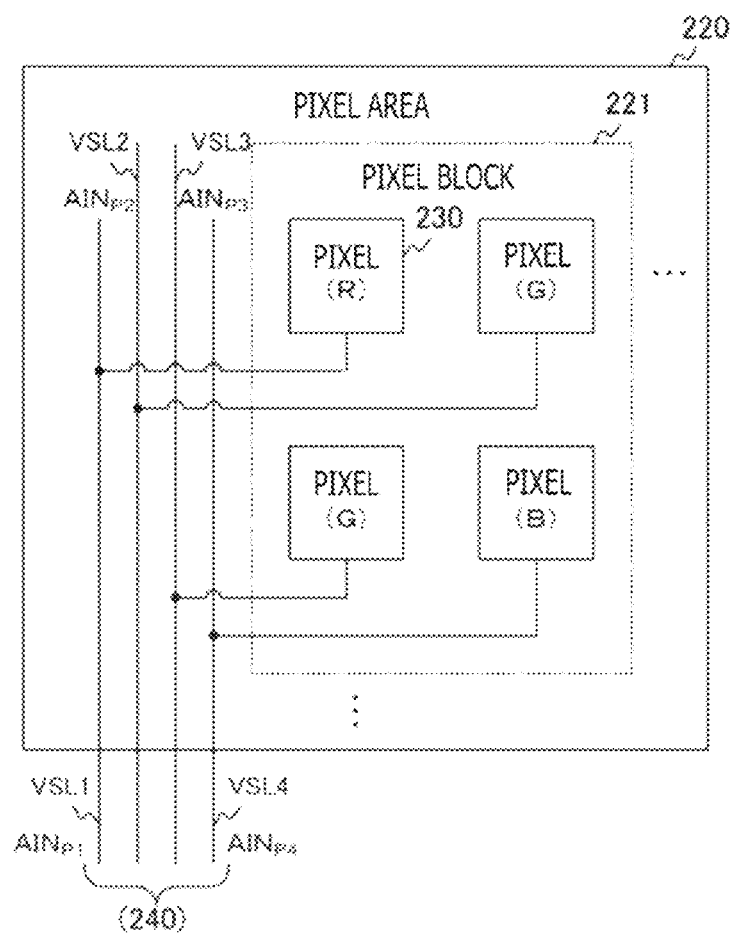
FIG. 19 is an example of a plan view of the pixel area according to a modification of a fifth embodiment of the present technique.

FIG. 19 is an example of a plan view of the pixel area 220 according to a modification of the fifth embodiment of the present technique. In the pixel area 220 of the fifth embodiment, four pixels 230 of two rows×two columns are arrayed for each pixel block 221. In addition, four vertical signal lines VSL1 to VSL4 are wired for every two columns. Assuming that the total number of pixel columns in the pixel area 220 is M, a total of 2×M vertical signal lines are wired. Four pixels in the pixel block 221 are connected to different vertical signal lines.

Note that although four pixels are arrayed in the pixel block 221, and four vertical signal lines are wired for each column of the pixel block 221, the number of vertical signal lines is not limited to four as long as the number of vertical signal lines is two or more. That is, N (N is an integer equal to or greater than 2) pixels can be arrayed in the pixel block 221, and N vertical signal lines can be wired. However, the reasonable values of N are from 2 to 16.

In addition, although the floating diffusion layer 234 and the like are arranged for each pixel 230 in the fifth embodiment, a plurality of pixels may share the floating diffusion layer and the like as in the second embodiment.

Figure 20:
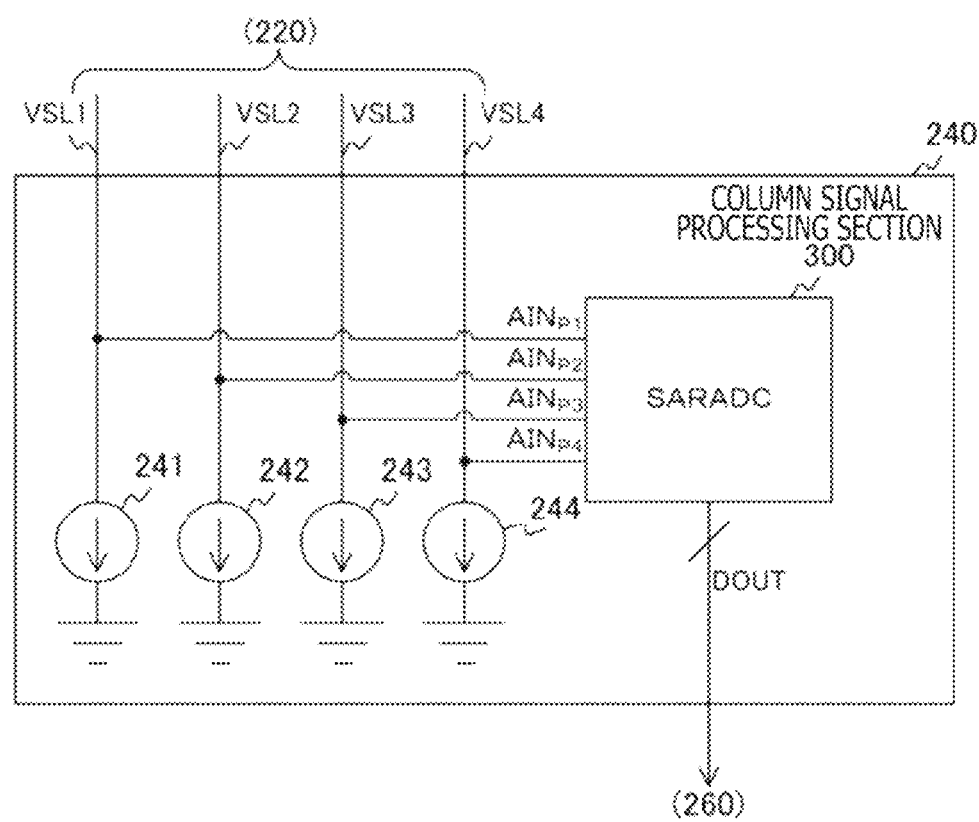
FIG. 20 is a block diagram illustrating a configuration example of the column signal processing section according to the fifth embodiment of the present technique.
Figure 21:
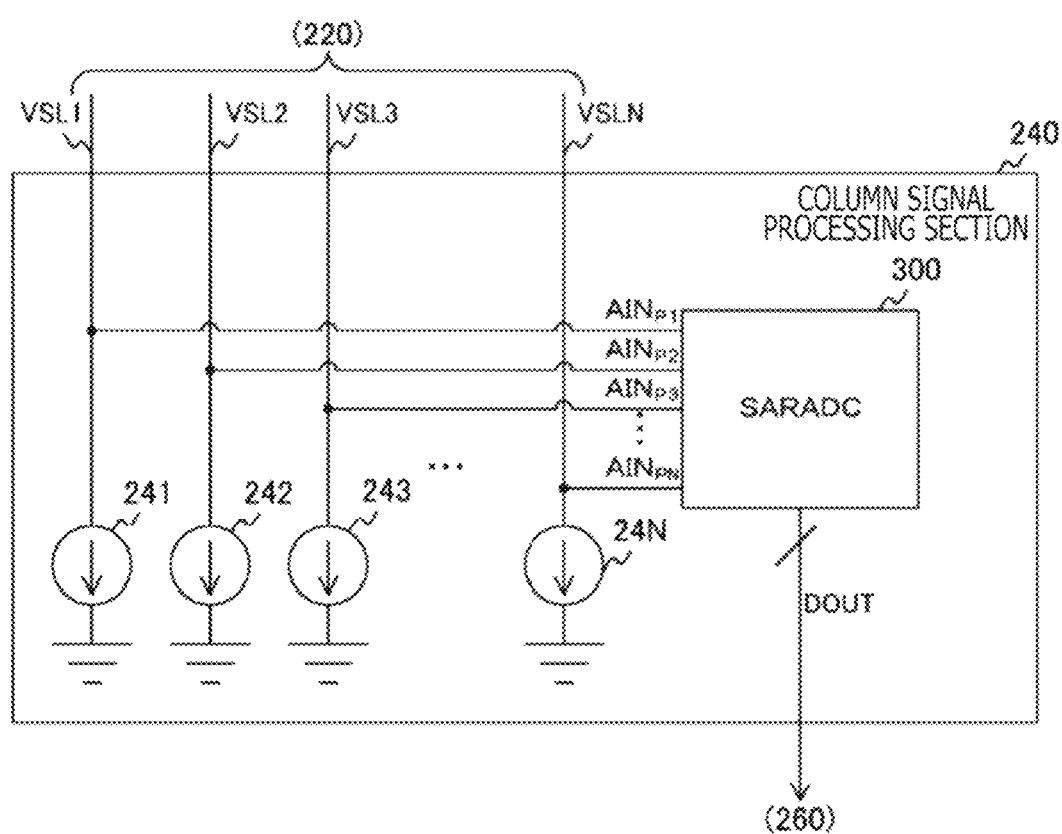
FIG. 21 is a block diagram illustrating a configuration example of the column signal processing section in a case where N vertical signal lines are wired in each SARADC according to the fifth embodiment of the present technique.

FIG. 20 is a block diagram illustrating a configuration example of the column signal processing section 240 according to the fifth embodiment of the present technique. The column signal processing section 240 of the fifth embodiment includes constant current sources 241, 242, 243, and 244 and the SARADC 300 for every two columns. Assuming that the total number of pixel columns in the pixel area 220 is M, a total of M/2 SARADCs 300 are arranged. In the case where the number of vertical signal lines for each SARADC 300 is N, N vertical signal lines are input to the SARADC 300 as illustrated in FIG. 21.

Figure 22:
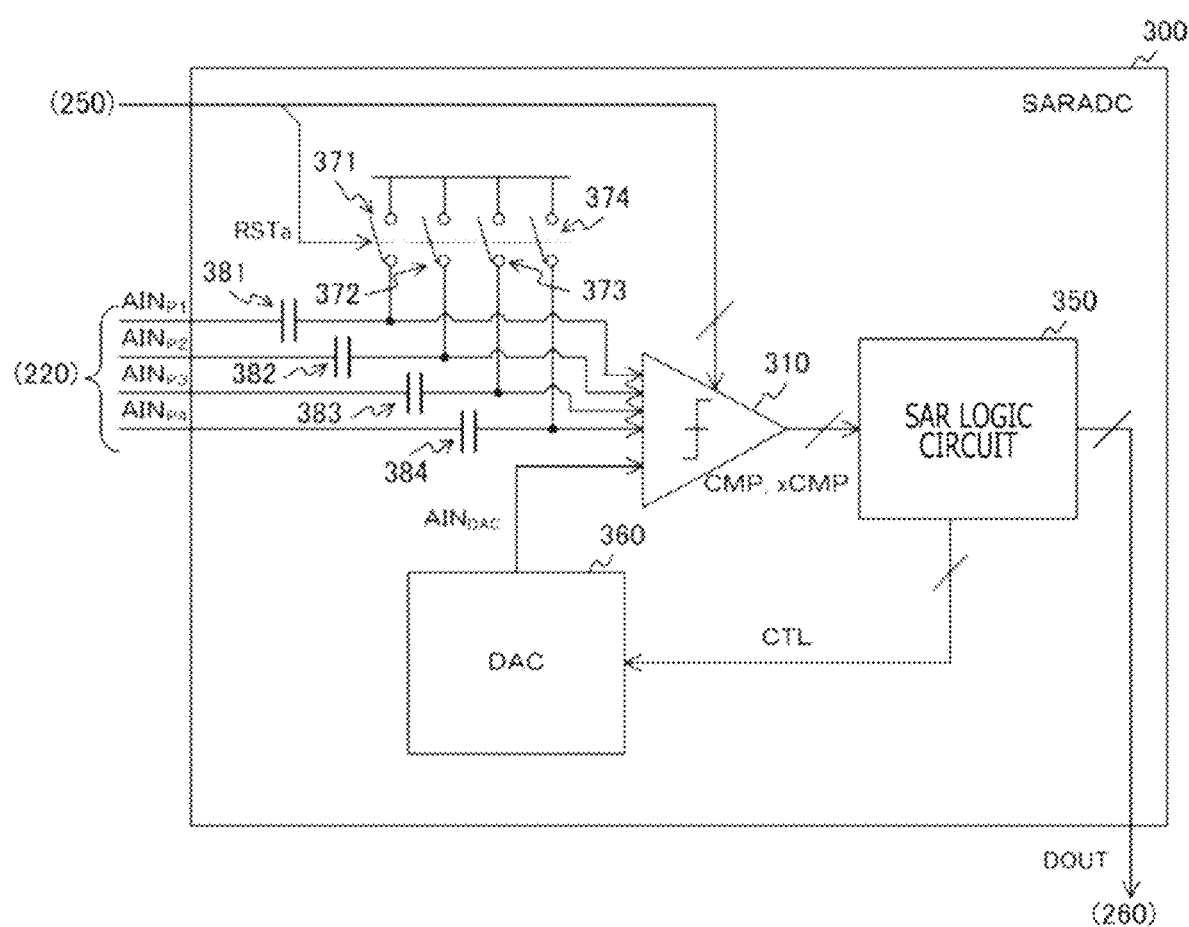
FIG. 22 is a block diagram illustrating a configuration example of the SARADC according to the fifth embodiment of the present technique.

FIG. 22 is a block diagram illustrating a configuration example of the SARADC 300 according to the fifth embodiment of the present technique. The SARADC 300 of the fifth embodiment is different from the first embodiment in that the SARADC 300 further includes capacitors 381, 382, 383, and 384 and reset switches 371, 372, 373, and 274.

The connection configuration of the reset switches 371 and 372 and the capacitors 381 and 382 is similar to the connection configuration in the third embodiment.

One end of the capacitor 383 is connected to the vertical signal line VSL3, and the other end is connected to the input terminal of the comparator 310. One end of the capacitor 384 is connected to the vertical signal line VSL4, and the other end is connected to the input terminal of the comparator 310.

The reset switch 373 is configured to open and close the route between the terminal on the comparator 310 side of the capacitor 383 and the fixed potential according to the reset signal RSTa from the timing control circuit 250. The reset switch 374 is configured to open and close the route between the terminal on the comparator 310 side of the capacitor 384 and the fixed potential according to the reset signal RSTa.

In addition, a circuit similar to the circuit including the selection switch 314, the pixel-side transistor 315, and the short-circuit switch 316 is further added for each of the vertical signal lines VSL3 and VSL4 in the comparator 310.

Figure 23:
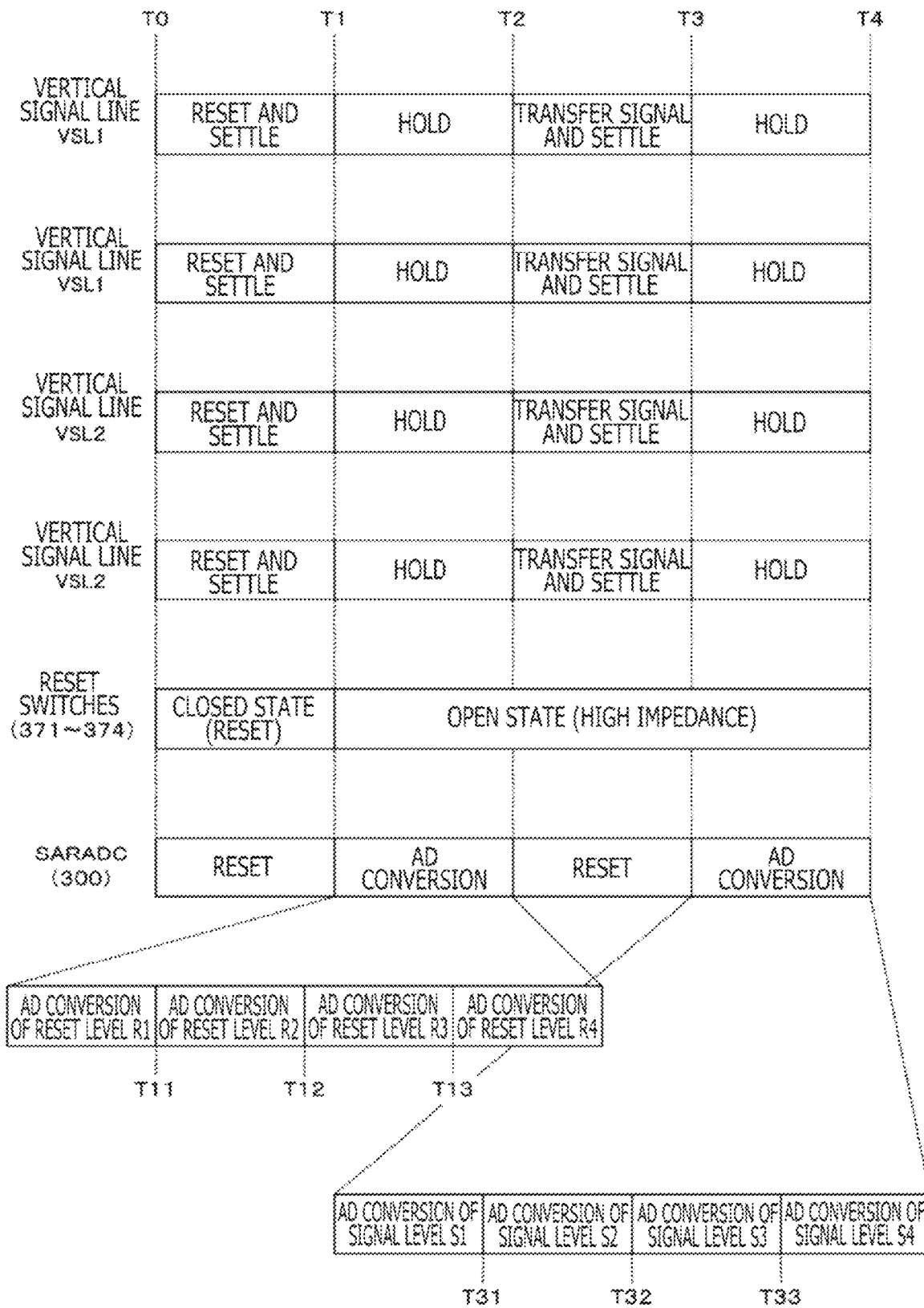
FIG. 23 is a timing chart illustrating an example of operation of the solid-state imaging element according to the fifth embodiment of the present technique.

FIG. 23 is a timing chart illustrating an example of operation of the solid-state imaging element 200 according to the fifth embodiment of the present technique. At timing T0, the timing control circuit 250 uses the reset signal RSTp to drive the pixel block 221 to output reset levels R1 to R4 at the same time. The timing control circuit 250 also initializes the SARADC 300.

At timing T1 after the settling time, the timing control circuit 250 uses the selection signal to control the SARADC 300 to start the AD conversion of the reset level R1. At timing T11 of the completion of the AD conversion of the reset level R1, the timing control circuit 250 starts the AD conversion of the reset level R2. The timing control circuit 250 then starts the AD conversion of the reset level R3 at timing T12 of the completion of the AD conversion of the reset level R2 and starts the AD conversion of the reset level R4 at timing T13 of the completion of the AD conversion of the reset level R3.

At timing T2 of the completion of the AD conversion, the vertical drive circuit 210 uses the transfer signal TRG to drive the pixel block 221 to output signal levels S1 to S4 at the same time. The timing control circuit 250 also initializes the SARADC 300.

At timing T3 after the settling time, the timing control circuit 250 uses the selection signal to control the SARADC 300 to start the AD conversion of the signal level S1. At timing T31 of the completion of the AD conversion of the signal level S1, the timing control circuit 250 starts the AD conversion of the signal level S2. The timing control circuit 250 then starts the AD conversion of the signal level S3 at timing T32 of the completion of the AD conversion of the signal level S2 and starts the AD conversion of the signal level S4 at timing T33 of the completion of the AD conversion of the signal level S3. Note that the control timing of the reset switches 371 to 374 is similar to the control timing in the third embodiment.

Here, there can be a method in which the solid-state imaging element executes a pipeline process of applying AD conversion to the pixel signal of the (2k+1)th row in parallel with the reset (or charge transfer) of the (2k)th row. However, in the pipeline process, the reading speed can be increased only to twice the speed in the case without the execution of the pipeline process. This is because the drive speed of the vertical signal line is slower than the AD conversion speed, and the drive speed is limited by the settling time. Therefore, the speed of the pipeline process cannot be increased.

On the other hand, the pipeline process is not executed in the solid-state imaging element 200, and a plurality of pixels are reset at the same time. The pixels are successively selected after the timing T1 after the settlement, and the AD conversion is performed. Therefore, the reading speed is not limited by the settling time, and the reading speed can be more than doubled.

In this way, according to the fifth embodiment of the present technique, the SARADC 300 is arranged for every two columns, and the number of SARADCs 300 can be reduced compared to the case in which the SARADC 300 is arranged for each column. This can reduce the circuit scale, the installation area, and the power consumption of the column signal processing section 240.

6. Sixth Embodiment

Although the SARADC 300 is arranged for each column in the first embodiment, the number of SARADCs 300 increases with an increase in the number of columns, and the circuit scale of the column signal processing section 240 may increase. The solid-state imaging element 200 of a sixth embodiment is different from the first embodiment in that a multiplexer is arranged in the previous stage of the SARADC 300.

Figure 24:
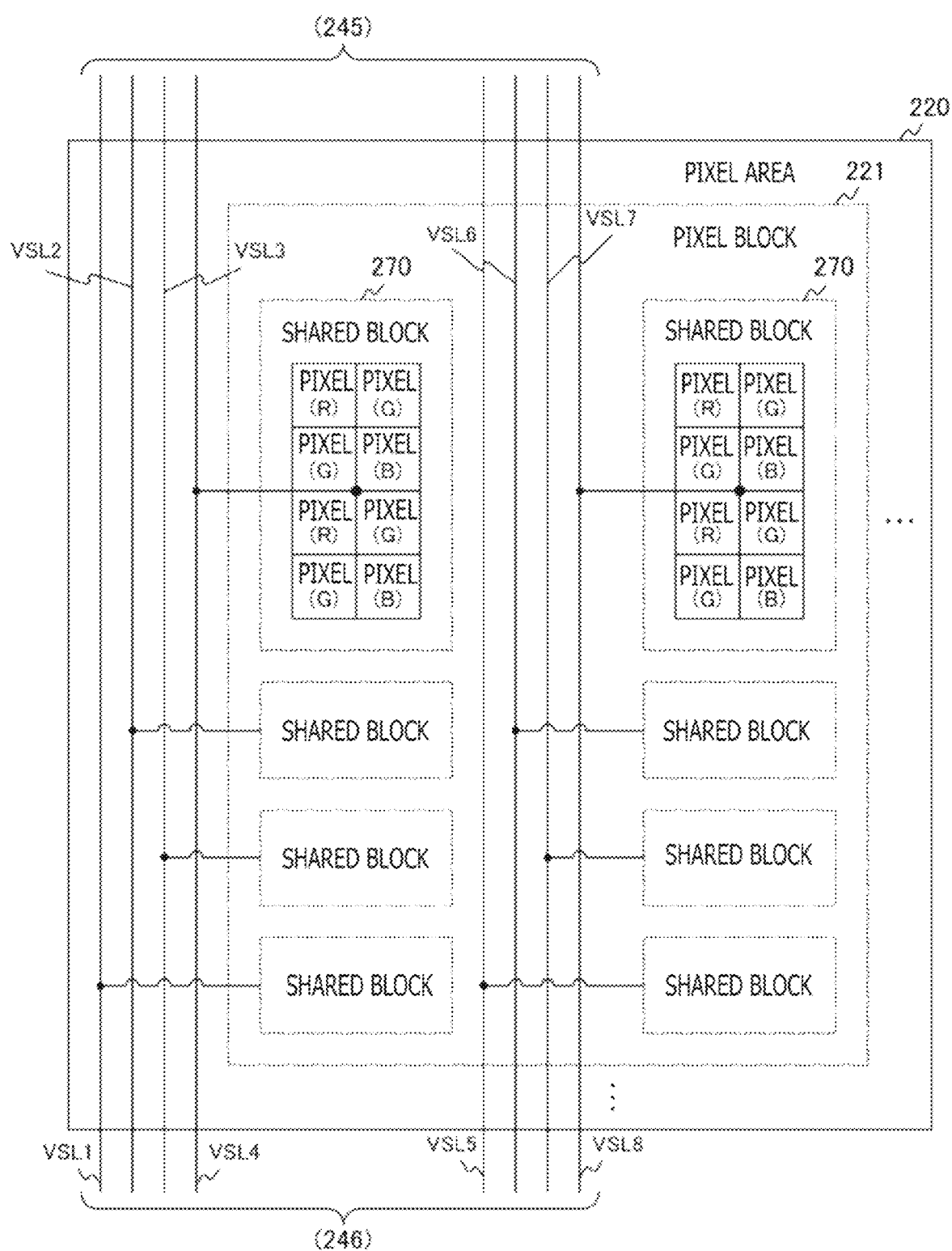
FIG. 24 is an example of a plan view of the pixel area according to a sixth embodiment of the present technique.

FIG. 24 is an example of a plan view of the pixel area 220 according to the sixth embodiment of the present technique. In the pixel area 220 of the sixth embodiment, eight shared blocks 270 of four rows×two columns are arrayed in each pixel block 221. The configuration of each shared block 270 is similar to the configuration in the second embodiment. In addition, eight vertical signal lines VSL1 to VSL8 are wired for every two columns of shared blocks 270 (in other words, four columns of pixels). Assuming that the total number of pixel columns in the pixel area 220 is M, a total of 2×M vertical signal lines are wired. The shared blocks 270 in the pixel block 221 are connected to different vertical signal lines.

In addition, the upper column signal processing section 245 and the lower column signal processing section 246 are arranged on the solid-state imaging element 200 as in the fourth embodiment.

The vertical drive circuit 210 drives the pixel block 221 to cause each shared block 270 to output one pixel signal. There are eight shared blocks 270, and therefore, eight pixel signals are output at the same time. The upper column signal processing section 245 applies AD conversion to four of the eight pixel signals, and the lower column signal processing section 246 applies AD conversion to the remaining four pixel signals. For example, the upper column signal processing section 245 applies AD conversion to the pixel signals of two R pixels and the pixel signals of two B pixels, and the lower column signal processing section 246 applies AD conversion to the pixel signals of four G pixels.

Note that the number of shared blocks 270 in the pixel block 221 is not limited to eight, and the number of pixels in the shared blocks 270 is also not limited to eight.

Figure 25:
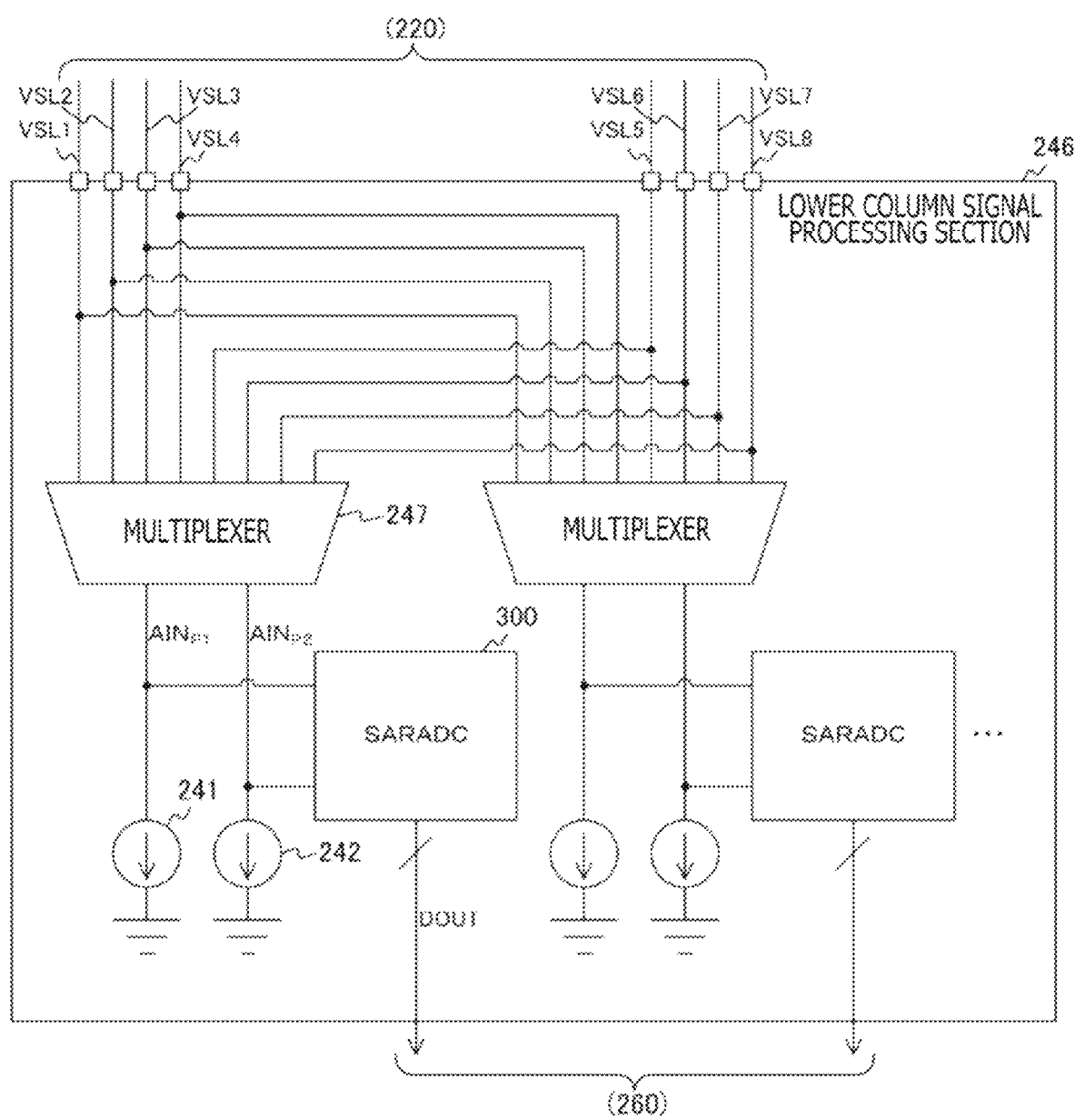
FIG. 25 is a block diagram illustrating a configuration example of a lower column signal processing section according to the sixth embodiment of the present technique.

FIG. 25 is a block diagram illustrating a configuration example of the lower column signal processing section 246 according to the sixth embodiment of the present technique. The lower column signal processing section 246 includes two multiplexers 247, two SARADCs 300, two constant current sources 241, and two constant current sources 242 for each column of pixel block 221 (in other words, four columns of pixels). Assuming that the total number of pixel columns in the pixel area 220 is M columns, a total of M/2 multiplexers 247 and M/2 SARADCs 300 are arranged. The configuration of the upper column signal processing section 245 is similar to the configuration of the lower column signal processing section 246.

The multiplexer 247 is configured to select two of the vertical signal lines VSL1 to VSL8 according to the selection signal from the timing control circuit 250. The multiplexer 247 outputs pixel signals from the two selected liens to the SARADC 300.

The timing control circuit 250 causes the first multiplexer 247 to select the vertical signal lines for transmitting two of the four pixel signals processed by the lower column signal processing section 246 and causes the second multiplexer 247 to select the rest of the vertical signal lines. Note that the multiplexer 247 is an example of the selection section outside of comparator described in the claims.

In addition, the vertical signal lines VSL1 to VSL8 are branched in the circuit chip 202 and input to two multiplexers 247. Rectangular marks in FIG. 23 indicate terminals at the boundary of the chip. Note that the boundary of the chip is not limited to the configuration. For example, the input terminals of the multiplexers 247 may be the boundary of the chip, or the output terminals of the multiplexers 247 may be the boundary of the chip.

In this way, according to the sixth embodiment of the present technique, the multiplexer 247 selects two of the eight pixel signals, and the SARADC 300 successively compares the pixel signals. Therefore, the SARADC 300 can be arranged for every two columns. This can reduce the circuit scale, the installation area, and the power consumption of the column signal processing section 240.

7. Seventh Embodiment

In the first embodiment, the same SARADC 300 performs the AD conversion of the pixels lined up in the vertical direction, and vertical stripes may be generated in the image data caused by variations in linearity. The SARADC 300 of a seventh embodiment is different from the first embodiment in that the SARADC 300 randomly changes the combination of capacitors in the DAC 360 and performs control to suppress the vertical stripes.

Figure 26:
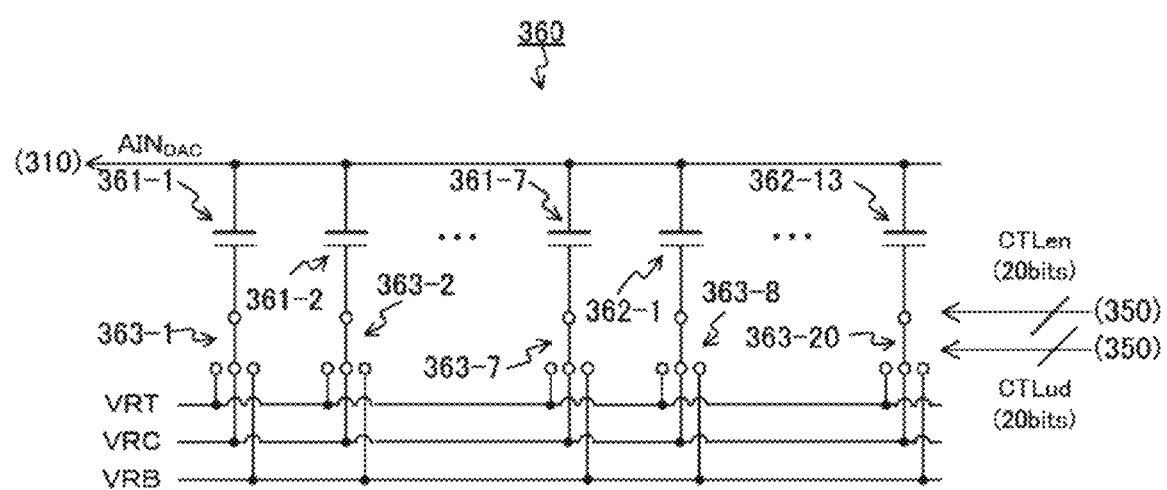
FIG. 26 is a block diagram illustrating a configuration example of a DAC according to a seventh embodiment of the present technique.

FIG. 26 is a block diagram illustrating a configuration example of the DAC 360 according to the seventh embodiment of the present technique. The DAC 360 includes capacitors 361-1 to 361-7, capacitors 362-1 to 362-13, and potential control switches 363-1 to 363-20. One ends of the capacitors 361-1 to 361-7 and the capacitors 362-1 to 362-13 are individually connected to the same input terminal of the comparator 310, and the signal of the potential is supplied as the reference signal $AIN_{DAC}$.

The capacitors 361-1 to 361-7 are capacitors used for generating predetermined upper bits (for example, upper 3 bits) of the digital signal DOUT, and the combination is randomly changed every time the row of the pixel block 221 is selected. For example, all of the values of the capacitors are the same, and assuming that a predetermined unit capacitance value is C, the values are set to 16C.

The capacitors 362-1 to 362-13 are capacitors used for generating predetermined lower bits (for example, from fifth bit to LSB) of the digital signal DOUT. For example, various capacitance values, such as 8C, 4C, 2C, 1C, and 0.5C, are set.

The potential control switches 363-1 to 363-20 are configured to change the potential of one of both ends of respective capacitors 361-1 to 361-7 and capacitors 362-1 to 362-13 on the side not connected to the comparator 310. Different capacitors are associated with the potential control switches 363-1 to 363-20, and each of the switches of the capacitors connects one end of the corresponding capacitor to one of different potentials VRC, VRT, and VRB. For example, the potential VRC is a potential with an initial value, and all of the capacitors are connected to the potential VRC in the initial state. The potential VRT is a potential higher than the potential VRC (such as twice the VRC), and the potential VRB is a potential lower than the potential VRC (such as an earth potential).

In addition, control signals CTLen and CTLud from the SAR logic circuit 350 are input to the potential control switches 363-1 to 363-20, and each switch switches the destination according to the control signal of the switch.

The control signal CTLen is a signal indicating whether the potential of one end of each capacitor is to be connected to the VRC. For example, in the case with 20 capacitors, the data size of the control signal CTLen is 20 bits.

The control signal CTLud is a signal indicating whether the potential of one end of each capacitor is to be connected to the potential VRT or VRB. For example, in the case with 20 capacitors, the data size of the control signal CTLud is 20 bits.

Figure 27:
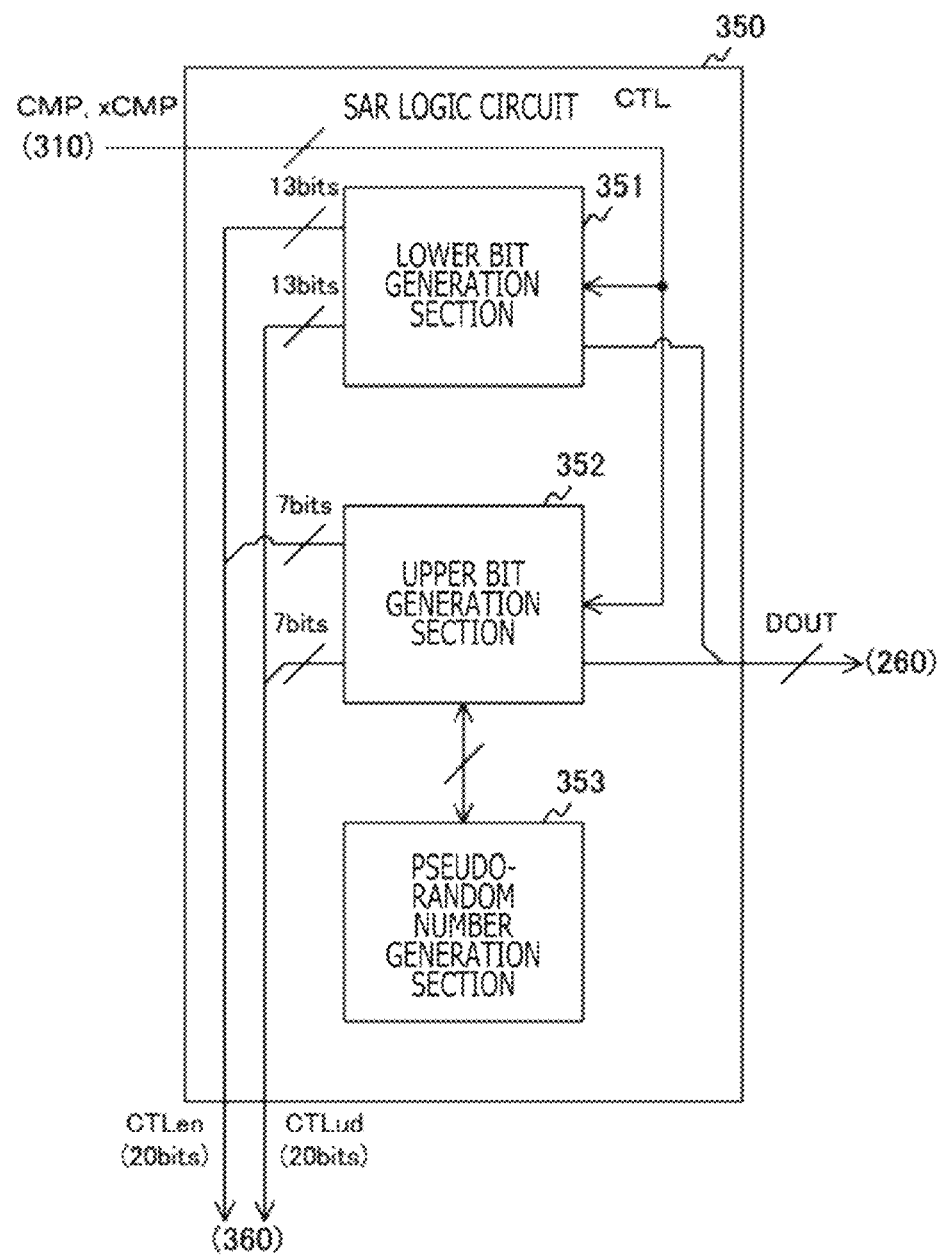
FIG. 27 is a block diagram illustrating a configuration example of an SAR logic circuit according to the seventh embodiment of the present technique.

FIG. 27 is a block diagram illustrating a configuration example of the SAR logic circuit 350 according to the seventh embodiment of the present technique. The SAR logic circuit 350 includes a lower bit generation section 351, an upper bit generation section 352, and a pseudo-random number generation section 353.

The lower bit generation section 351 is configured to generate lower bits corresponding to the capacitors 362-1 to 362-13 on the basis of successive comparison and control. Here, the order of capacitors designated by the control signal CTLen and the control signal CTLud is fixed in generating the lower bits. For example, the capacitor 362-1 is designated in generating the successive comparison fifth bit, and the capacitor 362-2 is designated in generating the next sixth bit.

The upper bit generation section 352 is configured to generate upper bits corresponding to the capacitors 361-1 to 361-7 on the basis of successive comparison and control. In generating the upper bits, the combination of the capacitors designated by the control signal CTLen and the control signal CTLud is changed every time the row of pixels is selected.

The pseudo-random number generation section 353 is configured to generate pseudo-random numbers according to the control of the upper bit generation section 352.

The lower bit generation section 351 and the upper bit generation section 352 generate the control signals CTLen and CTLud on the basis of the comparison result of the comparator 310, supply the control signals CTLen and CTLud to the DAC 360, and generate and output the digital signal DOUT.

In generating the reference signal $AIN_{DAC}$ of, for example, the successive comparison second bit in the successive comparison and control, the upper bit generation section 352 causes the pseudo-random number generation section 353 to generate pseudo-random numbers of 7 bits, in which 4 bits are set to a logical value "1," and the rest are set to a logical value "0." The upper bit generation section 352 then supplies the control signal CTLen and the control signal CTLud corresponding to the 4 bits to the DAC 360.

Then, in generating the reference signal $AIN_{DAC}$ of the successive comparison third bit, the upper bit generation section 352 causes the pseudo-random number generation section 353 to generate pseudo-random numbers of 7 bits, in which 2 bits of the 3 bits excluding the bits set to the logical value "1" in generating the second bit are set to the logical value "1." The upper bit generation section 352 supplies the control signal CTLen and the control signal CTLud corresponding to the 2 bits to the DAC 360.

Subsequently, in generating the reference signal $AIN_{DAC}$ of the successive comparison fourth bit, the upper bit generation section 352 supplies, to the DAC 360, the control signal CTLen and the control signal CTLud corresponding to the remaining 1 bit excluding the bits set to the logical value "1" in generating the successive comparison second bit and in generating the successive comparison third bit.

Figure 28:
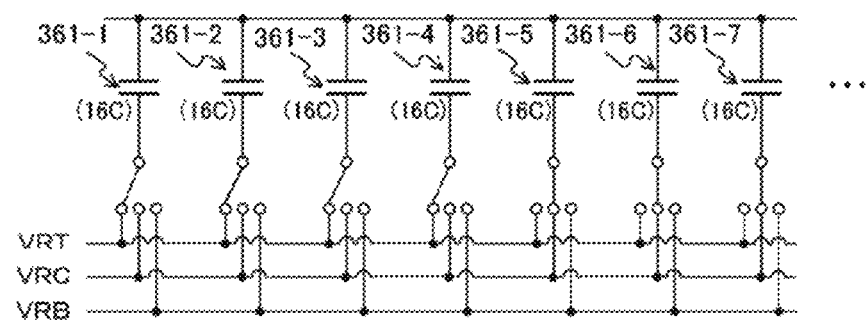
FIG. 28 is a diagram for describing a control example of the DAC up to a successive comparison fourth bit of a first row of pixel signals according to the seventh embodiment of the present technique.
Figure 28:
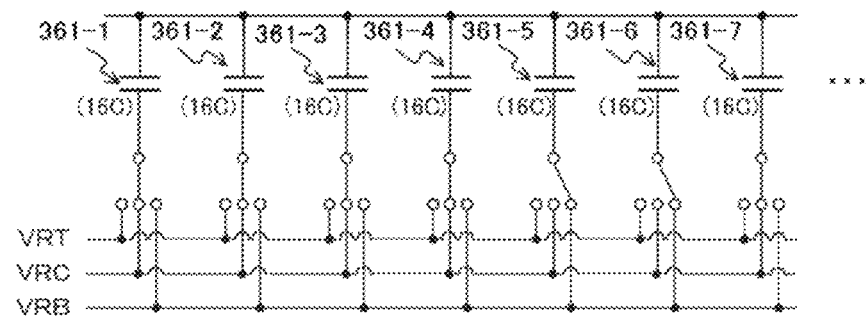
Figure 28:
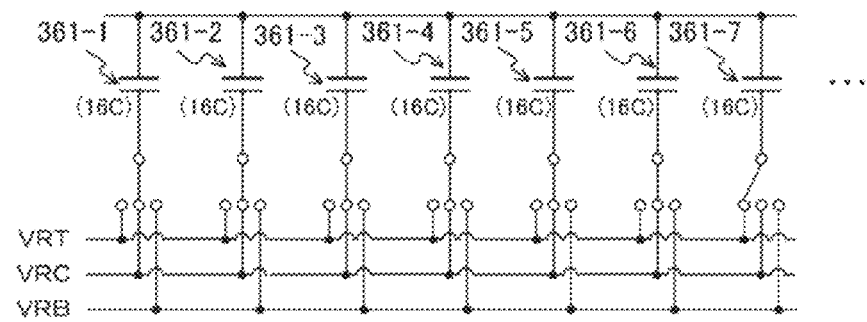

FIG. 28 is a diagram for describing a control example of the DAC 360 up to the successive comparison fourth bit of the first row of the pixel signals according to the seventh embodiment of the present technique. In the figure, a is a diagram illustrating an example of the state of the DAC 360 in generating the second bit. In the figure, b is a diagram illustrating an example of the state of the DAC 360 in generating the third bit, and c is a diagram illustrating an example of the state of the DAC 360 in generating the fourth bit.

First, the upper bit generation section 352 generates the reference signal $AIN_{DAC}$ on the basis of the comparison result of the comparator 310. Then, in generating the reference signal $AIN_{DAC}$ of the successive comparison second bit, the upper bit generation section 352 uses the pseudo-random numbers of 7 bits to randomly select four of the capacitors 361-1 to 361-7. For example, the capacitors 361-1 to 361-4 are selected in a case where pseudo-random numbers "1111000" in binary digits are generated. In a case where the capacitance values are 16C, combined capacitance of 64C is obtained. In addition, on the basis of the comparison result of the comparator 310 of the last time, the upper bit generation section 352 designates one of the potentials VRT and VRB that the capacitors are to be connected. For example, in the case where the comparison result CMP indicates the logical value "1," the capacitors 361-1 to 361-4 are connected to the potential VRT as illustrated in a of the figure to raise the reference signal $AIN_{DAC}$.

Then, in generating the reference signal $AIN_{DAC}$ of the successive comparison third bit, the upper bit generation section 352 uses the pseudo-random numbers of 7 bits to randomly select two of the remaining three capacitors excluding the four capacitors already selected. For example, the capacitors 361-5 and 361-6 are selected in a case where pseudo-random numbers "0000110" in binary digits are generated. In the case where the capacitance values are 16C, combined capacitance of 32C is obtained. In addition, on the basis of the comparison result of the comparator 310 of the last time, the upper bit generation section 352 designates one of the potentials VRT and VRB that the capacitors are to be connected. For example, in a case where the comparison result CMP indicates the logical value "0," the capacitors 361-5 and 361-6 are connected to the potential VRB as illustrated in a of the figure to lower the reference signal $AIN_{DAC}$.

Then, in generating the reference signal $AIN_{DAC}$ of the successive comparison fourth bit, the upper bit generation section 352 selects the remaining one capacitor excluding the six capacitors already selected. For example, the capacitor 361-7 is selected, and the capacitance value is 16C. In addition, on the basis of the comparison result of the comparator 310 of the last time, the upper bit generation section 352 designates one of the potentials VRT and VRB that the capacitor is to be connected. For example, in the case where the comparison result CMP indicates the logical value "1," the capacitor 361-7 is connected to the potential VRT as illustrated in a of the figure to raise the reference signal $AIN_{DAC}$.

Note that although the pseudo-random numbers are generated every time the bit is generated in the example described above, the pseudo-random numbers of the bits up to the successive comparison fourth bit may be generated at once in generating the successive comparison second bit. In this case, a memory for holding the pseudo-random numbers is added in the pseudo-random number generation section 353 or the like, and the SAR logic circuit 350 reads the pseudo-random numbers from the memory to change the combination of the capacitors.

For the fifth and subsequent bits, the lower bit generation section 351 selects the capacitors in a fixed order.

Figure 29:
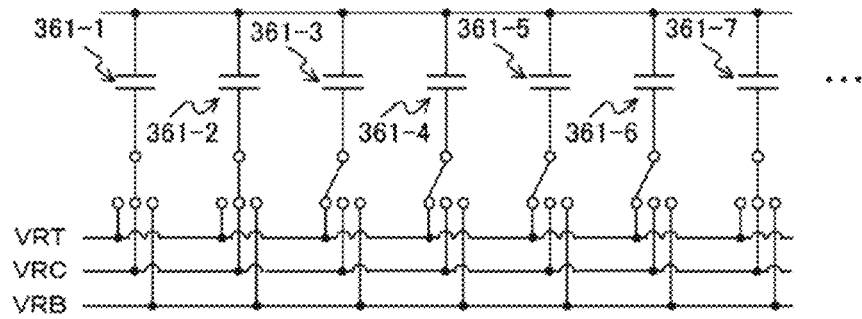
FIG. 29 is a diagram for describing a control example of the DAC up to a successive comparison fourth bit of a second row of the pixel signals according to the seventh embodiment of the present technique.
Figure 29:
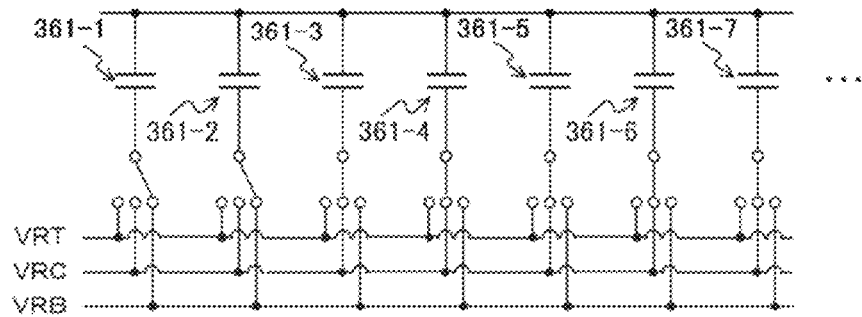
Figure 29:
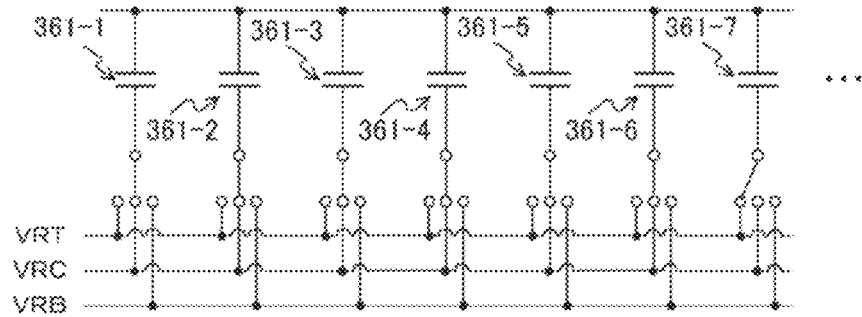

FIG. 29 is a diagram for describing a control example of the DAC 360 up to the successive comparison fourth bit of the second row of the pixel signals according to the seventh embodiment of the present technique. In the figure, a is a diagram illustrating an example of the state of the DAC 360 in generating the second bit. In the figure, b is a diagram illustrating an example of the state of the DAC 360 in generating the third bit, and c is a diagram illustrating an example of the state of the DAC 360 in generating the fourth bit.

In a case where pseudo-random numbers "0011110" in binary digits are generated in generating the successive comparison second bit, the capacitors 361-3 to 361-6 are selected as illustrated in a of the figure. In a case where pseudo-random numbers "1100000" in binary digits are generated in generating the third bit, the capacitors 361-1 and 361-2 are selected as illustrated in b of the figure. In generating the fourth bit, the remaining capacitor 361-7 is selected as illustrated in c of the figure.

Figure 30:
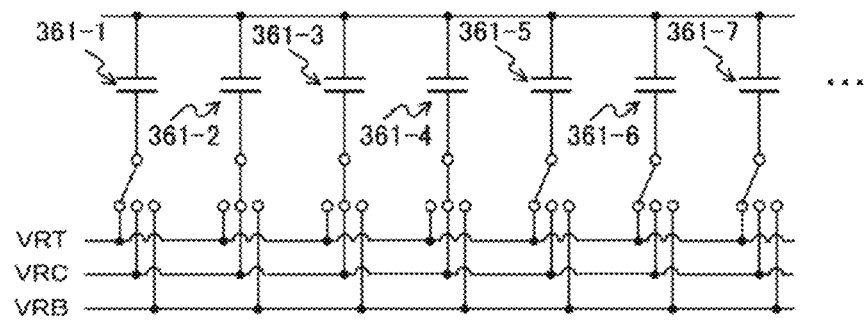
FIG. 30 is a diagram for describing a control example of the DAC up to a successive comparison fourth bit of a third row of the pixel signals according to the seventh embodiment of the present technique.
Figure 30:
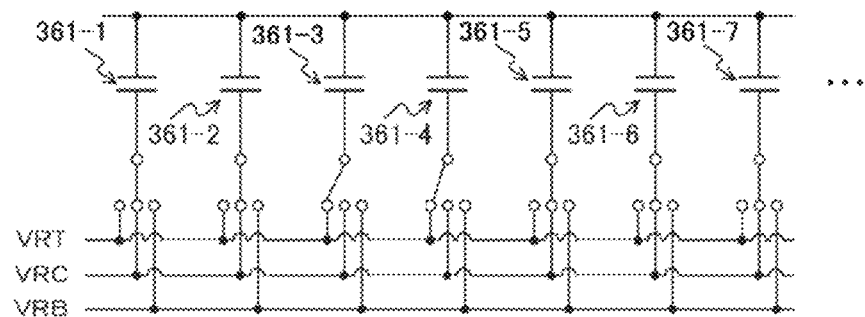
Figure 30:
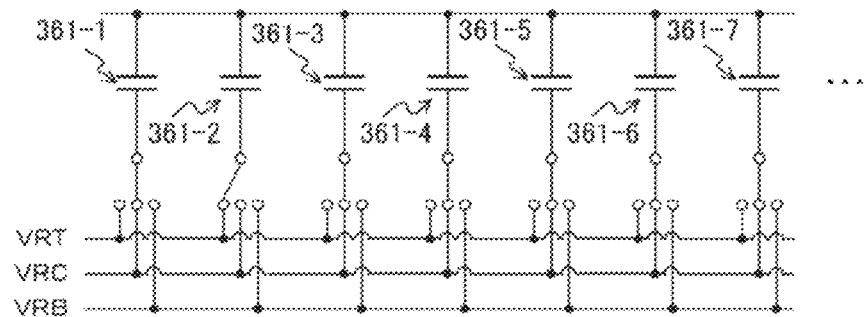

FIG. 30 is a diagram for describing a control example of the DAC 360 up to the successive comparison fourth bit of the third row of the pixel signals according to the seventh embodiment of the present technique. In the figure, a is a diagram illustrating an example of the state of the DAC 360 in generating the second bit. In the figure, b is a diagram illustrating an example of the state of the DAC 360 in generating the third bit, and c is a diagram illustrating an example of the state of the DAC 360 in generating the fourth bit.

In a case where pseudo-random numbers "1000111" in binary digits are generated in generating the successive comparison second bit, the capacitor 361-1 and the capacitors 361-5 to 361-7 are selected as illustrated in a of the figure. In a case where pseudo-random numbers of "0011000" in binary digits are generated in generating the third bit, the capacitors 361-3 and 361-4 are selected as illustrated in b of the figure. In generating the fourth bit, the remaining capacitor 361-2 is selected as illustrated in c of the figure.

Similarly, in the fourth and subsequent rows of the pixel signals, the combination of the capacitors 361-1 to 361-7 is randomly changed every time the row is selected.

If the same SARADC 300 performs the AD conversion of the pixels lined up in the vertical direction, the variations in linearity may generate vertical stripes in the image data in the first embodiment in which the combination of the capacitors is not changed. On the other hand, the SAR logic circuit 350 randomly changes the combination of the capacitors for each row in the seventh embodiment, and the fixed error pattern of the SARADC 300 can be changed. The change of the error pattern in each row can scatter the error pattern in the image data, and the generation of the vertical stripes can be suppressed.

Note that although the number of capacitors in the DAC 360 is twenty, the number of capacitors is not limited to twenty as long as the number of capacitors is two or more. In addition, although the combination of seven of the twenty capacitors corresponding to the upper 4 bits is randomly changed, the number of capacitors in the random change of combination is not limited to seven. For example, the combination of all the capacitors may be randomly changed. In addition, although the combination of capacitors is randomly changed for the upper 4 bits, the bit strings in changing the combination is not limited to the upper 4 bits. For example, the combination of the capacitors may be randomly changed for the upper 2 bits or the upper 3 bits.

In addition, although the pseudo-random number generation section 353 is arranged inside of the SAR logic circuit 350, the pseudo-random number generation section 353 can be arranged outside of the SAR logic circuit 350.

In addition, although the reference signal $AIN_{DAC}$ is a single-ended signal, the reference signal $AIN_{DAC}$ may be a differential signal. In that case, a plurality of capacitors and potential control switches are arranged on the positive side and the negative side each in the DAC 360. The upper bit generation section 352 then randomly changes the combination of the positive capacitors and the combination of the negative capacitors every time the row is selected.

In this way, according to the seventh embodiment of the present technique, the SAR logic circuit 350 selects the capacitors on the basis of the pseudo-random numbers, and the combination of the capacitors can be randomly changed for each row. As a result, the error pattern of the SARADC 300 can be changed for each row to suppress the vertical stripes, and the image quality can be improved.

8. Eighth Embodiment

Although the comparator 310 switches the vertical signal lines VSL1 and VSL2 in the first embodiment, the potential of the destination vertical signal line may significantly fluctuate upon the switch. Then, the fluctuation may generate black level fluctuation or streaking of pixel-side transistors. The comparator 310 of an eighth embodiment is different from the first embodiment in that the comparator 310 supplies intermediate potential to the source and the drain of the destination transistor to suppress the potential fluctuation upon the switch.

Figure 31:
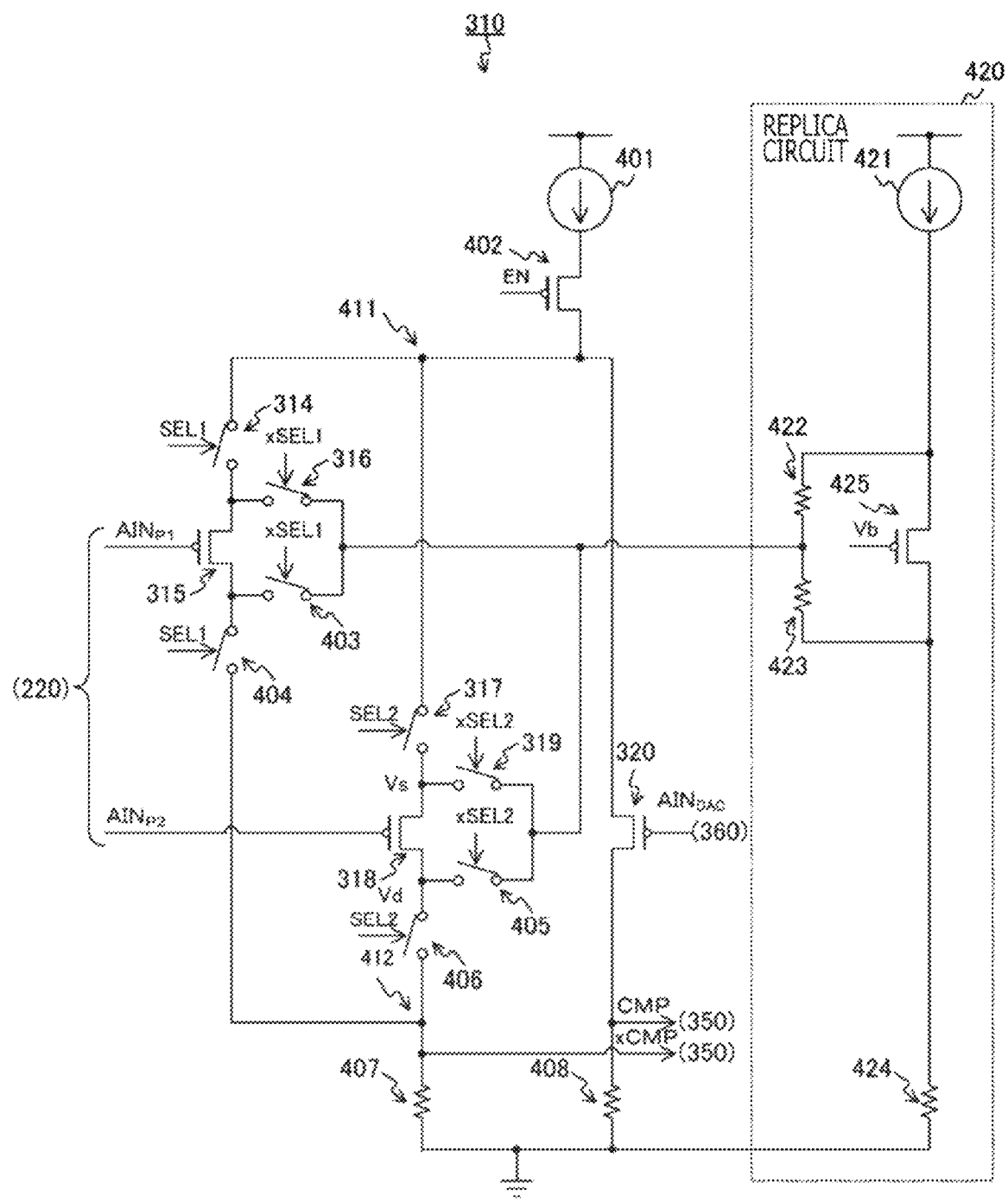
FIG. 31 is a block diagram illustrating a configuration example of the comparator according to an eighth embodiment of the present technique.

FIG. 31 is a block diagram illustrating a configuration example of the comparator 310 according to the eighth embodiment of the present technique. The comparator 310 of the eighth embodiment includes a current source 401, an enabling control transistor 402, the pixel-side transistors 315 to 318, the reference-side transistor 320, and a replica circuit 420. In addition, the comparator 310 includes selection switches 314, 317, 404, and 406, short-circuit switches 316, 319, 403, and 405, and fixed resistors 407 and 408. The replica circuit 420 includes a current source 421, fixed resistors 422 to 424, and a transistor 425 in replica circuit. For example, nMOS transistors are used as the enabling control transistor 402 and the transistor 425 in replica circuit. In addition, pMOS transistors are used as the pixel-side transistor 315 and other transistors in the eighth embodiment.

The current source 401 and the enabling control transistor 402 are connected in series between a power source terminal and a drain node 411. In addition, the enabling signal EN is input to the gate of the enabling control transistor 402.

The pixel-side transistors 315 and 318 are connected in parallel between the source node 411 and a drain node 412. In addition, the pixel signal $AIN_{P1}$ from the vertical signal line VSL1 is input to the gate of the pixel-side transistor 315, and the pixel signal $AIN_{P2}$ from the vertical signal line VSL1 is input to the gate of the pixel-side transistor 318. The fixed resistor 407 is inserted between the drain node 412 and the earth terminal (also referred to as "ground"). The negative signal xCMP is output from the drain node 412.

The reference signal $AIN_{DAC}$ is input to the gate of the reference-side transistor 320. The source is connected to the source node 411, and the drain is connected to the fixed resistor 408. The other end of the fixed resistor 408 is connected to the earth terminal. The positive signal CMP is output from the connection point of the reference-side transistor 320 and the fixed resistor 408.

The selection switch 314 is configured to open and close the route between the source of the pixel-side transistor 315 and the source node 411 according to the selection signal SEL1. The selection switch 404 is configured to open and close the route between the drain of the pixel-side transistor 315 and the drain node 412 according to the selection signal SEL1.

The short-circuit switch 316 is configured to open and close the route between the source of the pixel-side transistor 315 and the connection point of the fixed resistors 422 and 423 according to the selection signal xSEL1. The short-circuit switch 403 is configured to open and close the route between the drain of the pixel-side transistor 315 and the connection point of the fixed resistors 422 and 423 according to the selection signal xSEL1.

The selection switch 317 is configured to open and close the route between the source of the pixel-side transistor 318 and the source node 411 according to the selection signal SEL2. The selection switch 406 is configured to open and close the route between the drain of the pixel-side transistor 318 and the drain node 412 according to the selection signal SEL2.

The short-circuit switch 319 is configured to open and close the route between the source of the pixel-side transistor 318 and the connection point of the fixed resistors 422 and 423 according to the selection signal xSEL2. The short-circuit switch 405 is configured to open and close the route between the drain of the pixel-side transistor 318 and the connection point of the fixed resistors 422 and 423 according to the selection signal xSEL2.

In addition, the current source 421, the transistor 425 in replica circuit, and the fixed resistor 424 are connected in series between the power source terminal and the earth terminal in the replica circuit 420. In addition, the fixed resistors 422 and 423 are connected in series between the drain and the source of the transistor 425 in replica circuit. A predetermined bias voltage Vb is supplied to the gate of the transistor 425 in replica circuit.

On the basis of the configuration, the replica circuit 420 generates intermediate potential between the source node 411 and the drain node 412. The selection switch 314 and the like then connect the source and the drain of the pixel-side transistor selected by the selection signal to the source node 411 and the drain node 412. Here, when the selection switch 314 and the like connect the destination pixel-side transistor in order to switch $AIN_{P1}$ to $AIN_{P2}$, the potential of the drain and the source of the transistor fluctuates. In the first embodiment, the potential fluctuation of the drain is kicked back to the destination vertical signal line. The kickback may cause an error in the output of the comparator 310, and black level fluctuation or streaking may occur.

Therefore, in the eighth embodiment, the short-circuit switch 316 and the like connect the source and the drain of the destination pixel-side transistor to the replica circuit 420 before the switch and supply the intermediate potential to them. As a result, when a source voltage Vs of the pixel-side transistor fluctuates upon the switch, a drain voltage Vd of the transistor also fluctuates. The waveform of the drain voltage Vd is in the opposite phase of the source voltage Vs. Therefore, the voltages can cancel each other to suppress the amount of kickback.

Note that a circuit including the short-circuit switches 316, 319, 403, and 405 is an example of the control section in comparator described in the claims.

In addition, although two vertical signal lines VSL are switched, three or more vertical signal lines may be switched. In that case, selection switches and short-circuit switches can be added according to the number of vertical signal lines.

Figure 32:
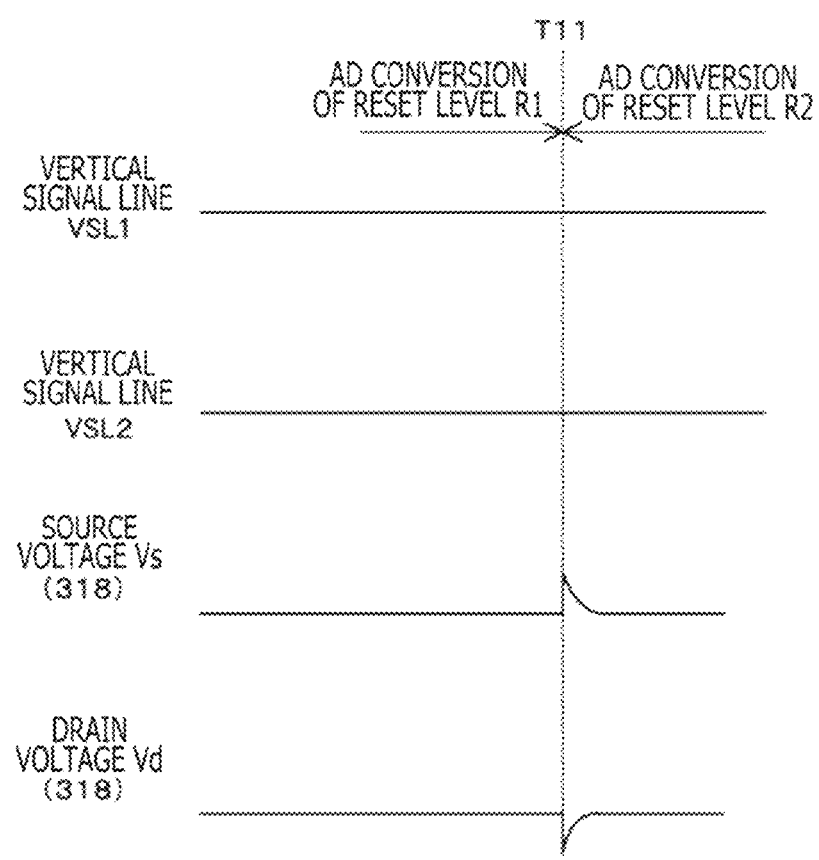
FIG. 32 is a timing chart illustrating an example of potential fluctuation according to the eighth embodiment of the present technique.

FIG. 32 is a timing chart illustrating an example of the potential fluctuation according to the eighth embodiment of the present technique. In the case considered here, the vertical signal line VSL1 is switched to the vertical signal line VSL2, and AD conversion is sequentially applied to the reset levels R1 and R2 at timing T11. The drain voltage Vd of the pixel transistor 318 fluctuates upon the switch from the vertical signal line VSL1 to the vertical signal line VSL2. On the other hand, the source voltage Vs also fluctuates, and the waveform of the source voltage Vs is in the opposite phase of the drain voltage Vd. Therefore, the voltages offset each other, and the amount of kickback is suppressed. This suppresses the fluctuation of the potential of the destination vertical signal line VSL2.

In this way, according to the eighth embodiment of the present technique, the comparator 310 supplies the intermediate potential to the source and the drain of the pixel-side transistor. Therefore, the amount of kickback upon the switch can be reduced to suppress the black level fluctuation and the streaking.

[Modification]

Although the replica circuit 420 is arranged for each SADADC 300 in the first embodiment, the number of replica circuits 420 increases with an increase in the number of SADADCs 300 arranged, and the circuit scale increases. The solid-state imaging element 200 according to a modification of the first embodiment is different from the first embodiment in that a plurality of SARADCs 300 share the replica circuit 420.

Figure 33:
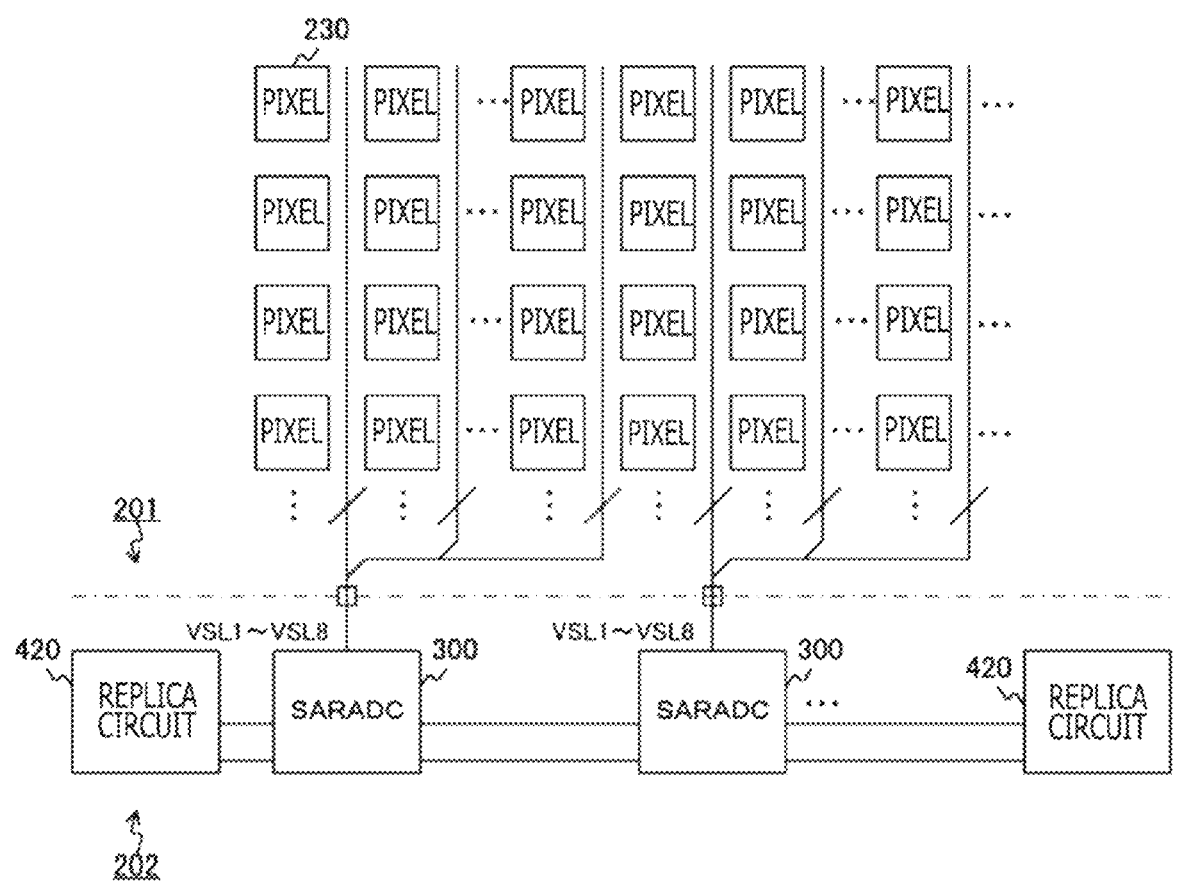
FIG. 33 is a block diagram illustrating a configuration example of the solid-state imaging element according to a modification of the eighth embodiment of the present technique.

FIG. 33 is a block diagram illustrating a configuration example of the solid-state imaging element 200 according to the modification of the eighth embodiment of the present technique. In the solid-state imaging element 200 of the second embodiment, one SARADC 300 is connected to a plurality of (for example, eight) vertical signal lines. In addition, two replica circuits 420 are arranged, and a plurality of SADRACs 300 share the replica circuits 420. The number of replica circuits 420 is not limited to two, and for example, the number of replica circuits 420 may be one. In addition, a plurality of pixels 230 are arranged on the sensor chip 201, and the SARADCs 300, the replica circuits 420, and the like are arranged on the circuit chip 202.

Figure 34:
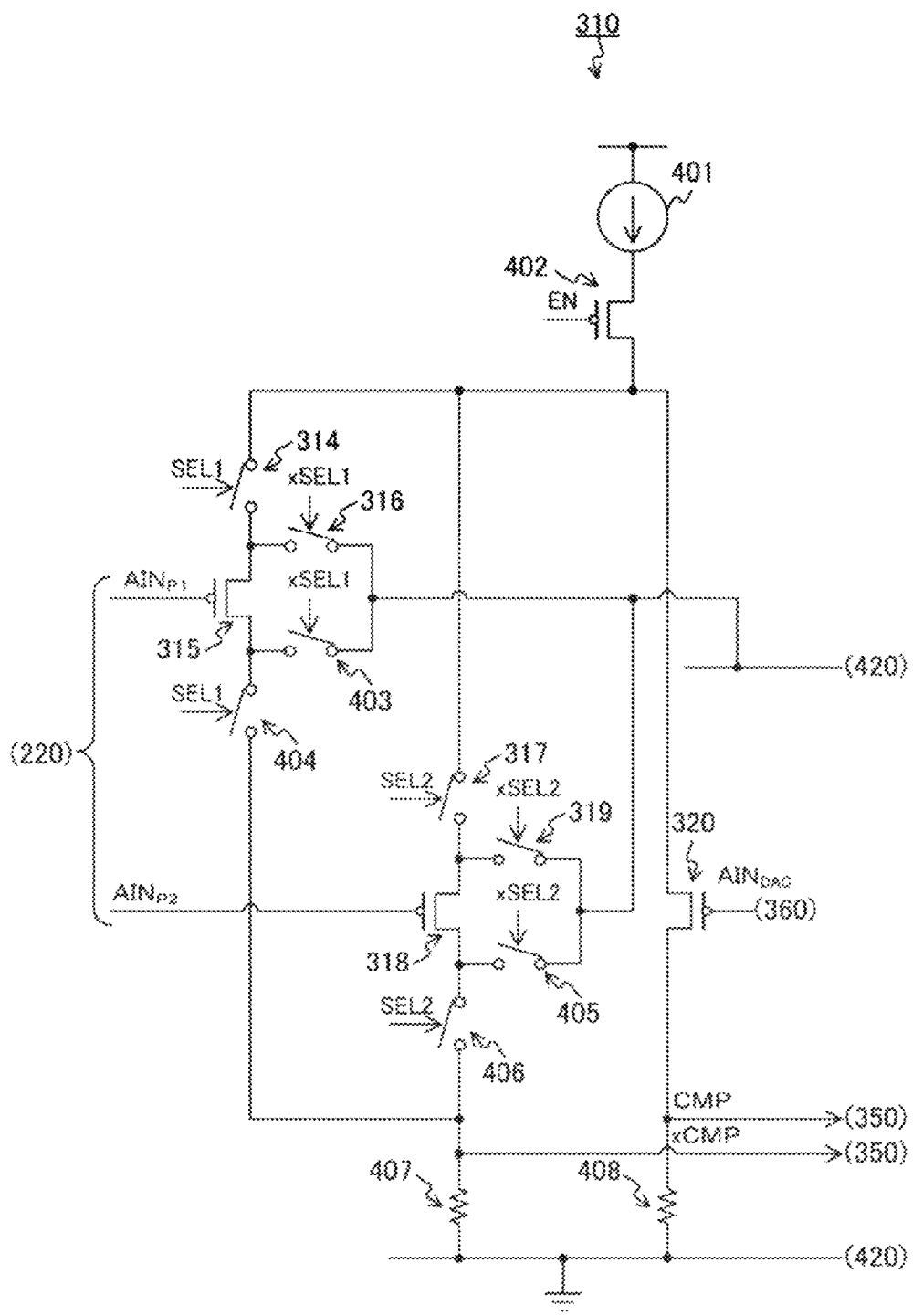
FIG. 34 is a block diagram illustrating a configuration example of the comparator according to the modification of the eighth embodiment of the present technique.

FIG. 34 is a block diagram illustrating a configuration example of the comparator 310 according to the modification of the eighth embodiment of the present technique. The comparator 310 according to the modification of the eighth embodiment is different from the eighth embodiment in that the replica circuits 420 are not arranged inside.

In this way, according to the modification of the eighth embodiment of the present technique, a plurality of SARADCs 300 share the replica circuits 420, and the circuit scale can be reduced compared to the case in which the replica circuit 420 is arranged for each SARADC 300.

9. Ninth Embodiment

Although the replica circuit 420 supplies constant intermediate potential in the eighth embodiment, the intermediate potential may be deviated from the design value due to manufacturing variations of elements in the replica circuit 420. The replica circuit 420 of a ninth embodiment is different from the eighth embodiment in that the intermediate potential is adjusted by variable resistors.

Figure 35:
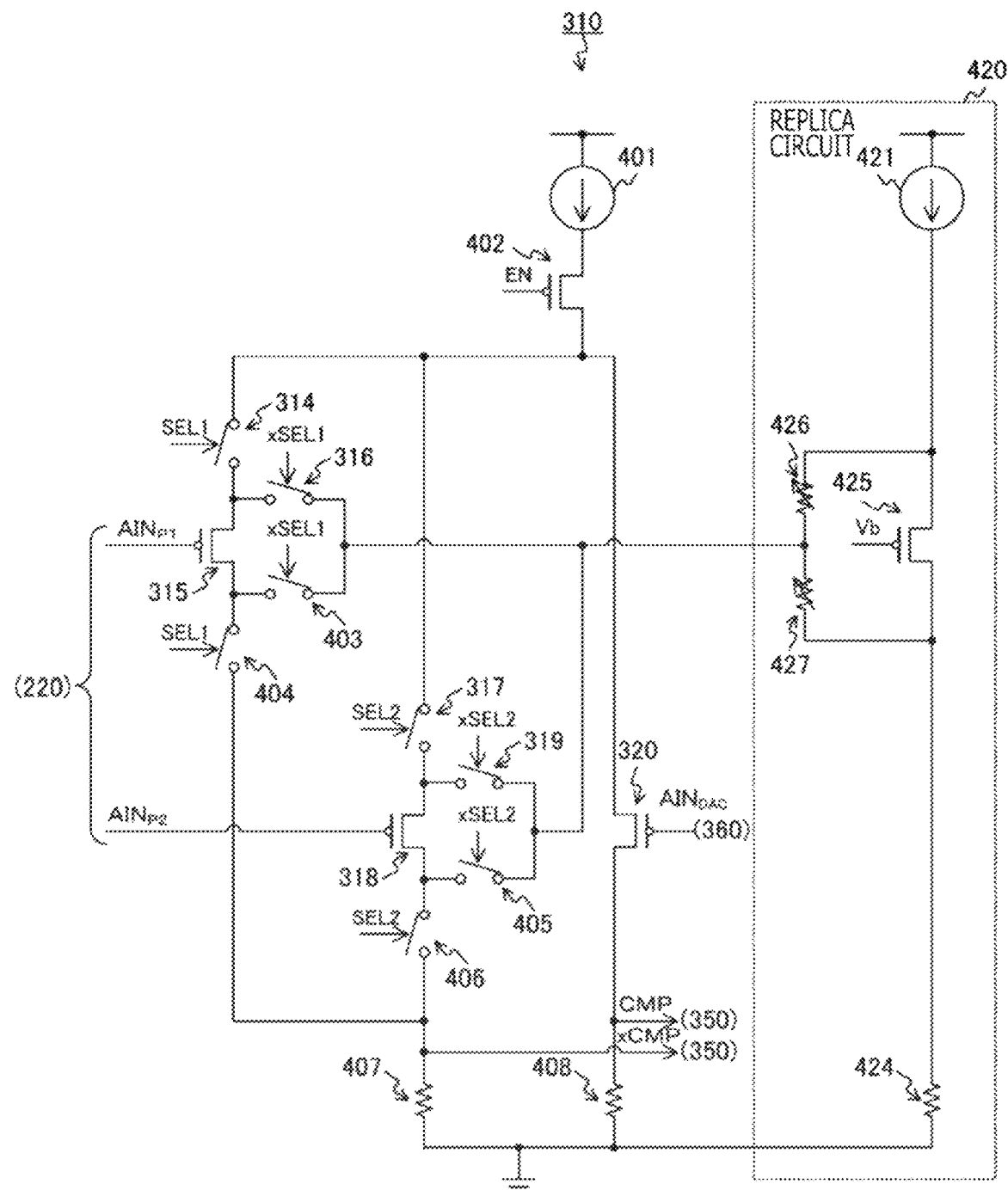
FIG. 35 is a block diagram illustrating a configuration example of the comparator according to a ninth embodiment of the present technique.

FIG. 35 is a block diagram illustrating a configuration example of the comparator 310 according to the ninth embodiment of the present technique. The comparator 310 of the ninth embodiment is different from the eighth embodiment in that variable resistors 426 and 427 are arranged in the replica circuit 420 in place of the fixed resistors 422 and 423.

The resistance values of the variable resistors 426 and 427 are set by a worker or by execution of an application at factory shipment or the like so that the intermediate potential substantially coincides with the design value. The set value is then held in a register or the like.

Note that in the ninth embodiment, a plurality of SARADCs 300 may share the replica circuit 420 as in the modification of the eighth embodiment.

In this way, according to the ninth embodiment of the present technique, the variable resistors 426 and 427 are arranged in the replica circuit 420, and the resistance values of the variable resistors 426 and 427 can be changed to adjust the intermediate potential. In this configuration, an output signal line (CMP) is connected to a node between transistor 360 and ground, and the other output signal line (xCMP) is connected to a node between transistor 318 and ground.

10. Tenth Embodiment

Although the replica circuit 420 generates the intermediate potential in the ninth embodiment, the amount of change from the intermediate potential to the source potential may significantly vary between inputs upon the switch due to the potential fluctuation of the source node 411. The comparator 310 of a tenth embodiment is different from the ninth embodiment in that the potential of the source node 411 is reset to an initial value every time the pixel signal is switched.

Figure 36:
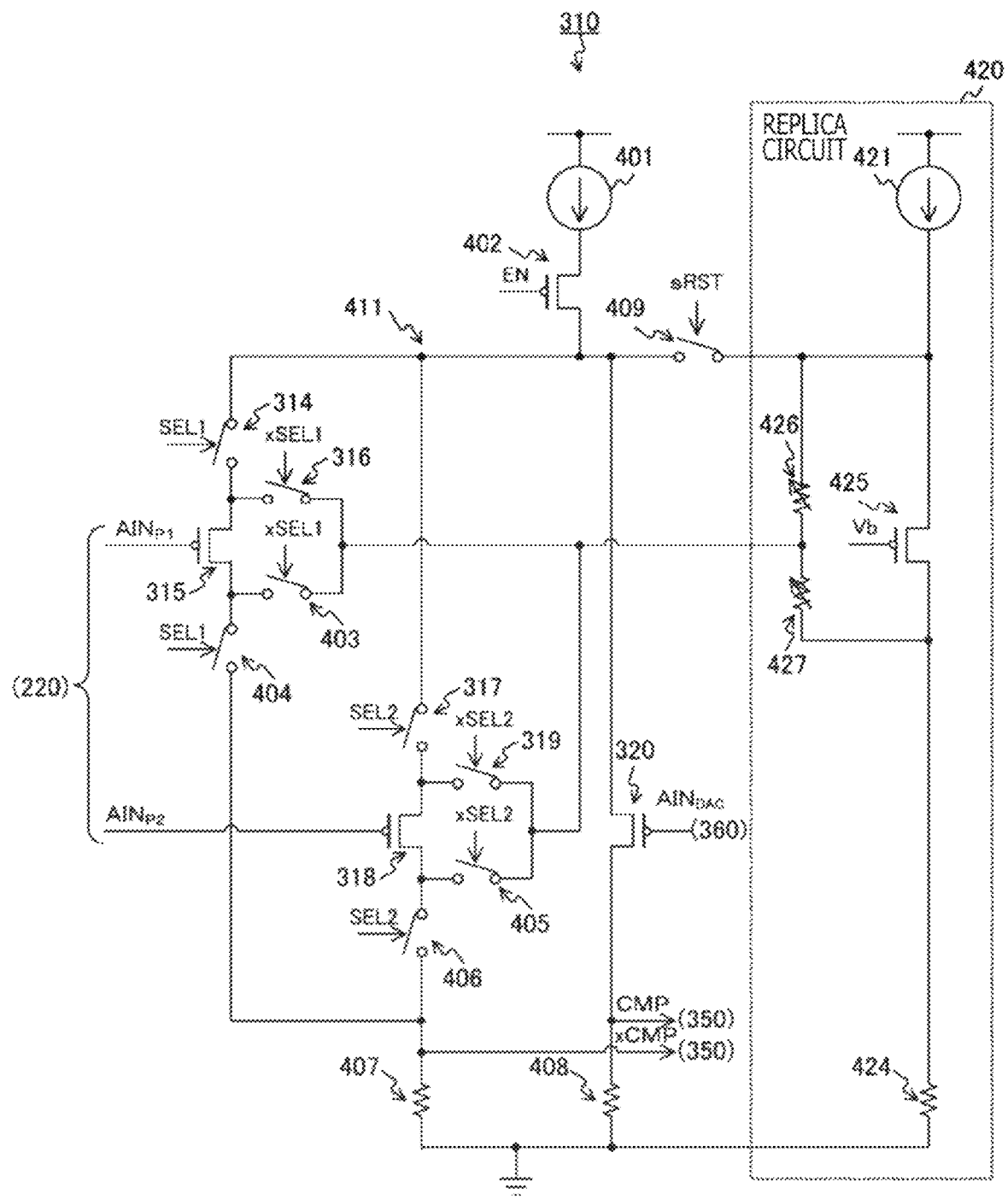
FIG. 36 is a block diagram illustrating a configuration example of the comparator according to a tenth embodiment of the present technique.

FIG. 36 is a block diagram illustrating a configuration example of the comparator 310 according to the tenth embodiment of the present technique. The comparator 310 of the tenth embodiment is different from the first embodiment in that a source reset switch 409 is further arranged.

The source reset switch 409 is configured to reset the potential of the source node 411 every time the pixel signal is switched. The source reset switch 409 opens and closes the route between the source node 411 and the connection point of the current source 421 and the variable resistor 426 according to a source reset signal sRST from the timing control circuit 250.

Figure 37:
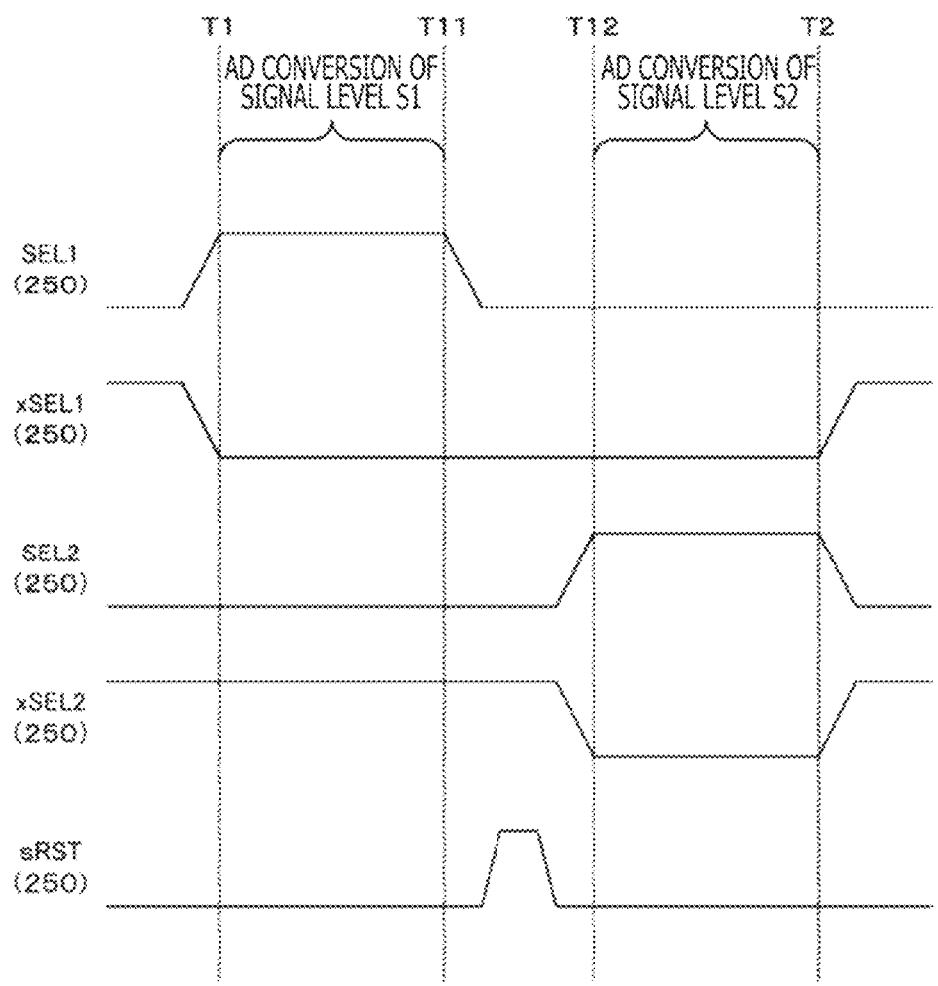
FIG. 37 is a timing chart illustrating an example of a control example of the comparator according to the tenth embodiment of the present technique.

FIG. 37 is a timing chart illustrating an example of a control example of the comparator 310 according to the tenth embodiment of the present technique. From timing T1 to timing T11, the timing control circuit 250 supplies the selection signal SEL1 in the high level to execute the AD conversion of the signal level S1. The timing control circuit 250 then supplies the source reset signal sRST to reset the potential of the source node 411 in a period from the timing T11 to timing T12. Next, the timing control circuit 250 supplies the selection signal SEL2 in the high level to execute the AD conversion of the signal level S2 from the timing T12 to the timing T2.

Upon the switch of the pixel signal (such as data and signal level) in the ninth embodiment, if the potential of the source node 411 is different before and after the switch, the amount of change from the intermediate potential to the source varies between pixel transistors, and the amount of kickback varies. As a result, the comparison result of the comparator 310 may indicate a value different from the expected value.

On the other hand, the timing control circuit 250 resets the potential of the source node 411 every time the pixel signal is switched in the tenth embodiment. As a result, the amount of transition from the intermediate potential to the source potential is the same in each pixel signal, and there is no variation in the amount of kickback.

In addition, the timing control circuit 250 according to the tenth embodiment puts a selection signal xSELn (n is an integer) into the low level throughout the period from the time that a selection signal SELn enters the high level to the end of all the AD conversion. For example, the selection signal xSEL1 is set to the low level from the timing T1 of the selection signal SEL1 entering the high level to the timing T2 of the end of the AD conversion of the signal levels S1 and S2. In this way, the source and the drain of the pixel-side transistor 315 corresponding to the selection signal xSEL1 before the switch are controlled not to be connected again to the replica circuit 420 upon the switch, and the fluctuation of the intermediate potential can be suppressed.

Note that although the comparator 310 switches two pixel signals, the comparator 310 may be configured to switch three or more pixel signals. In addition, in the tenth embodiment, a plurality of SARADCs 300 may share the replica circuit 420 as in the modification of the eighth embodiment.

In this way, according to the tenth embodiment of the present technique, the comparator 310 resets the potential of the source node 411 every time the pixel signal is switched, and this can suppress the transition of potential in each pixel transistor of the source node 411 upon the switch.

11. Eleventh Embodiment

Although the replica circuit 420 generates the intermediate potential in the tenth embodiment, the reset, the power fluctuation, or the like of the source node 411 may cause fluctuation of the intermediate potential. The comparator 310 of an eleventh embodiment is different from the tenth embodiment in that a sample-and-hold circuit suppresses the fluctuation of the intermediate potential.

Figure 38:
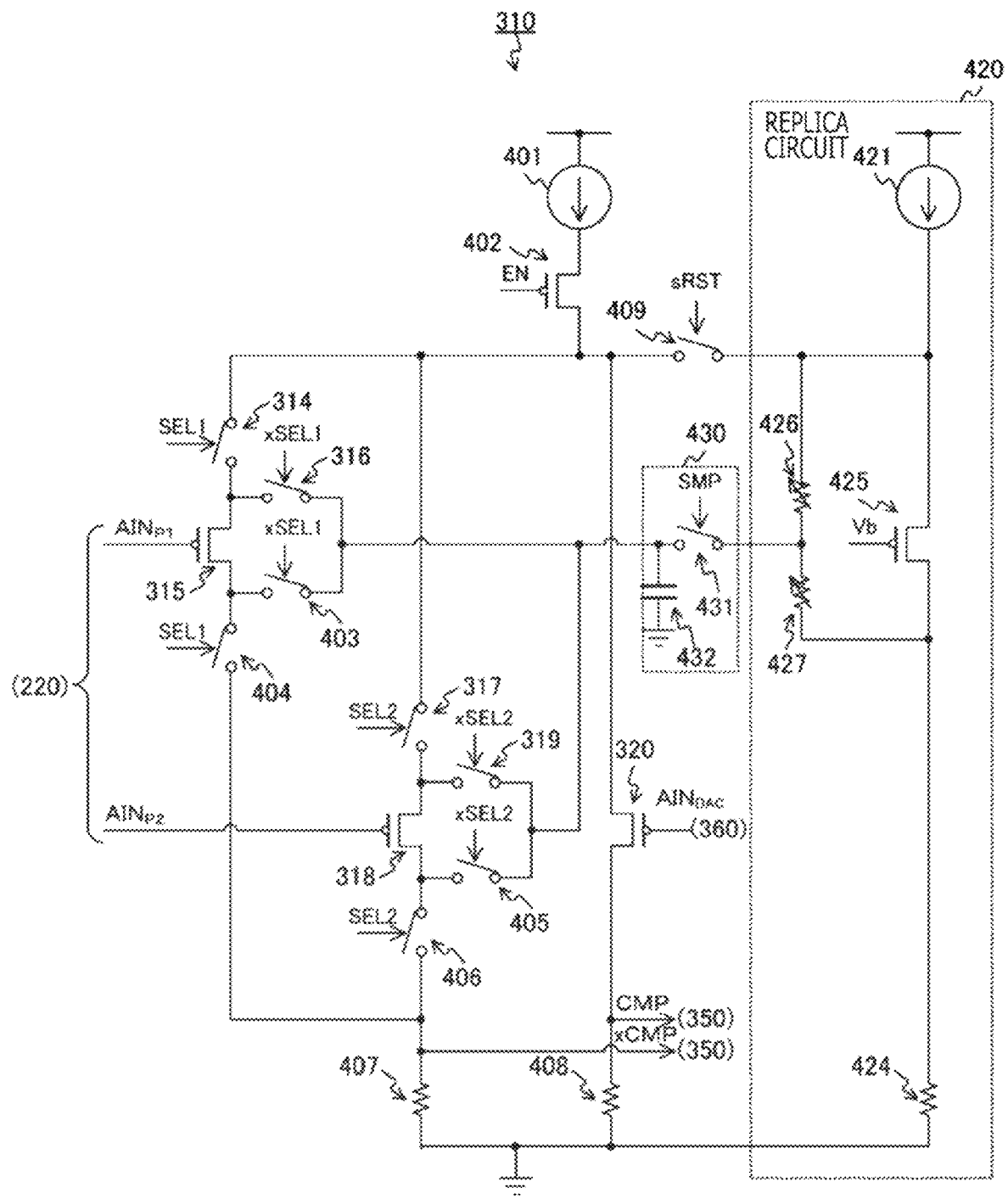
FIG. 38 is a block diagram illustrating a configuration example of the comparator according to an eleventh embodiment of the present technique.

FIG. 38 is a block diagram illustrating a configuration example of the comparator 310 according to the eleventh embodiment of the present technique. The comparator 310 of the eleventh embodiment is different from the tenth embodiment in that a sample-and-hold circuit 430 is further arranged.

The sample-and-hold circuit 430 is configured to sample and hold the intermediate potential in synchronization with a sampling signal SMP from the timing control circuit 250. The sample-and-hold circuit 430 includes a sampling switch 431 that performs sampling in synchronization with the sampling signal SMP and a capacitor 432 that holds the sampled potential.

Figure 39:
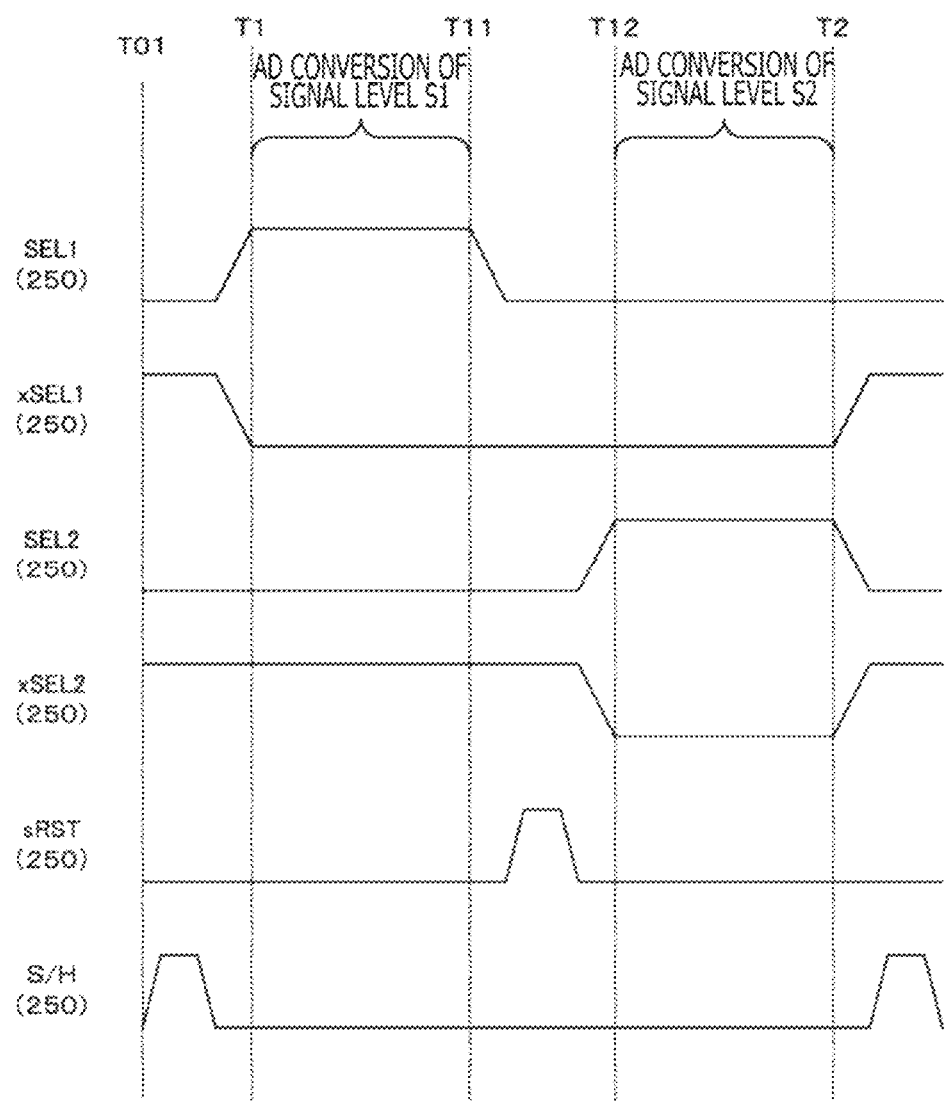
FIG. 39 is a timing chart illustrating an example of a control example of the comparator according to an eleventh embodiment of the present technique.

FIG. 39 is a timing chart illustrating an example of a control example of the comparator 310 according to the eleventh embodiment of the present technique. The timing control circuit 250 uses the sampling signal SMP to sample and hold the intermediate potential just before timing T1 of the start of the first AD conversion, for example. Then, after the end of all the AD conversion, the sampling is performed again. Note that the timing of sampling is not limited to the timing illustrated in the figure. For example, the sample-and-hold circuit 430 may perform sampling every time the pixel signal is switched, just before the switch.

Note that although the comparator 310 switches two pixel signals, the comparator 310 may be configured to switch three or more pixel signals. In addition, in the eleventh embodiment, a plurality of SARADCs 300 may share the replica circuit 420 as in the modification of the eighth embodiment.

In this way, according to the eleventh embodiment of the present technique, the sample-and-hold circuit 430 samples and holds the intermediate potential, and this can suppress the fluctuation of the intermediate potential caused by the reset, the power fluctuation, or the like of the source node 411.

12. Twelfth Embodiment

In the eighth embodiment, the fixed resistors 422 and 423 and the transistor 425 in replica circuit generate the intermediate potential. However, the replica circuit 420 can also be configured without using the fixed resistors 422 and 423. The replica circuit 420 of a twelfth embodiment is different from the eighth embodiment in that the fixed resistors 422 and 423 are not arranged.

Figure 40:
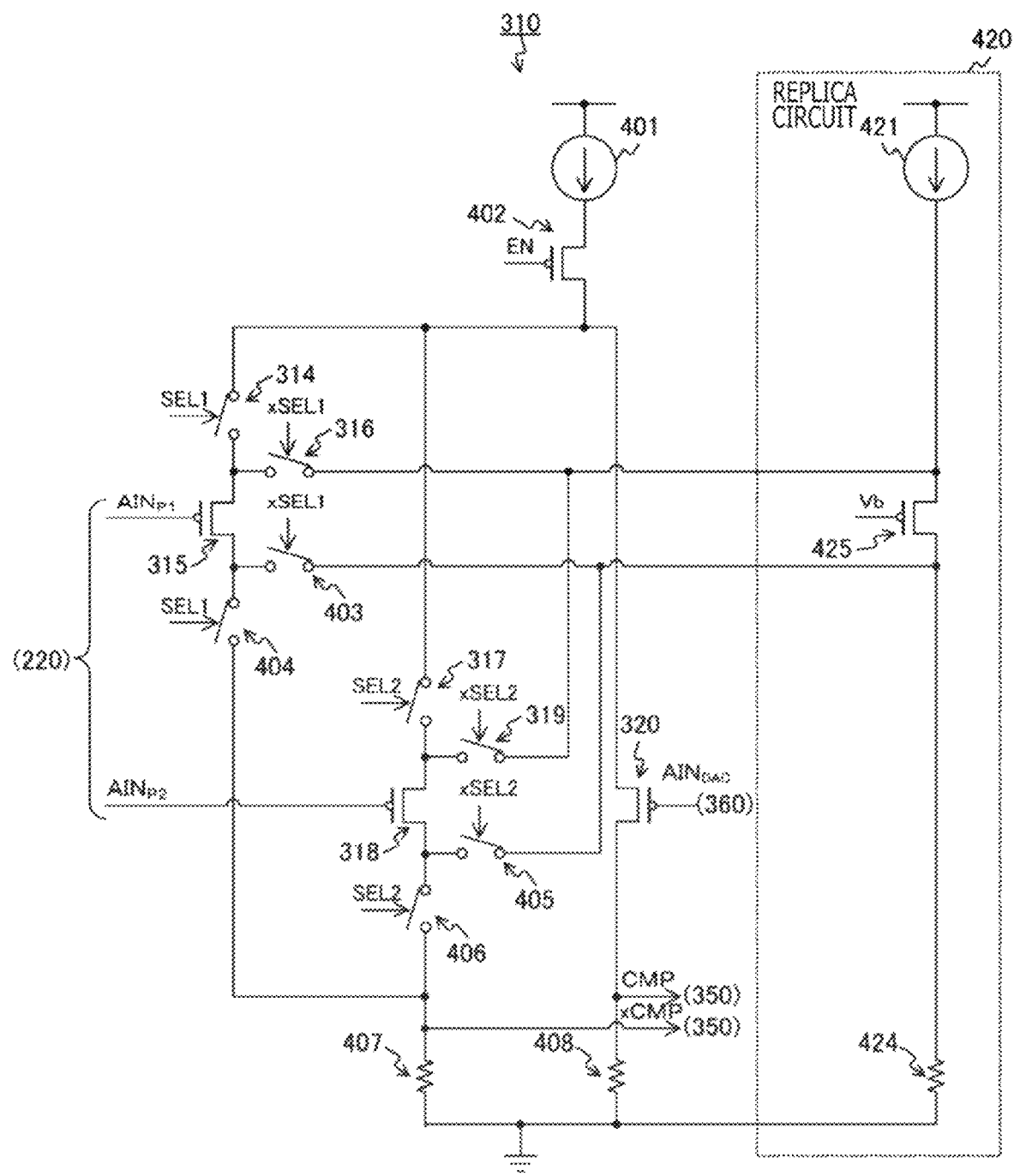
FIG. 40 is a block diagram illustrating a configuration example of the comparator according to a twelfth embodiment of the present technique.

FIG. 40 is a block diagram illustrating a configuration example of the comparator 310 according to the twelfth embodiment of the present technique. The comparator 310 of the twelfth embodiment is different from the eighth embodiment in that the fixed resistors 422 and 423 are not arranged. In addition, the source and the drain of the transistor 425 in replica circuit are connected to the sources and the drains of the pixel-side transistors 315 and 318 through the short-circuit switches 316, 403, 319, and 405.

According to the configuration, the voltages to the sources and the drains of the pixel-side transistors 315 and 318 can be generated on the basis of the bias voltage Vb. In this case, the current density of the replica circuit 420 is similar to the current density of the present circuit that is a circuit in the comparator 310 other than the replica circuit 420. Therefore, the consumption current may be greater than in the eighth embodiment. Note that in a case where generation of some noise caused by kickback is allowed due to loose requirements for noise depending on the application, the current density of the replica circuit 420 and the current density of the present circuit may be a little different.

Note that in the twelfth embodiment, a plurality of SARADCs 300 may share the replica circuit 420 as in the modification of the eighth embodiment.

In this way, according to the twelfth embodiment of the present technique, the replica circuit 420 is configured without using the fixed resistors 422 and 423, and the circuit scale of the replica circuit 420 can be reduced compared to the eighth embodiment.

13. Thirteenth Embodiment

Although the intermediate potential is supplied to the source and the drain of the pixel-side transistor to suppress the kickback on the pixel side in the eighth embodiment, the kickback on the DAC 350 side can also be suppressed. The comparator 310 of a thirteenth embodiment is different from the eighth embodiment in that the comparator 310 supplies the intermediate potential to the source and the drain of the reference-side transistor 320.

Figure 41:
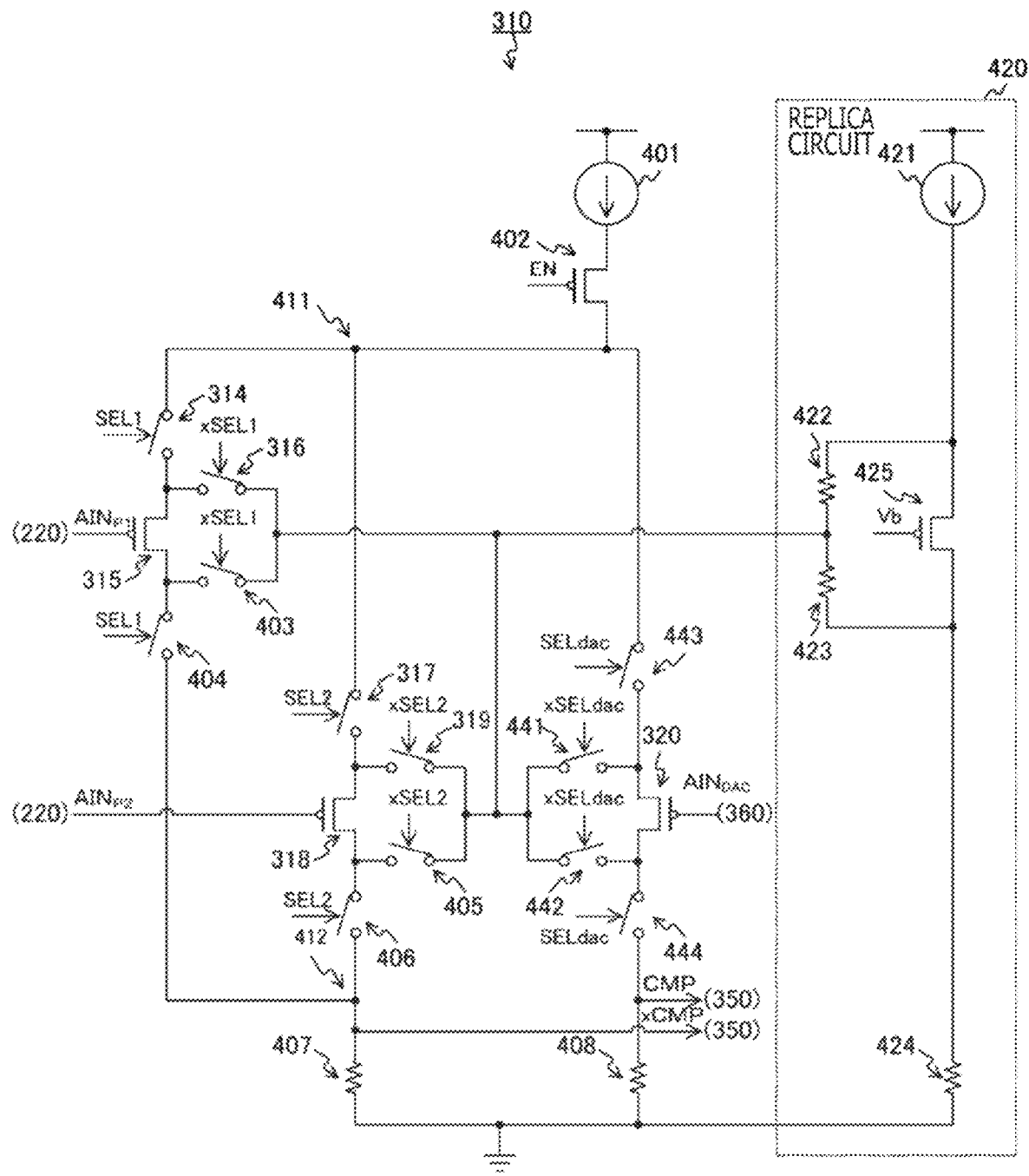
FIG. 41 is a block diagram illustrating a configuration example of the comparator according to a thirteenth embodiment of the present technique.

FIG. 41 is a block diagram illustrating a configuration example of the comparator 310 according to the thirteenth embodiment of the present technique. The comparator 310 of the thirteenth embodiment is different from the eighth embodiment in that the comparator 310 further includes short-circuit switches 441 and 442 and selection switches 443 and 444.

The short-circuit switch 441 is configured to open and close the route between the source of the reference-side transistor 320 and the connection point of the fixed resistors 422 and 423 according to a selection signal xSELdac. The short-circuit switch 442 is configured to open and close the route between the drain of the reference-side transistor 320 and the connection point of the fixed resistors 422 and 423 according to the selection signal xSELdac.

The selection switch 443 is configured to open and close the route between the source of the reference-side transistor 320 and the source node 411 according to a selection signal SELdac. The selection switch 444 is configured to open and close the route between the drain of the reference-side transistor 320 and the drain node 412 according to the selection signal SELdac. The selection signal SELdac is controlled at the high level in the period of the AD conversion in the successive comparison and controlled at the low level in the other periods, for example. The selection signal xSELdac may be a reversed signal of the selection signal SELdac or may be controlled similarly to xSEL of FIG. 39.

Note that although the comparator 310 switches two pixel signals in the thirteenth embodiment, the comparator 310 may be configured to switch three or more pixel signals. In addition, a plurality of SARADCs 300 may share the replica circuit 420 as in the modification of the eighth embodiment. In addition, the variable resistors 426 and 427 may be arranged in the replica circuit 420 as in the ninth embodiment. In addition, the source reset switch 409 may be further arranged as in the tenth embodiment. In addition, the sample-and-hold circuit 430 may be further arranged as in the eleventh embodiment.

In this way, according to the thirteenth embodiment of the present technique, the comparator 310 supplies the intermediate potential to the source and the drain of the reference-side transistor 320, and the amount of kickback upon the switch can also be reduced on the reference side.

14. Application to Movable Body

The technique according to the present disclosure (present technique) can be applied to various products. For example, the technique according to the present disclosure may be realized as an apparatus mounted on a type of movable body, such as a car, an electric car, a hybrid electric car, a motorcycle, a bicycle, a personal mobility, an airplane, a drone, a ship, and a robot.

Figure 42:
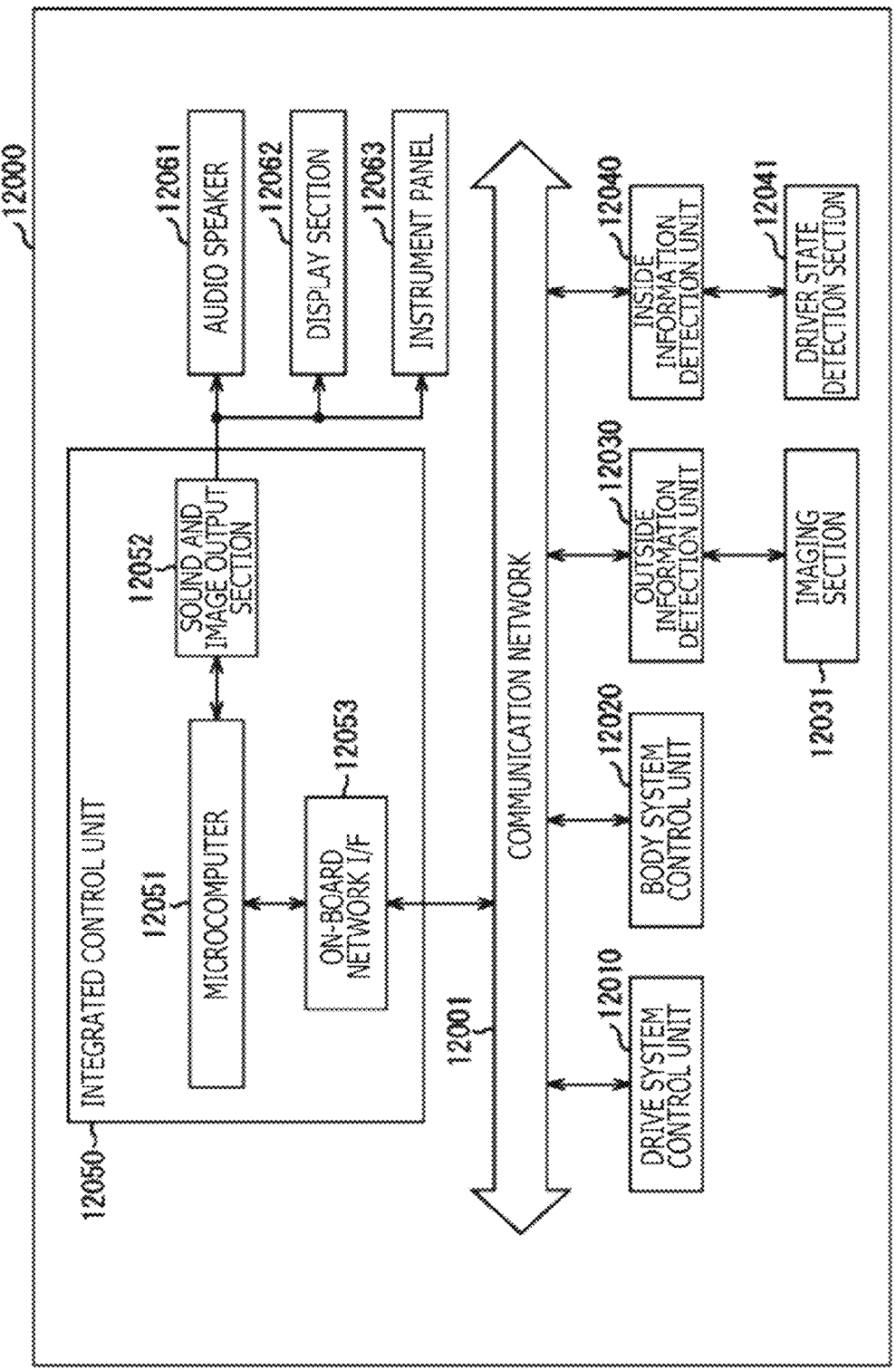
FIG. 42 is a block diagram illustrating a schematic configuration example of a vehicle control system.

FIG. 42 is a block diagram illustrating a schematic configuration example of a vehicle control system as an example of a movable body control system to which the technique according to the present disclosure can be applied.

A vehicle control system 12000 includes a plurality of electronic control units connected through a communication network 12001. In the example illustrated in FIG. 42, the vehicle control system 12000 includes a drive system control unit 12010, a body system control unit 12020, an outside information detection unit 12030, an inside information detection unit 12040, and an integrated control unit 12050. In addition, a microcomputer 12051, a sound and image output section 12052, and an on-board network I/F (interface) 12053 are illustrated as functional components of the integrated control unit 12050.

The drive system control unit 12010 controls operation of apparatuses related to the drive system of the vehicle according to various programs. For example, the drive system control unit 12010 functions as a control apparatus of a driving force generation apparatus, such as an internal combustion engine and a driving motor, for generating driving force of the vehicle, a driving force transmission mechanism for transmitting the driving force to the wheel, a steering mechanism for adjusting the steering angle of the vehicle, a braking apparatus that generates braking force of the vehicle, and the like.

The body system control unit 12020 controls operation of various apparatuses installed on the vehicle body according to various programs. For example, the body system control unit 12020 functions as a control apparatus of a keyless entry system, a smart key system, a power window apparatus, or various lamps, such as a headlamp, a back lamp, a brake lamp, a turn signal, and a fog lamp. In this case, radio waves sent from a mobile device substituting the key or signals of various switches can be input to the body system control unit 12020. The body system control unit 12020 receives the input of the radio waves or the signals to control the door lock apparatus, the power window apparatus, the lamps, and the like of the vehicle.

The outside information detection unit 12030 detects external information of the vehicle provided with the vehicle control system 12000. For example, an imaging section 12031 is connected to the outside information detection unit 12030. The outside information detection unit 12030 causes the imaging section 12031 to take images of the outside of the vehicle and receives the taken images. The outside information detection unit 12030 may execute an object detection process or a distance detection process of a person, a car, an obstacle, characters on a sign or a road surface, and the like on the basis of the received images.

The imaging section 12031 is an optical sensor that receives light and outputs an electrical signal according to the amount of the received light. The imaging section 12031 can also output the electrical signal as an image or as information of distance measurement. In addition, the light received by the imaging section 12031 may be visible light or may be invisible light such as infrared rays.

The inside information detection unit 12040 detects information of the inside of the vehicle. A driver state detection section 12041 that detects the state of the driver is connected to the inside information detection unit 12040, for example. The driver state detection section 12041 includes, for example, a camera that images the driver, and the inside information detection unit 12040 may calculate the degree of fatigue or the degree of concentration of the driver or may determine whether the driver is sleeping on the basis of the detection information input from the driver state detection section 12041.

The microcomputer 12051 can calculate a control target value of the driving force generation apparatus, the steering mechanism, or the braking apparatus on the basis of the information of the inside or the outside of the vehicle acquired by the outside information detection unit 12030 or the inside information detection unit 12040 and can output a control command to the drive system control unit 12010. For example, the microcomputer 12051 can perform cooperative control for realizing functions of ADAS (Advanced Driver Assistance System) including avoidance or shock mitigation of a collision of the vehicle, follow-up traveling based on the following distance, traveling at a constant speed, collision warning of the vehicle, lane departure warning of the vehicle, or the like.

The microcomputer 12051 can also control the driving force generation apparatus, the steering mechanism, the braking apparatus or the like on the basis of the information around the vehicle acquired by the outside information detection unit 12030 or the inside information detection unit 12040 to perform cooperative control aimed at, for example, automatic drive for autonomous traveling without operation by the driver.

The microcomputer 12051 can also output a control command to the body system control unit 12020 on the basis of the information of the outside of the vehicle acquired by the outside information detection unit 12030. For example, the microcomputer 12051 can control the headlamps according to the position of a leading car or an oncoming car detected by the outside information detection unit 12030 to perform cooperative control for anti-glare, such as switching the high beam to the low beam.

The sound and image output section 12052 transmits an output signal of at least one of the sound and the image to an output apparatus that can visually or aurally transfer information to the occupant of the vehicle or to the outside of the vehicle. In the example of FIG. 42, an audio speaker 12061, a display section 12062, and an instrument panel 12063 are illustrated as the output apparatus. The display section 12062 may include, for example, at least one of an on-board display and a head-up display.

Figure 43:
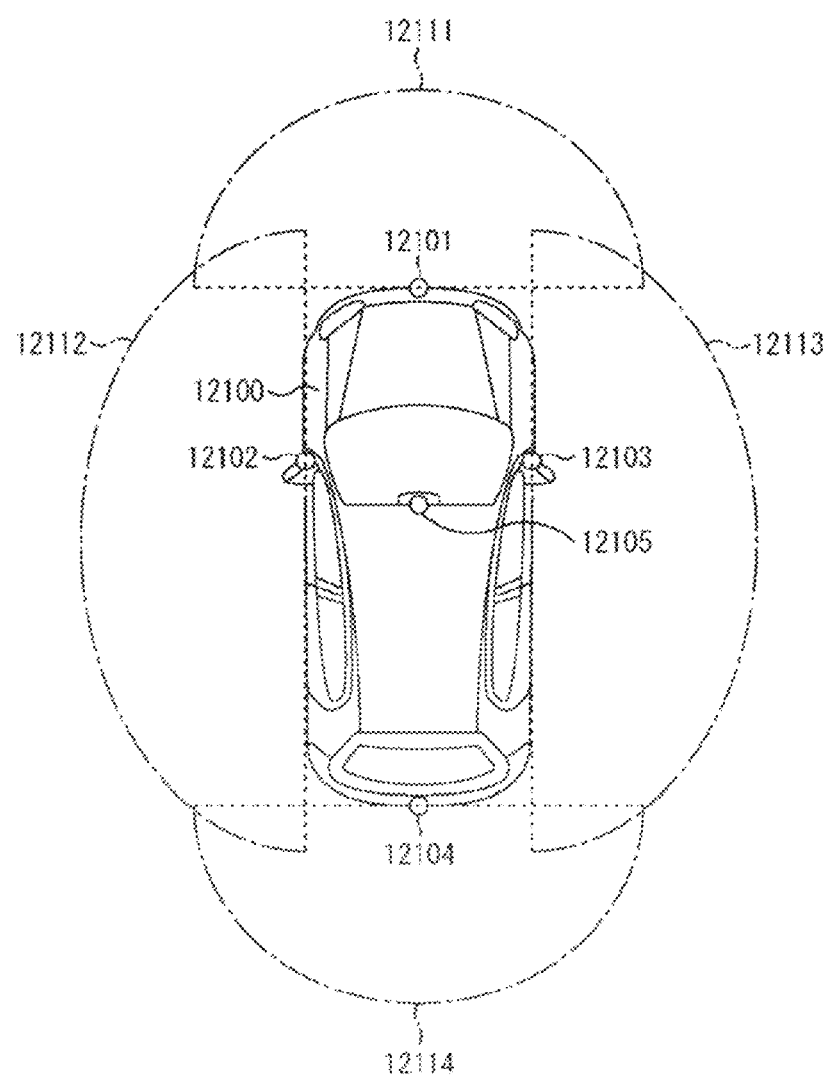
FIG. 43 is an explanatory diagram illustrating an example of an installation position of an imaging section.

FIG. 43 is a diagram illustrating an example of an installation position of the imaging section 12031.

In FIG. 43, imaging sections 12101, 12102, 12103, 12104, and 12105 are provided as the imaging section 12031.

The imaging sections 12101, 12102, 12103, 12104, and 12105 are provided at positions of, for example, the front nose, the side mirrors, the rear bumper, the back door, the upper part of the windshield of the interior, or the like of the vehicle 12100. The imaging section 12101 installed on the front nose and the imaging section 12105 installed on the upper part of the windshield of the interior mainly acquire images in front of the vehicle 12100. The imaging sections 12102 and 12103 installed on the side mirrors mainly acquire images at the sides of the vehicle 12100. The imaging section 12104 installed on the rear bumper or the back door mainly acquires images behind the vehicle 12100. The imaging section 12105 installed on the upper part of the windshield of the interior is mainly used to detect vehicles in front, pedestrians, obstacles, traffic lights, traffic signs, lanes, or the like.

Note that FIG. 43 illustrates an example of photographing ranges of the imaging sections 12101 to 12104. An imaging range 12111 indicates an imaging range of the imaging section 12101 provided on the front nose. Imaging ranges 12112 and 12113 indicate imaging ranges of the imaging sections 12102 and 12103 provided on the side mirrors, respectively. An imaging range 12114 indicates an imaging range of the imaging section 12104 provided on the rear bumper or the back door. For example, pieces of image data imaged by the imaging sections 12101 to 12104 are placed on top of each other to obtain a bird's eye view image as viewed from above the vehicle 12100.

At least one of the imaging sections 12101 to 12104 may have a function of acquiring distance information. For example, at least one of the imaging sections 12101 to 12104 may be a stereo camera including a plurality of imaging elements or may be an imaging element including pixels for phase difference detection.

For example, the microcomputer 12051 can calculate the distance to each three-dimensional object in the imaging ranges 12111 to 12114 and the temporal variation of the distance (speed relative to the vehicle 12100) on the basis of the distance information obtained from the imaging sections 12101 to 12104. As a result, the microcomputer 12051 can particularly extract, as the leading car, a nearest three-dimensional object that is on the path of travel of the vehicle 12100 and that travels at a predetermined speed (for example, 0 km/h or more) in substantially the same direction as the vehicle 12100. The microcomputer 12051 can further set the distance to the leading car to be secured in advance to perform automatic brake control (including follow-up stop control), automatic acceleration control (including follow-up start control), and the like. In this way, the microcomputer 12051 can perform cooperative control aimed at, for example, automatic drive for autonomous traveling without operation by the driver.

For example, the microcomputer 12051 can classify three-dimensional object data regarding three-dimensional objects into two-wheeled vehicles, ordinary vehicles, large vehicles, pedestrians, telephone poles, and other three-dimensional objects on the basis of the distance information obtained from the imaging sections 12101 to 12104 and can extract the data to use the data to automatically avoid obstacles. For example, the microcomputer 12051 distinguishes the obstacles around the vehicle 12100 into obstacles that can be visually recognized by the driver of the vehicle 12100 and obstacles hard to visually recognize. The microcomputer 12051 can then determine a risk of collision indicating the degree of risk of collision with each obstacle. In a situation where the risk of collision is equal to or greater than a set value and there is a possibility of collision, the microcomputer 12051 can output a warning to the driver through the audio speaker 12061 or the display section 12062 or perform forced deceleration or avoidance steering through the drive system control unit 12010 to support the drive for avoiding the collision.

At least one of the imaging sections 12101 to 12104 may be an infrared camera that detects infrared rays. For example, the microcomputer 12051 can determine whether there is a pedestrian in the photographed images of the imaging sections 12101 to 12104 to recognize the pedestrian. The pedestrian is recognized by, for example, a procedure of extracting feature points in the photographed images of the imaging sections 12101 to 12104 as infrared cameras and a procedure of applying a pattern matching process to the series of feature points indicating the contour of the object to determine whether the object is a pedestrian. When the microcomputer 12051 determines that there is a pedestrian in the photographed images of the imaging sections 12101 to 12104 and recognizes the pedestrian, the sound and image output section 12052 controls the display section 12062 to display and superimpose a rectangular outline on the recognized pedestrian to emphasize the pedestrian. The sound and image output section 12052 may also control the display section 12062 to display an icon or the like indicating the pedestrian on a desirable position.

This completes the description of the example of the vehicle control system to which the technique according to the present disclosure can be applied. The technique according to the present disclosure can be applied to the imaging section 12031 among the components described above. Specifically, the electronic device 100 illustrated in FIG. 1 can be applied to the imaging section 12031. The technique according to the present disclosure can be applied to the imaging section 12031 to obtain a photographed image that can be more easily viewed, and the fatigue of the driver can be reduced.

Figure 44:
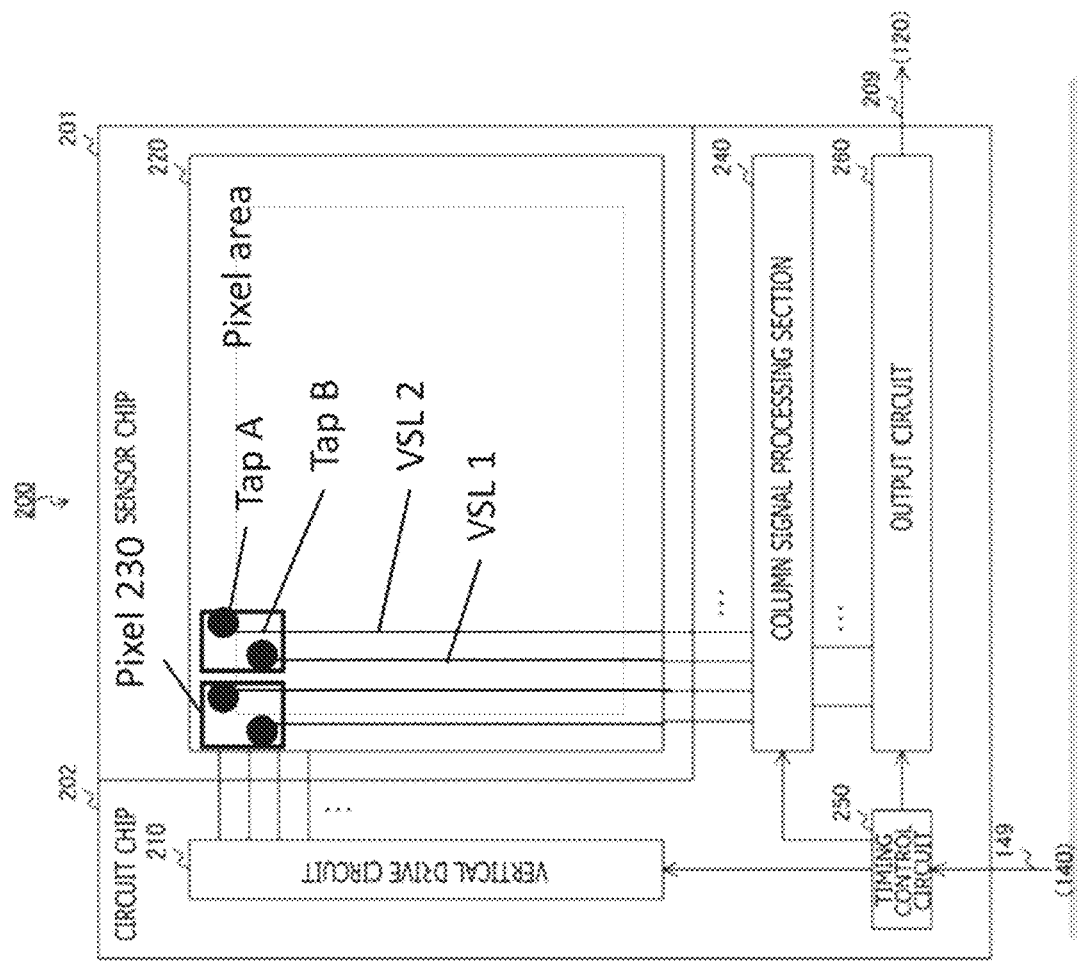

FIG. 44 is a block diagram illustrating a configuration example of an indirect-Time of Flight sensor according to the present technique.

[Configuration Example of Solid-State Imaging Element]

FIG. 44 is a block diagram illustrating a configuration example of the indirect time of flight sensor 200 according to the first embodiment of the present technique. The indirect time of flight sensor 200 includes a sensor chip 201 and a circuit chip 202 laminated on the sensor chip 201.

A pixel area 220 including a plurality of pixels arrayed in a two-dimensional grid pattern is arranged on the sensor chip 201. Pixel area 220 may be arranged in rows and columns, and may include a plurality of column lines. Each of the plurality of column lines may be coupled to a respective column of pixels. In addition, a vertical drive circuit 210, a column signal processing section 240, a timing control circuit 250, and an output circuit 260 are arranged on the circuit chip 202.

The vertical drive circuit 210 is configured to drive pixels and output pixel signals to the column signal processing section 240. The column signal processing section 240 is configured to apply an AD (Analog to Digital) conversion process to the pixel signals in columns and supply the pixel signals to the output circuit 260. The output circuit 260 is configured to apply a CDS (Correlated Double Sampling) process or the like to the data from the column signal processing section 240 and output the data to the image processing section 120. Other than the CDS process, the output circuit 260 also executes a contrast AF (Auto Focus) process of detecting a focal point on the basis of the contrast of the image data as necessary.

The timing control circuit 250 is configured to control the respective operation timings of the vertical drive circuit 210, the column signal processing section 240, and the output circuit 260 in synchronization with the vertical synchronization signal.

The pixel area 220 includes a plurality of pixels 230 arrayed in a two-dimensional grid pattern on the basis of, for example, a Bayer array. The Bayer array is provided with pixels 230 of R (Red) that generate red pixel signals, pixels 230 of G (Green) that generate green pixel signals, and pixels 230 of B (Blue) that generate blue pixel signals. Note that the pixels 230 may be arrayed on the basis of a system other than the Bayer array.

In addition, vertical signal lines VSL1 and VSL2 (also referred to as column lines) are wired in a vertical direction in each column of the pixels 230. Assuming that the total number of columns in the pixel area 220 is M (M is an integer), a total of 2×M vertical signal lines are wired. Each of the pixels has 2 taps. The vertical signal line VSL1 is connected to tap A of the pixel 230, and the vertical signal line VSL2 is connected to the Tap B of the pixel 230. In addition, the vertical signal line VSL1 transmits a pixel signal $AIN_{P1}$, and the vertical signal line VSL2 transmits a pixel signal $AIN_{P2}$.

The vertical drive circuit 210 sequentially selects and drives a row of the pixel blocks 221 to output the pixel signals $AIN_{P1}$ and $AIN_{P2}$ at the same time from each pixel block 221 in the row. In other words, the vertical drive circuit 210 drives the (2k)th row and the (2k+1)th row of the pixels 230 at the same time. Note that the vertical drive circuit 210 is an example of the drive circuit described in the claims.

Figure 45:
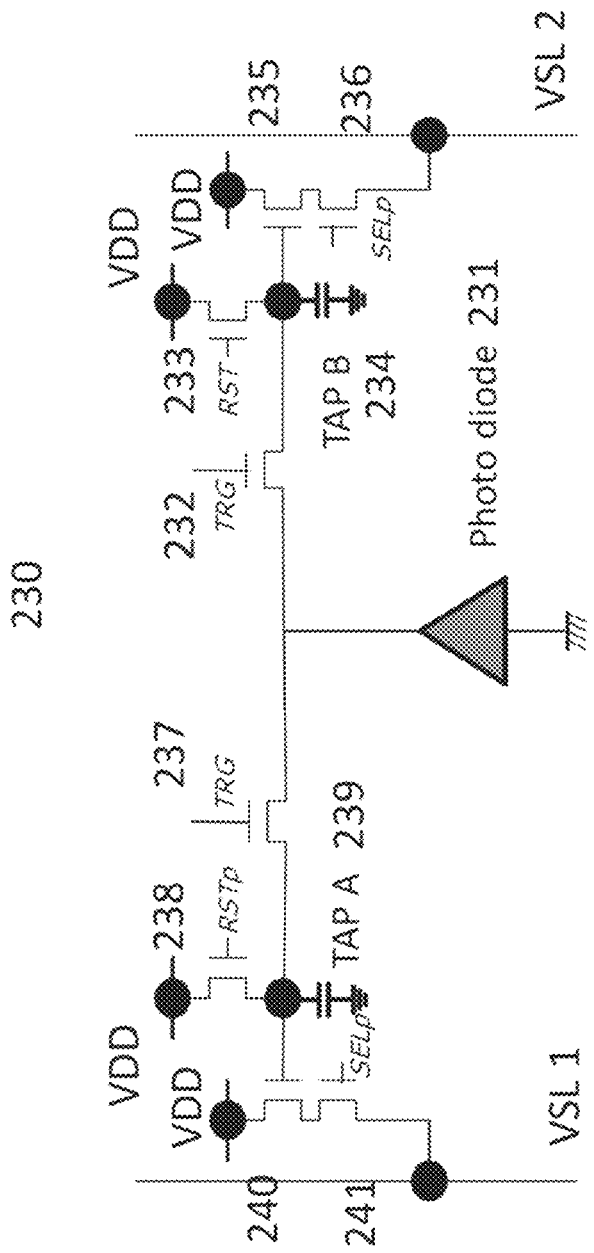
FIG. 45 is a circuit diagram illustrating a configuration example of the pixel 230 according to the FIG. 44.

FIG. 45 is a circuit diagram illustrating a configuration example of the pixel 230 according to the FIG. 44. The pixel 230 includes a photodiodes 231, 2 transfer transistors 232, 237, 2 reset transistors 233, 238, 2 Taps (floating diffusion regions) 234, 239, 2 amplifier transistors 235, 240, and 2 selection transistors 236, 241.

The photodiode 231 is configured to photoelectrically convert received light to generate charge. The photodiode 231 is arranged on a back side of a front side that is a surface of a semiconductor substrate provided with circuits. Such a solid-state imaging element is called a back-illuminated solid-state imaging element. Note that instead of the back-illuminated type, a front-illuminated configuration including the photodiode 231 arranged on the front side may also be used.

The transfer transistors 232, 237 are configured to transfer charge from the photodiode 231 to the Tap A 239 and Tap B 234 sequentially according to transfer signals TRG from the vertical drive circuit 210. Tap A 239 and Tap B 234 accumulate the transferred charge to generate a voltage according to the amount of accumulated charge.

The reset transistors 233, 238 are configured to pull out the charge from the Tap A 239 and Tap B 234 respectively according to reset signals RSTp from the vertical drive circuit 210 to initialize the amount of charge. The amplifier transistors 235, 240 are configured to amplify the voltage of the Tap A 239 and Tap B 234 respectively. The selection transistors 236, 241 are configured to output pixel signals that are signals of the amplified voltage to the column signal processing section 240 through the vertical signal lines (for example, VSL1 and VSL2) respectively according to a selection signals SELp from the vertical drive circuit 210. VSL 1 and VSL 2 are connected to the SAR ADC 300.

Note that the circuit configuration of the pixel 230 is not limited to the configuration illustrated in FIG. 4 as long as the pixel signal can be generated by photoelectric conversion.

Note that the embodiments described above illustrate an example for embodying the present technique, and the matters in the embodiments and the matters used to specify the invention in the claims correspond to each other. Similarly, the matters used to specify the invention in the claims and the matters with the same names in the embodiments of the present technique correspond to each other. However, the present technique is not limited to the embodiments, and the present technique can be embodied by applying various modifications to the embodiments without departing from the scope of the present technique.

In addition, the processing procedures described in the embodiments may be regarded as a method including the series of procedures, and the processing procedures may be regarded as a program for causing a computer to execute the series of procedures or as a recording medium storing the program. Examples of the recording medium that can be used include a CD (Compact Disc), an MD (MiniDisc), a DVD (Digital Versatile Disc), a memory card, and a Blu-ray (registered trademark) Disc.

Note that the advantageous effects described in the present specification are illustrative only, and the advantageous effects are not limited. There may also be other advantageous effects.

Note that the present technique can also be configured as follows.

(1)
A solid-state imaging apparatus comprising:
a pixel area comprising:
a plurality of pixels arranged in rows and columns; and
a plurality of column lines, each of the plurality of column lines being coupled to a respective column of pixels of the plurality of pixels; and
circuitry comprising a plurality of successive approximation analog-to-digital converters (SARADC), at least one of the plurality of SARADCs being coupled to at least two column lines of the plurality of column lines.

(2)
The solid-state imaging element according to (1), in which
each of the plurality of SARADCs is coupled to at least two respective column lines of the plurality of column lines.

(3)
The solid-state imaging element according to (1) or (2), in which
each of the plurality of pixels comprises at least one photodiode.

(4)
The solid-state imaging element according to any one of (1) to (3), in which
the circuitry is configured to drive at least two rows of pixels of the plurality of pixels simultaneously.

(5)
The solid-state imaging element according to (4), in which
the circuitry is configured to drive all the rows of pixels of the plurality of pixels simultaneously.

(6)
The solid-state imaging element according to any one of (1) to (5), in which
the at least one of the plurality of SARADCs comprises a comparator configured to compare a reference signal with a pixel signal provided to the comparator through one of the at least two column lines.

(7)
The solid-state imaging element according to (6), in which
the circuitry is configured to vary the reference signal over time.

(8)
The solid-state imaging element according to (7), in which
the circuitry is configured to vary, during a predefined time slot, the reference signal until a least significant bit (LSB) is generated based on the pixel signal.

(9)
The solid-state imaging element according to any one of (6) to (8), in which:
the comparator comprises a selection section configured to select the pixel signal between:
a first pixel signal provided to the comparator through a first column line of the at least two column lines, and
a second pixel signal provided to the comparator through a second column line of the at least two column lines.

(10)
The solid-state imaging element according to any one of (6) to (9), in which the comparator comprises:
a first transistor configured to receive a first pixel signal;
a second transistor configured to receive a second pixel signal; and
a third transistor configured to receive the reference signal.

(11)
The solid-state imaging element according to (10), in which the comparator further comprises:
a first switch coupled to a source and a drain of the first transistor; and
a second switch coupled to a source and a drain of the second transistor.

(12)
The solid-state imaging element according to (11), in which the comparator further comprises:
a third switch coupled to the first switch; and
a fourth switch coupled to the second switch. (13)
The solid-state imaging element according to (12), in which
the first switch is configured to receive a first control signal and the third switch is configured to receive an inversion signal of the first control signal; and
the second switch is configured to receive a second control signal and the fourth switch is configured to receive an inversion signal of the second control signal.

(14)
The solid-state imaging element according to any one of (10) to (13), in which
the comparator comprises a first output signal line and a second output signal line.

(15)
The solid-state imaging element according to (14), in which
the first output signal line is coupled to a first node between the first transistor and a power source; and the second signal line is coupled to a second node between the third transistor and the power source.

(16)
The solid-state imaging element according to any one of (14) to (15), in which
the first output signal line is coupled to a first node between the first transistor and a ground; and the second signal line is coupled to a second node between the third transistor and the ground.

(17)

The solid-state imaging element according to any one of (1) to (16), in which the plurality of SARADCs comprises a first SARADC and a second SARADC, wherein the circuitry is configured to provide a first reference signal to the first SARADC and a second reference signal to the second SARADC, the second reference signal being different from the first reference signal.

(18)

A solid-state imaging apparatus comprising:

a pixel area comprising a plurality of pixel lines comprising:

a first pixel line coupled to a first plurality of pixels and a second pixel line coupled to a second plurality of pixels; and circuitry comprising a successive approximation analog-to-digital converter (SARADC) coupled to the first pixel line and to the second pixel line.

(19)

The solid-state imaging element according to (18), in which:

the first pixel line is a first column line and the first plurality of pixels is a first column of pixels, and the second pixel line is a second column line and the second plurality of pixels is a second column of pixels.

(20)

The solid-state imaging element according to (18) or (19), in which:

each of the first and second plurality of pixels comprises at least one photodiode.

(21)

The solid-state imaging element according to any one of (18) to (20), in which:

the first and second plurality of pixels are arranged in rows of pixels, and wherein the circuitry is configured to drive at least two of the rows of pixels simultaneously.

(22)

The solid-state imaging element according to any one of (18) to (21), in which the circuitry is configured to drive all the rows of pixels simultaneously.

(23)

The solid-state imaging element according to any one of (18) to (22), in which the SARADC comprises a comparator configured to compare a reference signal with a pixel signal provided to the comparator through one between the first pixel line and the second pixel line.

(24)

The solid-state imaging element according to (23), in which the circuitry is configured to vary the reference signal over time.

(25)

The solid-state imaging element according to (24), in which the circuitry is configured to vary, during a predefined time slot, the reference signal until a least significant bit (LSB) is generated based on the pixel signal.

(26)

The solid-state imaging element according to any one of (23) to (25), in which the comparator comprises a selection section configured to select the pixel signal between:

a first pixel signal provided to the comparator through the first pixel line, and a second pixel signal provided to the comparator through the second pixel line.

(27)

The solid-state imaging element according to any one of (23) to (26), in which a first transistor configured to receive a first pixel signal;
a second transistor configured to receive a second pixel signal; and
a third transistor configured to receive the reference signal.

(28)

The solid-state imaging element according to (27), in which the comparator further comprises:

a first switch coupled to a source and a drain of the first transistor; and
a second switch coupled to a source and a drain of the second transistor.

(29)

The solid-state imaging element according to (28), in which the comparator further comprises:

a third switch coupled to the first switch; and
a fourth switch coupled to the second switch.

(30)

The solid-state imaging element according to (29), in which:

the first switch is configured to receive a first control signal and the third switch is configured to receive an inversion signal of the first control signal; and the second switch is configured to receive a second control signal and the fourth switch is configured to receive an inversion signal of the second control signal.

(31)

The solid-state imaging element according to any one of (27) to (30), in which:

the comparator includes a first output signal line and a second output signal line.

(32)

The solid-state imaging element according to (31), in which:

the first output signal line is coupled to a first node between the first transistor and a power source; and
the second signal line is coupled to a second node between the third transistor and the power source.

(33)

The solid-state imaging element according to (31) or (32), in which the first output signal line is coupled to a first node between the first transistor and a ground level; and
the second signal line is coupled to a second node between the third transistor and the ground level.

(34)

The solid-state imaging element according to any one of (18) to (33), in which the SARADC is a first SARADC, and in which:

the plurality of pixel lines further comprise a third pixel line coupled to a third plurality of pixels and a fourth pixel line coupled to a fourth plurality of pixels, the circuitry further comprises a second SARADC coupled to the third pixel line and to the fourth pixel line, and the circuitry is configured to provide a first reference signal to the first SARADC and a second reference signal to the second SARADC, the second reference signal being different from the first reference signal.

REFERENCE SIGNS LIST

100 Electronic device
110 Optical system

120 Image processing section
130 Memory
140 Imaging control section
150 Monitor
200 Solid-state imaging element
201 Sensor chip
202 Circuit chip
210 Vertical drive circuit
220 Pixel area
221, Pixel block
230, 291 to 296 Pixels
231, 273, 274, 277, 278, 281, 282, 285, 286 Photodiodes
232, 271, 272, 275, 276, 279, 280, 283, 284, Transfer transistors
233, 287, Reset transistors
234, 288 Floating diffusion layers
235, 289 Amplifier transistors
236, 290 Selection transistors
240 Column signal processing section
241 to 244 Constant current sources
245 Upper column signal processing section
246 Lower column signal processing section
247 Multiplexer
250 Timing control circuit
260 Output circuit
270 Shared block
300 SARADC
310 Comparator
311, 312 Current mirror transistors
313 Enabling switch
314, 317, 404, 406, 443, 444 Selection switches
315, 318 Pixel-side transistors
316, 319, 403, 405, 441, 442 Short-circuit switches
320 Reference-side transistor
321 Current source transistor
350 SAR (Successive Approximation Register) logic circuit
351 Lower bit generation section
352 Upper bit generation section
353 Pseudo-random number generation section
360 DAC (Digital to Analog Converter)
361-1 to 361-7, 362-1 to 362-13, 432 Capacitors
363-1 to 363-20 Potential control switches
371 to 374 Reset switches
381 to 384 Capacitors
401, 421 Current sources
402 Enabling control transistor
407, 408, 422, 423, 424 Fixed resistors
409 Drain reset switch
420 Replica circuit
425 Transistor in replica circuit
426, 427 Variable resistors
430 Sample-and-hold circuit
431 Sampling switch
12031 Imaging section

The invention claimed is:

1. A device comprising:
a plurality of pixels arranged in rows and columns;
a plurality of column lines, each of the plurality of column lines being coupled to a respective column of pixels of the plurality of pixels; and
circuitry comprising a plurality of analog-to-digital converters, at least one of the plurality of analog-to-digital converters being coupled to at least two column lines of the plurality of column lines,
wherein the at least one of the plurality of analog-to-digital converters comprises a comparator configured to compare a reference signal with a pixel signal provided to the comparator through one of the at least two column lines, and
wherein the comparator comprises:
a first transistor configured to receive, at a gate terminal thereof, a first pixel signal provided through a first column line of the at least two column lines;
a second transistor configured to receive, at a gate terminal thereof, a second pixel signal provided through a second column line of the at least two column lines; and
a third transistor configured to receive, at a gate terminal thereof, the reference signal,
wherein the at least one of the plurality of analog-to-digital converters comprises successive approximation register logic circuitry coupled to the comparator.

2. The device of claim 1, wherein each of the plurality of analog-to-digital converters is coupled to at least two respective column lines of the plurality of column lines.

3. The device of claim 1, wherein the circuitry is configured to drive at least two rows of pixels of the plurality of pixels simultaneously.

4. The device of claim 1, wherein the circuitry is configured to vary the reference signal over time.

5. The device of claim 4, wherein the circuitry is configured to vary, during a predefined time slot, the reference signal until a least significant bit (LSB) is generated based on the pixel signal.

6. The device of claim 1, wherein the comparator further comprises:
a first switch coupled to a source and a drain of the first transistor;
a second switch coupled to a source and a drain of the second transistor;
a third switch coupled to the first switch; and
a fourth switch coupled to the second switch.

7. The device of claim 6, wherein the first switch is configured to receive a first control signal and the third switch is configured to receive an inversion signal of the first control signal; and wherein the second switch is configured to receive a second control signal and the fourth switch is configured to receive an inversion signal of the second control signal.

8. The device of claim 1, wherein the plurality of analog-to-digital converters comprises a first analog-to-digital converter and a second analog-to-digital converter, and wherein the circuitry is configured to provide a first reference signal to the first analog-to-digital converter and a second reference signal to the second analog-to-digital converter, the second reference signal being different from the first reference signal.

9. The device of claim 1, wherein the device is mounted on a vehicle.

10. A device comprising:
a pixel area comprising a plurality of pixel lines comprising:
a first pixel line coupled to a first plurality of pixels and a second pixel line coupled to a second plurality of pixels; and
circuitry comprising an analog-to-digital converter coupled to the first pixel line and to the second pixel line,
wherein the analog-to-digital converter comprises a comparator configured to compare a reference signal with a pixel signal provided to the comparator through one of the first pixel line and the second pixel line, and wherein the comparator comprises:

a first transistor configured to receive, at a gate terminal thereof, a first pixel signal provided through the first pixel line;

a second transistor configured to receive, at a gate terminal thereof, a second pixel signal provided through the second pixel line; and a third transistor configured to receive, at a gate terminal thereof, the reference signal wherein the analog-to-digital converter comprises successive approximation register logic circuitry coupled to the comparator.

11. The device of claim 10, wherein the circuitry is configured to drive at least two rows of pixels of the pixel area simultaneously.

12. The device of claim 10, wherein the circuitry is configured to vary the reference signal over time.

13. The device of claim 12, wherein the circuitry is configured to vary, during a predefined time slot, the reference signal until a least significant bit (LSB) is generated based on the pixel signal.

14. The device of claim 10, wherein the comparator further comprises:

a first switch coupled to a source and a drain of the first transistor;

a second switch coupled to a source and a drain of the second transistor;

a third switch coupled to the first switch; and a fourth switch coupled to the second switch.

15. The device of claim 14, wherein the first switch is configured to receive a first control signal and the third switch is configured to receive an inversion signal of the first control signal; and wherein the second switch is configured to receive a second control signal and the fourth switch is configured to receive an inversion signal of the second control signal.

16. The device of claim 10, wherein the analog-to-digital converter comprises a first analog-to-digital converter and a second analog-to-digital converter, and wherein the circuitry is configured to provide a first reference signal to the first analog-to-digital converter and a second reference signal to the second analog-to-digital converter, the second reference signal being different from the first reference signal.

17. The device of claim 10, wherein the device is mounted on a vehicle.

* * * * *